US012720994B2

(12) United States Patent
Kim et al.

(10) Patent No.: US 12,720,994 B2
(45) Date of Patent: Aug. 25, 2026

(54) DISPLAY PANEL AND ELECTRONIC APPARATUS INCLUDING THE SAME

(71) Applicant: SAMSUNG ELECTRONICS CO., LTD., Suwon-si (KR)

(72) Inventors: Tae-Gon Kim, Suwon-si (KR); Joonghyuk Kim, Suwon-si (KR); Seung-Yeon Kwak, Suwon-si (KR); Ji Whan Kim, Suwon-si (KR); Sunghun Lee, Suwon-si (KR); Shin Ae Jun, Suwon-si (KR); Deuk Seok Chung, Suwon-si (KR); Hyeonho Choi, Suwon-si (KR)

(73) Assignees: SAMSUNG ELECTRONICS CO., LTD., Gyeonggi-Do (KR); SAMSUNG DISPLAY CO., LTD., Gyeonggi-Do (KR)

( * ) Notice: Subject to any disclaimer, the term of this patent is extended or adjusted under 35 U.S.C. 154(b) by 409 days.

(21) Appl. No.: 18/457,684

(22) Filed: Aug. 29, 2023

(65) Prior Publication Data

US 2024/0099094 A1 Mar. 21, 2024

(30) Foreign Application Priority Data

Aug. 29, 2022 (KR) ........................ 10-2022-0108734

(51) Int. Cl.
*H10K 59/38* (2023.01)
*H10K 59/32* (2023.01)
*H10K 102/00* (2023.01)

(52) U.S. Cl.
CPC ............. *H10K 59/38* (2023.02); *H10K 59/32* (2023.02); *H10K 2102/331* (2023.02)

(58) Field of Classification Search
CPC .. H10K 59/38; H10K 59/32; H10K 2102/331; H10K 85/346; H10K 85/658;
(Continued)

(56) References Cited

U.S. PATENT DOCUMENTS 9,917,270 B1 3/2018 Volz et al.
10,692,417 B2 6/2020 Lee et al.
(Continued)

FOREIGN PATENT DOCUMENTS

EP 3916071 A1 12/2021
JP 2021536094 A 12/2021
(Continued)

OTHER PUBLICATIONS

English Abstract of KR 2047116.
European Search Report for European Patent Application No. 23192833.6 dated Jan. 29, 2024.

*Primary Examiner* — Jacob Y Choi
*Assistant Examiner* — Ashley Nicole Blackwell
(74) *Attorney, Agent, or Firm* — CANTOR COLBURN LLP

(57) ABSTRACT

A display panel includes a color conversion panel and a light emitting panel, the light emitting panel includes a light emitting device that includes a first electrode, a second electrode, and a blue light emitting unit that includes an organic light emitting layer and is disposed between the first electrode and the second electrode and is configured to emit blue light. The color conversion panel includes a color conversion layer including at least two color conversion regions, and optionally, a partition wall defining that at least two regions, wherein the color conversion region includes a first region corresponding to a green pixel, a second region corresponding to a red pixel, and optionally a third region corresponding to a blue pixel. The first region includes a first composite including a matrix and a plurality of first semiconductor nanoparticles dispersed in the matrix, the first semiconductor nanoparticles includes a Group I-III-VI compound including silver, indium, gallium, and sulfur, and is configured to emit green light.

20 Claims, 9 Drawing Sheets

(58) Field of Classification Search
CPC .. H10K 2101/20; H10K 50/121; H10K 50/19; H10K 59/35; H10K 59/805; H10K 59/90; C09K 11/02; C09K 11/06; C09K 11/565; C09K 11/621; C09K 11/70; C09K 11/883
See application file for complete search history.

(56) References Cited

U.S. PATENT DOCUMENTS

| | | | | |
|---|---|---|---|---|
| 11,101,413 | B2 | 8/2021 | Torimoto et al. | |
| 2017/0052444 | A1 | 2/2017 | Park et al. | |
| 2018/0374409 | A1* | 12/2018 | Lee | G09G 3/3225 |
| 2021/0371745 | A1* | 12/2021 | Park | C09K 11/0883 |
| 2021/0408418 | A1 | 12/2021 | Park et al. | |
| 2022/0093878 | A1* | 3/2022 | Kim | H10K 85/636 |
| 2023/0151271 | A1* | 5/2023 | Torimoto | C09K 11/56 252/301.4 S |
| 2023/0151281 | A1 | 5/2023 | Fletcher | |

FOREIGN PATENT DOCUMENTS

| | | | |
|---|---|---|---|
| KR | 101900815 | B1 | 9/2018 |
| KR | 2047116 | B1 | 11/2019 |
| KR | 20220032128 | A | 3/2022 |
| KR | 20220060183 | A | 5/2022 |
| WO | 2021182417 | A1 | 9/2021 |

* cited by examiner

DISPLAY PANEL AND ELECTRONIC APPARATUS INCLUDING THE SAME

CROSS-REFERENCE TO RELATED APPLICATION

This application claims priority to Korean Patent Application No. 10-2022-0108734, filed in the Korean Intellectual Property Office on Aug. 29, 2022, and all the benefits accruing therefrom under 35 U.S.C. § 119, the content of which in its entirety is herein incorporated by reference.

BACKGROUND

1. Field

A display panel and an electronic apparatus including the same disclosed.

2. Description of the Related Art

A semiconductor nanoparticle may possess or exhibit different aspects, characteristics, or properties than a corresponding bulk material having substantially the same composition. For example, in terms of physical properties (e.g., a bandgap energy, a luminescent property, and the like), which are known to be intrinsic to a bulk material, one or more of the stated properties for a corresponding semiconductor nanoparticle of the same composition may be different. A semiconductor nanoparticle may be configured to emit light on excitation by an energy such as an incident light or an applied voltage. The semiconductor nanoparticle may find applicability in a variety of devices (e.g., a display panel or an electronic device). Moreover, for environmental concerns, it is desirable to develop a semiconductor nanoparticle that does not contain harmful heavy metal such as cadmium and showing an improved luminescent property.

SUMMARY

An embodiment provides a display panel that is environmentally friendly and capable of achieving or exhibiting improved display quality.

An embodiment provides an electronic apparatus such as a display apparatus including the display panel.

In an embodiment, a display panel may include a color conversion panel and a light emitting panel with a surface opposite a surface of the color conversion panel (e.g., a surface of the color conversion panel will face a surface of the light emitting panel),

- wherein the light emitting panel includes a light emitting device and the light emitting device includes a first electrode, a second electrode, and a blue light emitting unit that is disposed between the first electrode and the second electrode and is configured to emit blue light,
- wherein the blue light emitting unit includes an organic light emitting layer and the blue light has a peak emission wavelength of greater than or equal to about 450 nm and less than or equal to about 465 nm and a full width at quarter maximum (FWQM) of greater than or equal to about 20 nanometers (nm) and less than or equal to about 60 nm,
- wherein the color conversion panel includes a color conversion layer including at least two color conversion regions, and optionally, a partition wall that defines the at least two color conversion regions of the color conversion layer,
- wherein the color conversion region includes a first region corresponding to a green pixel, a second region corresponding to a red pixel, and optionally a third region corresponding to a blue pixel,
- wherein the first region includes a first composite including a matrix and a first semiconductor nanoparticle (e.g., a plurality of first semiconductor nanoparticles) dispersed in the matrix, and optionally titanium oxide particles, the first semiconductor nanoparticle includes a Group 1-III-VI compound including silver, indium, gallium, and sulfur, and is configured to emit green light, wherein the green light has a peak emission wavelength of greater than or equal to about 500 nm and less than or equal to about 550 nm, and a full width at half maximum (FWHM) of less than or equal to about 40 nm, or less than or equal to about 36 nm,
- wherein the second region includes a second composite including a matrix and a second semiconductor nanoparticle (e.g., a plurality of second semiconductor nanoparticles) dispersed in the matrix, and optionally titanium oxide particles, the second semiconductor nanoparticle includes a Group III-V compound including indium and phosphorus, and is configured to emit red light, wherein the red light has a peak emission wavelength of greater than or equal to about 600 nm and less than or equal to about 650 nm.

The FWHM of the green light may be greater than or equal to about 40 nm.

The third region includes a matrix and titanium oxide particles dispersed in the matrix.

In the light emitting device, a maximum external quantum efficiency of the blue light emitting unit may be greater than or equal to about 15% and less than or equal to about 45% or 40% or less.

The blue light may have a FWHM of greater than or equal to about 5 nm and less than or equal to about 38 nm. The FWHM may be less than or equal to about 30 nm.

The organic light emitting layer may include a host, a sensitizer, and an emitter.

The host may include an electron transport host, a hole transport host, or a combination thereof.

The sensitizer may include an organometallic compound including iridium (Ir), platinum (Pt), palladium (Pd), osmium (Os), titanium (Ti), gold (Au), silver (Ag), copper (Cu), ruthenium (Ru), rhenium (Re), rhodium (Rh), terbium (Tb), thulium (Tm), or any combination thereof. The sensitizer or the organometallic compound may be configured to emit phosphorescence.

The emitter may include a condensed cyclic compound capable of fluorescence emission.

The host may include (a compound including) a substituted or unsubstituted phenyl moiety, a substituted or unsubstituted biphenyl moiety, a substituted or unsubstituted terphenyl moiety, a substituted or unsubstituted tetraphenyl moiety, a substituted or unsubstituted carbazole moiety, a substituted or unsubstituted triazine moiety, or a combination of groups thereof.

The sensitizer may be selected from the compounds represented by the following formulae:

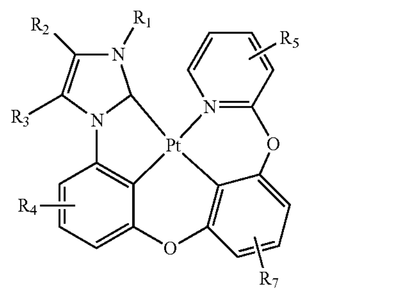
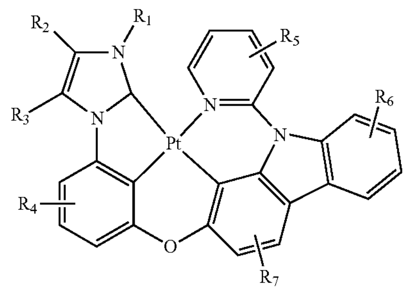
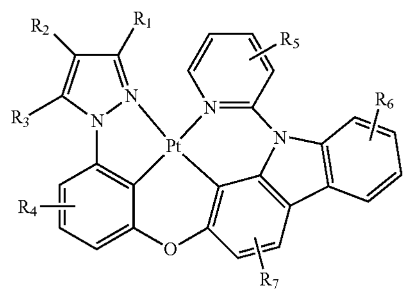
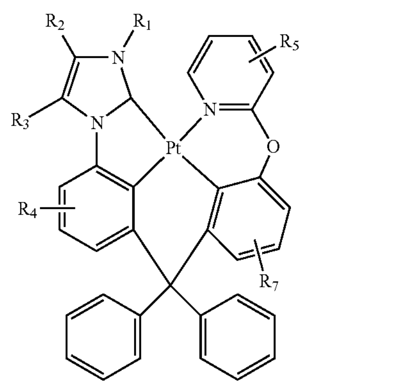
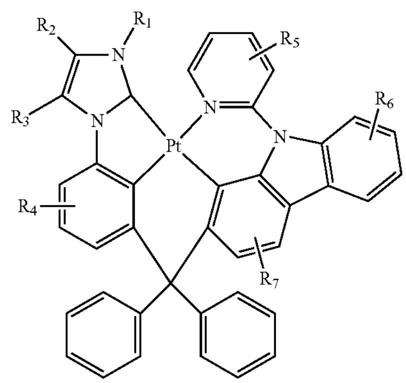
-continued
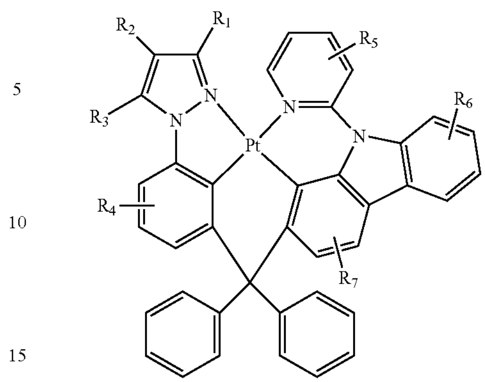
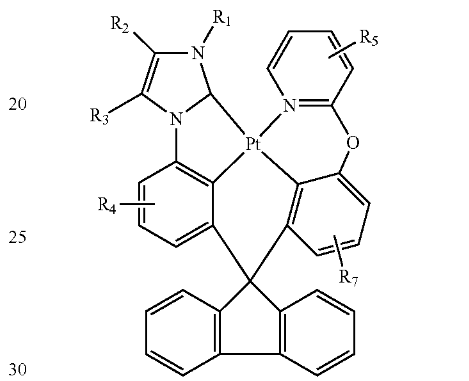
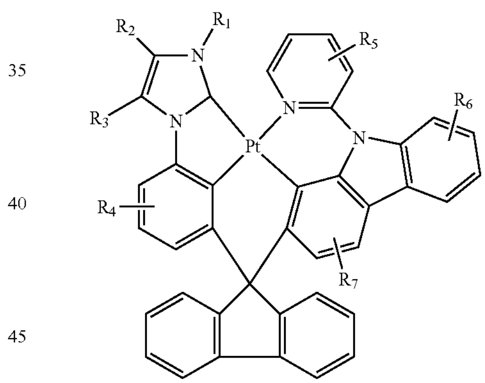
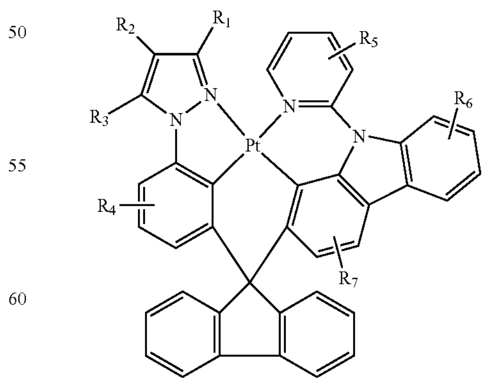

-continued

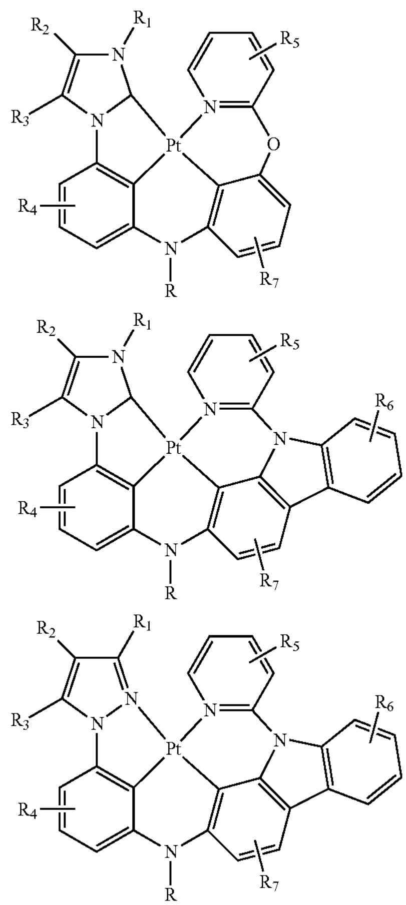

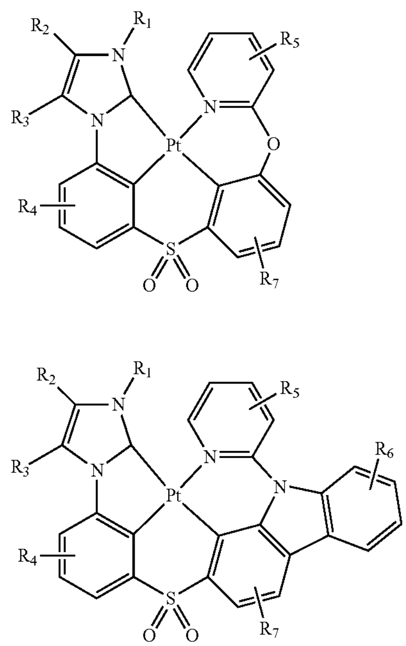

-continued

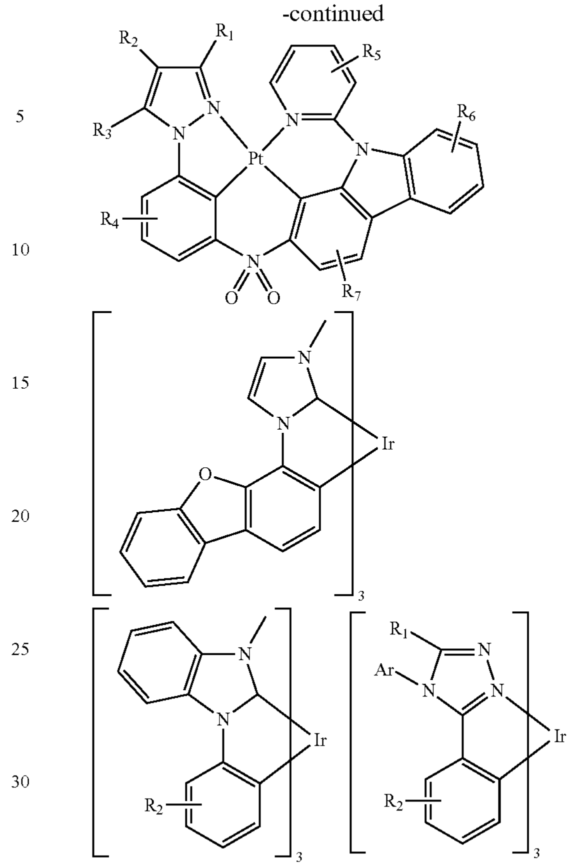

In the above formulae, R and $R_1$ to $R_7$ may be the same or different and each independently hydrogen, deuterium, —F, —Cl, —Br, —I, a hydroxyl group, a cyano group, —$CF_3$, a trimethylsilyl group, a nitro group, an amidino group, a hydrazino group, a hydrazono group, a substituted or unsubstituted $C_1$-$C_{60}$alkyl group (e.g., a halogen substituted alkyl group), a substituted or unsubstituted $C_2$-$C_{60}$ alkenyl group, a substituted or unsubstituted $C_2$-$C_{60}$alkynyl group, a substituted or unsubstituted $C_1$-$C_{60}$alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

Any two adjacent groups of $R_1$ to $R_7$ may optionally be linked to form a substituted or unsubstituted $C_6$-$C_{60}$ carbocyclic (e.g., alicyclic or aromatic) ring or a substituted or unsubstituted $C_1$-$C_{60}$ heterocyclic (e.g., heteroalicyclic or heteroaromatic) ring.

In the above formulae, Ar may be a substituted or unsubstituted $C_5$-$C_{60}$ carbocyclic (e.g., alicyclic or aromatic) group such as a substituted or unsubstituted terphenyl moiety) or a substituted or unsubstituted $C_1$-$C_{60}$ heterocyclic (e.g., heteroalicyclic or heteroaromatic) group.

The emitter may include a compound represented by Chemical Formula 1, a compound represented by Chemical Formula 2, a compound represented by Chemical Formula 3, or a combination thereof:

Chemical Formula 1

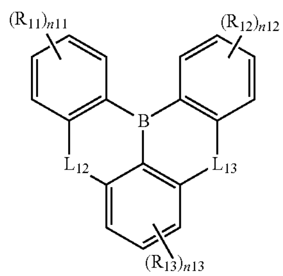

Chemical Formula 2

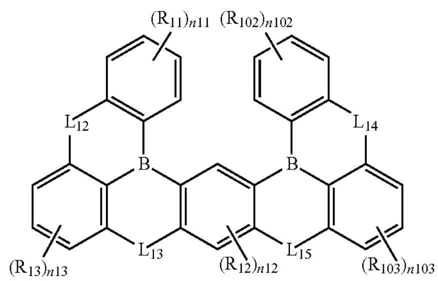

Chemical Formula 3

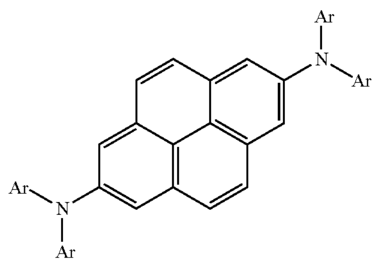

In Chemical Formulae 1, 2, and 3: L12, L13, L14, and L15 are each independently —NR— or —O—;

Ar may be a substituted or unsubstituted aromatic group (e.g., a substituted or unsubstituted aryl group)

$R_{11}$, $R_{12}$, $R_{13}$, $R_{102}$, and $R_{103}$ are the same or different and may be independently hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, $—C(Q_1)(Q_2)(Q_3)$, $—Si(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, or $—P(=S)(Q_1)(Q_2)$, wherein in Chemical Formula 1 at least one of $R_{11}$, $R_{12}$, and $R_{13}$ is not hydrogen, and in Chemical Formula 2, at least one of $R_{11}$, $R_{12}$, $R_{13}$, $R_{102}$, and $R_{103}$ is not hydrogen, n11, n12, n13, n102, and n103 are each independently zero or an integer from 1 to 10, and $Q_1$, $Q_2$, and $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$cycloalkyl group, a $C_1$-$C_{10}$heterocycloalkyl group, a $C_3$-$C_{10}$cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$alkyl group that is substituted with at least one deuterium, —F, a cyano group, a $C_1$-$C_{60}$alkyl group, a $C_6$-$C_{60}$aryl group, or any combination thereof, or a $C_6$-$C_{60}$aryl group that is substituted with at least one deuterium, —F, a cyano group, a $C_1$-$C_{60}$alkyl group, a $C_6$-$C_{60}$aryl group, or any combination thereof.

In the blue light emitting unit, a value obtained by dividing a current efficiency (Cd/A) with CIEy (hereinafter, the current efficiency for CIEy) may be greater than or equal to about 100, greater than or equal to about 120, greater than or equal to about 130, greater than or equal to about 140, greater than or equal to about 150, greater than or equal to about 160, greater than or equal to about 170, greater than or equal to about 180, greater than or equal to about 185, or greater than or equal to about 350. The current efficiency (Cd/A) for CIEy may be less than or equal to about 500, less than or equal to about 400, less than or equal to about 300, less than or equal to about 250, less than or equal to about 200, or less than or equal to about 190.

A decay time of the blue light emitting unit, as measured by the time-resolved photoluminescence analysis, may be from about 5 nanoseconds (ns) to about 10 microseconds (μs), for example, from 50 ns to 5 μs, from 0.1 μs to 5 μs, from 0.5 μs to 5 μs, from 0.8 μs to 5 μs, or any combination or time endpoints listed.

The lifetime (T50) of the blue light emitting unit may be greater than or equal to 50 hours and less than or equal to 2000 hours.

The blue light emitting unit may provide a luminescent spectrum of blue light with an emission ratio of an intensity at 500 nm to a maximum intensity that may be greater than or equal to about 0.001:1, e.g., greater than or equal to about 0.05:1, and less than or equal to about 0.4:1, e.g., less than or equal to about 0.35:1.

The blue light emitting unit may have a maximum external quantum efficiency of greater than or equal to about 25%, e.g., greater than or equal to about 30%, and less than or equal to about 100%, e.g., less than or equal to about 90%.

The blue light emitted from the blue light emitting unit may have a FWHM of greater than or equal to about 10 nm, for example, greater than or equal to about 12 nm, and less than or equal to about 25 nm, e.g., less than or equal to about 23 nm.

The light emitting panel may further include a green light emitting unit. The green light emitting unit and the blue light emitting unit may be stacked upon the other. The green light emitting unit may include a green light emitting organic layer. The green light emitting organic layer may include a green light emitting (organic) material and optionally a host material(s) as described above. The green light emitting material may include a phosphorescent dopant. The phosphorescent dopant may include an organometallic compound including iridium (Ir), an organometallic compound including platinum (Pt), or an organometallic compound including osmium (Os).

In the display panel of an embodiment, the first semiconductor nanoparticle may have a charge balance value defined by Equation 1 of greater than or equal to about 0.9 and less than or equal to about 1.45:

$$\text{charge balance value}=\{[Ag]+3([In]+[Ga])\}/2[S] \quad \text{Equation 1}$$

in Equation 1, [Ag], [In], [Ga], and [S] are molar amounts of silver, indium, gallium, and sulfur, respectively, in the first semiconductor nanoparticle.

The charge balance value may be greater than or equal to about 1, greater than or equal to about 1.02, greater than or equal to about 1.05, greater than or equal to about 1, greater than or equal to about 1.17, greater than or equal to about 1.18, or greater than or equal to about 1.19.

The charge balance value may be less than or equal to about 1.45, less than or equal to about 1.4, less than or equal to about 1.35, or less than or equal to about 1.3.

The first semiconductor nanoparticle may exhibit a quantum yield (e.g., an absolute quantum yield, hereinafter, "quantum yield") of greater than or equal to about 60% or greater than or equal to about 70%.

The quantum yield of the first semiconductor nanoparticle may be greater than or equal to about 62%, greater than or equal to about 65%, or greater than or equal to about 70%. The quantum yield may be from about 80% to about 100%.

The first semiconductor nanoparticle may include or may not include copper.

The first semiconductor nanoparticle may exhibit at least about 97% of its emission as band-edge emission. The green light may be a band-edge emission.

In a photoluminescence spectrum of the first semiconductor nanoparticle, a relative band-edge emission intensity defined by Equation 2 may be greater than about 20, or greater than or equal to about 50, or greater than or equal to about 100:

$$\text{relative band-edge emission intensity}=A1/A2 \quad \text{Equation 2}$$

wherein

A1 is an intensity at a maximum emission wavelength, and

A2 is a maximum intensity in a tail wavelength range of the maximum emission wavelength+greater than or equal to about 80 nm or greater than or equal to about 100 nm.

In the first semiconductor nanoparticle, a mole ratio of sulfur to a sum of silver, indium, and gallium, [S:(Ag+In+Ga)], may be greater than or equal to about 0.65:1, greater than or equal to about 0.68:1, or greater than or equal to about 1:1. In the first semiconductor nanoparticle, the mole ratio of sulfur to a sum of silver, indium, and gallium, [S:(Ag+In+Ga)], may be less than or equal to about 2.5:1, less than or equal to about 1.5:1, less than or equal to about 1.35:1, or less than or equal to about 1.15:1.

In the first semiconductor nanoparticle, a mole ratio of a sum of indium and gallium to silver, [(In+Ga):Ag], may be greater than or equal to about 1.7:1, or greater than or equal to about 1.8:1 and less than or equal to about 3.5:1.

In the first semiconductor nanoparticle, a mole ratio of gallium to a sum of indium and gallium, [Ga:(In+Ga)], may be greater than or equal to about 0.8:1. The mole ratio of gallium to a sum of indium and gallium, [Ga:(In+Ga)], may be less than or equal to about 0.96:1.

In the first semiconductor nanoparticle, a mole ratio of gallium to sulfur (Ga:S) may be greater than or equal to about 0.46:1, greater than or equal to about 0.47:1, greater than or equal to about 0.5:1, or greater than or equal to about 0.55:1. The mole ratio of gallium to sulfur (Ga:S) may less than about 1:1, less than or equal to about 0.98:1, less than or equal to about 0.92:1, or less than or equal to about 0.9:1.

In the first semiconductor nanoparticle, a mole ratio of a sum of indium and gallium to sulfur, [(In+Ga):S], may be greater than or equal to about 0.66:1, greater than or equal to about 0.68:1, or greater than or equal to about 0.73:1. The mole ratio of the sum of indium and gallium to sulfur, [(In+Ga):S], may be less than about 1.16:1, less than or equal to about 1:1, or less than or equal to about 0.73:1.

In the first semiconductor nanoparticle, a mole ratio of silver to sulfur (Ag:S) may be greater than or equal to about 0.3:1, or greater than or equal to about 0.32:1. The mole ratio of silver to sulfur (Ag:S) may be less than or equal to about 0.4:1, or less than or equal to about 0.39:1.

In the first semiconductor nanoparticle, a mole ratio of silver to a sum of silver, indium, and gallium, [Ag:(Ag+In+Ga)], may be greater than or equal to about 0.31:1, greater than or equal to about 0.32:1, or greater than or equal to about 0.33:1. In the first semiconductor nanoparticle, the mole ratio of silver to a sum of silver, indium, and gallium, [Ag:(Ag+In+Ga)], may be less than or equal to about 0.4:1, or less than or equal to about 0.35:1.

The first semiconductor nanoparticle may include a first semiconductor nanocrystal (for example, a core) including silver, indium, gallium, and sulfur, and optionally, a semiconductor nanocrystal shell disposed on the first semiconductor nanocrystal, the semiconductor nanocrystal shell including zinc and sulfur. The first semiconductor nanoparticle may further include a second semiconductor nanocrystal including gallium, sulfur, and optionally silver, disposed between the first semiconductor nanocrystal (e.g., the core), and the semiconductor nanocrystal shell. The first semiconductor nanoparticle may further include a second semiconductor nanocrystal including gallium, sulfur, and optionally silver, on the first semiconductor nanocrystal In an embodiment, the first semiconductor nanoparticle may not include lithium. In an embodiment, the first semiconductor nanoparticle may not include sodium. In an embodiment, the first semiconductor nanoparticle may not include an alkali metal.

An indium amount (or a concentration) in a portion adjacent to a surface (e.g., an outer layer) of the first semiconductor nanoparticle may be less than an indium amount (or a concentration) in a central portion (inner portion or a first semiconductor nanocrystal). A thickness of the semiconductor nanocrystal shell or the second semiconductor nanocrystal may be greater than or equal to about 0.1 nm, greater than or equal to about 0.3 nm, greater than or equal to about 0.5 nm, or greater than or equal to about 0.7 nm. The thickness of the semiconductor nanocrystal shell or the second semiconductor nanocrystal may be less than or equal to about 5 nm, less than or equal to about 1.5 nm, less than or equal to about 1 nm, or less than or equal to about 0.8 nm.

The FWHM of the green light emitted by the first semiconductor nanoparticle may be less than or equal to about 40 nm, or less than or equal to about 35 nm. The full width at half maximum may be greater than or equal to about 5 nm, greater than or equal to about 10 nm, greater than or equal to about 15 nm, or greater than or equal to about 25 nm.

In the display panel according to an embodiment, the second semiconductor nanoparticle may have a size (e.g., an average size) of greater than or equal to about 6 nm and less than or equal to about 8.5 nm. In a UV-Vis absorption spectrum, the second semiconductor nanoparticle may exhibit a ratio of an absorbance at 520 nm to an absorbance at 350 nm that is greater than or equal to about 0.045:1 and less than or equal to about 0.1:1 or less than or equal to about 0.065:1.

The second semiconductor nanoparticle may include a semiconductor nanocrystal core including a Group III-V compound and a semiconductor nanocrystal shell including a zinc chalcogenide.

The Group III-V compound may include indium and phosphorus, and optionally zinc. The zinc chalcogenide may include zinc, selenium, and sulfur. The second semiconductor nanoparticles may not include cadmium.

In the second semiconductor nanoparticle, a mole ratio of sulfur to indium (S:In) may be greater than or equal to about 3:1 and less than or equal to about 6:1. In the second semiconductor nanoparticles, the mole ratio of sulfur to selenium may be greater than or equal to about 0.69:1 and less than or equal to about 0.89:1. In the second semiconductor nanoparticles, the mole ratio of zinc to indium may be greater than or equal to about 10:1 and less than or equal to about 12.4:1.

In the display panel according to an embodiment, a thickness of the color conversion layer may be greater than or equal to about 2 μm, greater than or equal to about 3 μm, greater than or equal to about 4 μm, or greater than or equal to about 5 μm. In the display panel of an embodiment, the thickness of the color conversion layer may be less than or equal to about 20 μm, less than or equal to about 15 μm, less than or equal to about 10 μm, less than or equal to about 7 μm, or less than or equal to about or 6 μm.

In an embodiment, the first region, the second region, and optionally a third region, of the color conversion panel may include a first composite, a second composite, and a third composite, respectively, and based on a total weight of the first, second, and third composite, an inorganic amount of the first and second semiconductor nanoparticles may be greater than or equal to about 3 wt % (e.g., greater than or equal to about 5 wt %, greater than or equal to about 7 wt %, or greater than or equal to about 9 wt %) and less than or equal to about 40 wt % (e.g., less than or equal to about 35 wt %, less than or equal to about 30 wt %, less than or equal to about 25 wt %, or less than or equal to about 20 wt %).

In an embodiment, the first region, the second region, and optionally a third region, of the color conversion panel may include a first composite, a second composite, and a third composite, respectively, and based on a total weight of the first, second, and third composites, an amount of the titanium oxide particles may be greater than or equal to about 0.5 wt %, greater than or equal to about 1.0 wt %, greater than or equal to about 1.5 wt %, and less than or equal to about 7 wt %, less than or equal to about 6%, or less than or equal to about 5%.

In the display panel of an embodiment, the color conversion layer may have an amount ratio of silver (atomic %) to titanium (atomic %) of greater than or equal to about 0.1:1 or greater than or equal to about 0.2:1, and less than or equal to about 3:1 or less than or equal to about 1.5:1. In the display panel of an embodiment, the color conversion layer may have an amount ratio of gallium (atomic %) with respect to titanium (atomic %) that is greater than or equal to about 0.1:1 or greater than or equal to about 0.2:1, and less than or equal to about 3:1 or less than or equal to about 1.5:1.

In the color conversion layer of the display panel of an embodiment, with respect to the blue light having a wavelength of greater than or equal to about 455 nm and less than or equal to about 460 nm, a ratio of a blue light absorption of the first region to a blue light absorption of the second region may be in a range of from about 0.88:1 to about 1.2:1, from about 0.9:1 to about 1.1:1, from about 1:1 to about 1.1:1, or a combination thereof.

The display panel may have a luminance of white light that is greater than or equal to about 300 candela per square meter (cd/m$^2$). The display panel may have a color reproduction rate that is greater than or equal to about 80%, greater than or equal to about 85%, or greater than or equal to about 88% under the BT2020 standard.

In an embodiment, a display apparatus may include the display panel. The display apparatus may be a television set, a monitor, a mobile equipment, a virtual reality or augmented reality device, or an electronic component of a vehicle, e.g., an automotive application display, or the like.

In the display panel according to an embodiment, excitation light provided by the organic electroluminescent device can be efficiently utilized by the light-emitting material, and the device as a whole may provide full white luminance and increased color reproduction rate, and the display quality may be improved, as well.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
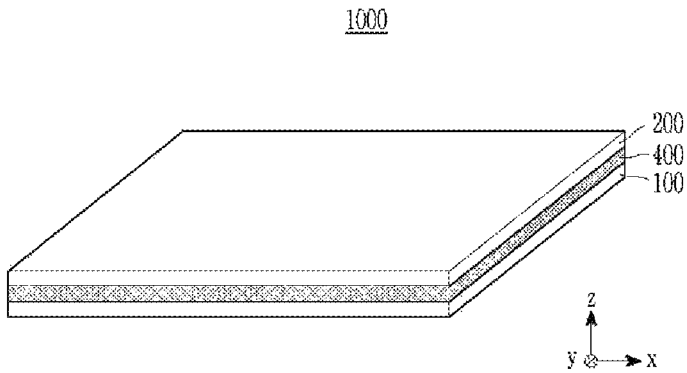
FIG. 1 is a perspective view showing an example of a display panel of an embodiment.

Advantages and characteristics of this disclosure, and a method for achieving the same, will become evident referring to the following example embodiments together with the drawings. This invention may, however, be embodied in many different forms, and should not be construed as being limited to the embodiments set forth herein. Rather, these embodiments are provided so that this disclosure will be thorough and complete and will fully convey the scope of the invention to those skilled in the art. In the drawings, the thickness of layers, films, panels, regions, etc., are exaggerated for clarity. Like reference numerals refer to like elements throughout.

If not defined otherwise, all terms (including technical and scientific terms) in the specification may be defined as commonly understood by one skilled in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The terminology used herein is for the purpose of describing particular embodiments only and is not intended to be limiting. As used herein, the singular forms "a," "an," and "the" are intended to include the plural forms, including "at least one," unless the context clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first "element," "component," "region," "layer," or "section" discussed below could be termed a second element, component, region, layer, or section without departing from the teachings herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other harmful heavy metal) may be present or, if present, an amount of cadmium (or other harmful heavy metal) may be less than or equal to a detection limit or as an impurity level of a given analysis tool (e.g., an inductively coupled plasma atomic emission spectroscopy).

As used herein, unless a definition is otherwise provided, the term "substituted" refers to a compound or a group or a moiety wherein a, e.g., at least one, hydrogen atom thereof is substituted with a substituent. The substituent may include a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—$NO_2$), a cyano group (—CN), an amino group or amine group (—NRR', wherein R and R' are the same or different, and are independently hydrogen or a C1 to C6 alkyl group), an azido group (—$N_3$), an amidino group (—C(═NH)$NH_2$), a hydrazino group (—$NHNH_2$), a hydrazono group (=N ($NH_2$)), an aldehyde group (—C(═O)H), a carbamoyl group (—C(O)$NH_2$), a thiol group (—SH), an ester group (—C(═O)OR, wherein R is a C1 to C6 alkyl group or a C6 to C12 aryl group), a carboxylic acid group (—OOOH) or a salt thereof (—C(═O)OM, wherein M is an organic or inorganic cation), a sulfonic acid group (—$SO_3H$) or a salt thereof (—$SO_3M$, wherein M is an organic or inorganic cation), a phosphoric acid group (—$PO_3H_2$) or a salt thereof (—$PO_3MH$ or —$PO_3M_2$, wherein M is an organic or inorganic cation), or a combination thereof.

In an embodiment, a "$C_1$-$C_{60}$ alkyl group" may be a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. In an embodiment, a "$C_1$-$C_{60}$ alkylene group" may be a divalent group having the same structure as the $C_1$-$C_{60}$ alkyl group.

In an embodiment, a "$C_1$-$C_{60}$ alkoxy group" may be a monovalent group represented by —$OA_{101}$ (wherein $A_{101}$ is the $C_1$-$C_{60}$ alkyl group), and examples thereof include a methoxy group, an ethoxy group, and an isopropyloxy group.

In an embodiment, a "$C_2$-$C_{60}$ alkenyl group" may have a structure including at least one carbon-carbon double bond in the middle or at the terminus of the $C_2$-$C_{60}$alkyl group, and examples thereof include an ethenyl group, a propenyl group, and a butenyl group. In an embodiment, a "$C_2$-$C_{60}$ alkenylene group" may be a divalent group having the same structure as the $C_2$-$C_{60}$ alkenyl group.

In an embodiment, a "$C_2$-$C_{60}$ alkynyl group" may have a structure including at least one carbon-carbon triple bond in the middle or at the terminus of the $C_2$-$C_{60}$ alkyl group, and examples thereof include an ethynyl group and a propynyl group. In an embodiment, a "$C_2$-$C_{60}$ alkynylene group" may refers to a divalent group having the same structure as the $C_2$-$C_{60}$ alkynyl group.

In an embodiment, a "$C_3$-$C_{10}$ cycloalkyl group" may refer to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. In an embodiment, a "$C_3$-$C_{10}$cycloalkylene group" may be a divalent group having the same structure as the $C_3$-$C_{10}$ cycloalkyl group.

In an embodiment, a "$C_1$-$C_{10}$ heterocycloalkyl group" may refer to a monovalent monocyclic group having at least one heteroatom of N, O, P, Si, S, or any combination thereof, as a ring-forming atom and 1 to 10 carbon atoms, and examples thereof include a tetrahydrofuranyl group and a tetrahydrothiophenyl group. In an embodiment, a "$C_1$-$C_{10}$heterocycloalkylene group" may be a divalent group having the same structure as the $C_1$-$C_{10}$heterocycloalkyl group.

In an embodiment, a "$C_3$-$C_{10}$ cycloalkenyl group" may be a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. In an embodiment, a "$C_3$-$C_{10}$cycloalkenylene group" may be a divalent group having the same structure as the $C_3$-$C_{10}$ cycloalkenyl group.

In an embodiment, a "$C_1$-$C_{10}$ heterocycloalkenyl group" may be a monovalent monocyclic group that has at least one heteroatom N, O, P, Si, S, or any combination thereof, as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. In an embodiment, a "$C_1$-$C_{10}$ heterocycloalkenylene group" may be a divalent group having the same structure as the $C_1$-$C_{10}$ heterocycloalkenyl group.

In an embodiment, a "$C_6$-$C_{60}$ aryl group" may be a monovalent group having a carbocyclic aromatic system having 6 to 60 carbon atoms. In an embodiment, a "$C_6$-$C_{60}$arylene group" refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$aryl group and the $C_6$-$C_{60}$arylene group each include two or more rings, the rings may be fused to each other.

In an embodiment, a "$C_1$-$C_{60}$ heteroaryl group" may be a monovalent group having a heterocarbocyclic aromatic system that has at least one heteroatom of N, O, P, Si, B, Se, Te, Ge, or any combination thereof, as a ring-forming atom, and 1 to 60 carbon atoms. In an embodiment, a "$C_1$-$C_{60}$ heteroarylene group" may be a divalent group having a carbocyclic aromatic system that has at least one heteroatom of N, O, P, Si, B, Se, Te, Ge, or any combination thereof, as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

In an embodiment, a "$C_6$-$C_{60}$ aryloxy group" may be a monovalent group represented by —$OA_{102}$ (wherein $A_{102}$ is the $C_6$-$C_{60}$ aryl group), and in an embodiment, a $C_6$-$C_{60}$ arylthio group" may be a monovalent group represented by—$SA_{103}$ (wherein $A_{103}$ is the $C_6$-$C_{60}$ aryl group).

In an embodiment, a "monovalent non-aromatic condensed polycyclic group" may be a monovalent group in which two or more rings are condensed with each other, only carbon is used as a ring-forming atom (for example, the number of carbon atoms may be 8 to 60) and the whole molecule is a non-aromaticity group. Examples of the monovalent non-aromatic condensed polycyclic group include a fluorenyl group. In an embodiment, a "divalent non-aromatic condensed polycyclic group" may be a divalent group having the same structure as the monovalent non-aromatic condensed polycyclic group.

In an embodiment, a "monovalent non-aromatic condensed heteropolycyclic group" may refers to a monovalent group having two or more rings condensed to each other, a heteroatom of N, O, P, Si, S, or any combination thereof, other than carbon atoms (for example, having 1 to 60 carbon atoms), as a ring-forming atom, and non-aromaticity in its entire molecular structure. Examples of the monovalent non-aromatic condensed heteropolycyclic group include a carbazolyl group. In an embodiment, a "divalent non-aromatic condensed heteropolycyclic group" may be a divalent group having the same structure as the monovalent non-aromatic condensed heteropolycyclic group.

In an embodiment, a "$C_5$-$C_{30}$ carbocyclic group" may be a saturated or unsaturated cyclic group having, as a ring-forming atom, 5 to 30 carbon atoms only. The $C_5$-$C_{30}$ carbocyclic group may be a monocyclic group or a polycyclic group, and may be a monovalent, divalent, trivalent, tetravalent, pentavalent, or hexavalent group, depending on the formula structure.

In an embodiment, a "$C_1$-$C_{30}$ heterocyclic group" may be a saturated or unsaturated cyclic group having, as a ring-forming atom, at least one heteroatom of N, O, P, Si, S, or any combination thereof, other than 1 to 30 carbon atoms. The $C_1$-$C_{30}$ heterocyclic group may be a monocyclic group or a polycyclic group, and may be a monovalent, divalent, trivalent, tetravalent, pentavalent, or hexavalent group, depending on the formula structure.

In an embodiment, "a biphenyl group, a terphenyl group, and a tetraphenyl group" used herein respectively may be a group (a monovalent group, a divalent group, or a group having at least three valences) in which two, three, or four phenyl groups which are linked together via a single bond, respectively.

As used herein, unless a definition is otherwise provided, the term "hetero" refers to an inclusion of at least one (e.g., one to three) heteroatom(s), wherein the heteroatom(s) is each independently N, O, S, Si, P, or a combination thereof.

As used herein, unless a definition is otherwise provided, the term "aliphatic hydrocarbon group" refers to a C1 to C30 linear or branched alkyl group, a C2 to C30 linear or branched alkenyl group, or a C2 to C30 linear or branched alkynyl group.

As used herein, unless a definition is otherwise provided, the term "aromatic" or "aromatic hydrocarbon group" refers to a moiety having at least one aromatic ring, optionally together with one or more nonaromatic rings, formed by the removal of one or more hydrogen atoms from one or more rings of an aromatic hydrocarbon, wherein the hydrogen atom(s) may be removed from the aromatic or, if present, nonaromatic ring. One or more heteroatoms, e.g., N, P, S, O, Si, or a combination thereof may be present in one or more rings. The aromatic hydrocarbon group may be optionally substituted with one or more substituents.

As used herein, unless a definition is otherwise provided, the term "(meth)acrylate" refers to acrylate, methacrylate, or a combination thereof. The (meth)acrylate may include a (C1 to C10 alkyl) acrylate, a (C1 to C10 alkyl) methacrylate, or a combination thereof.

As used herein, the term "Group" may refer to a group of Periodic Table.

As used herein, a nanoparticle refers to a structure having a region or a characteristic dimension with a nanoscale dimension. In one or more embodiments, the dimension of the nanoparticle may be less than about 500 nm, less than about 300 nm, less than about 250 nm, less than about 150 nm, less than about 100 nm, less than about 50 nm, or less than about 30 nm. The nanoparticle may have any shape, such as a nanowire, a nanorod, a nanotube, a multipod type shape having two or more pods, or a nanodot, but embodiments are not limited thereto. The nanoparticle may be, for example, substantially crystalline, substantially monocrystalline, polycrystalline, amorphous, or a combination thereof.

In an embodiment, the nanoparticle may be a quantum dot. The quantum dot may be a nanostructure (for example, a semiconductor based nanocrystal particle) that exhibits quantum confinement or exciton confinement. The quantum dot is a type of light emitting nanostructure (for example capable of emitting light by an energy excitation). As used herein, unless defined otherwise, a shape of the "quantum dot' may not particularly limited.

In an embodiment, "dispersion" may refer to a system wherein a dispersed phase is a solid and a continuous phase includes a liquid or a solid different from the dispersed phase. In an embodiment, "dispersion" refers to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., about 2 μm or less or about 1 μm or less).

As used herein, a dimension (a size, a diameter, a thickness, or the like) may be a value for a single entity or an average value for a plurality of particles. As used herein, the term "average" (e.g., an average size of quantum dots or nanoparticles) may be a mean value or a median value. In one or more embodiments, the average may be a "mean" value.

As used herein, the term "peak emission wavelength" is the wavelength at which a given emission spectrum of the light reaches its maximum intensity.

In one or more embodiments, a quantum efficiency may be readily and reproducibly determined using commercially available equipment (e.g., from Hitachi or Hamamatsu, etc.) and referring to manuals provided by, for example, respective equipment manufacturers. The quantum efficiency (which can be interchangeably used with the term "quantum yield" (QY)) may be measured in a solution state or a solid state (in a composite). In one or more embodiments, the quantum efficiency (or the quantum yield) is the ratio of photons emitted to photons absorbed by the nanostructure (or population thereof). In one or more embodiments, the quantum efficiency may be measured by any suitable method. For example, there may be two methods for measuring the fluorescence quantum yield or efficiency: the absolute method and the relative method. The quantum efficiency measured by the absolute method may be referred to as an absolute quantum efficiency.

In the absolute method, the quantum efficiency may be obtained by detecting the fluorescence of all samples through an integrating sphere. In the relative method, the quantum efficiency of the unknown sample may be calculated by comparing the fluorescence intensity of a standard dye (standard sample) with the fluorescence intensity of the unknown sample. Coumarin 153, Coumarin 545, Rhodamine 101 inner salt, Anthracene and Rhodamine 6G may be used as standard dyes according to their PL wavelengths, but embodiments are not limited thereto.

The external quantum efficiency of an electroluminescent device (or referred to as a light-emitting device or an organic electroluminescent device) is the ratio of the number of photons emitted from the light-emitting device to the number of electrons passing through the device, and can be easily and reproducibly obtained using source meter or spectrophotometer.

A full width at half maximum and an maximum emission wavelength may be measured, for example, from a luminescence spectrum (for example, a photoluminescence (PL) spectrum or an electroluminescent (EL) spectrum) obtained by a spectrophotometer such as a fluorescence spectrophotometer or the like.

As used herein, the term "first absorption peak wavelength" refers to a wavelength at which a main peak first appears in a lowest energy region in the UV-Vis absorption spectrum.

In this specification, a numerical endpoint or an upper or lower limit value (e.g., recited either as a "greater than or equal to value" "at least value" or a "less than or equal to value" or recited with "from" or "to") may be used to form a numerical range of a given feature.

A semiconductor nanoparticle may be included in a variety of electronic devices. An electrical and/or an optical property of the semiconductor nanoparticle may be controlled for example, by its elemental composition, its size, its shape, or a combination thereof. In one or more embodiments, the semiconductor nanoparticle may be a semiconductor nanocrystal particle. The semiconductor nanoparticle such as a quantum dot may have a relatively large surface area per a unit volume, and thus, may exhibit a quantum confinement effect, exhibiting physical properties and optical properties that are different from a corresponding bulk material having the same composition. Therefore, a semiconductor nanoparticle such as a quantum dot may absorb energy (e.g., incident light) supplied from an excitation source to form an excited state, which upon relaxation is capable of emitting an energy corresponding to its bandgap energy.

The semiconductor nanoparticle may be processed into a patterned composite (e.g., a patterned polymer composite) for its application in a color conversion panel (e.g., a luminescent-type color filter) or a display panel including the same. In an embodiment, unlike a liquid crystal display device having a white light backlight unit, a display panel may include a quantum dot-based color conversion panel or a luminescent-type color filter, for example, in a relatively front portion of the display panel. The color conversion panel or the color filter converts a spectrum of incident light supplied from a light emitting panel to a desired light spectrum (e.g., a red light or a green light). In this type of a display panel, light scattering of the converted light may provide a relatively wide viewing angle.

In a display panel including a semiconductor nanoparticle-based color filter or color conversion panel and an organic electroluminescent device-based light emitting panel, a light emission efficiency of the electroluminescent device and a photoconversion efficiency of the incident light emitted therefrom may affect display quality.

A conventional blue OLED using a fluorescence may have a theoretical efficiency of about 25%. A light emission efficiency and a lifespan of the light source may be an important factor in photoluminescence-based display panels, but the blue light emitted from organic light-emitting layers is a fluorescent type with a low intrinsic efficiency, so there is an inherent limit to the amount of improvement achievable in emission efficiency and lifespan of a conventional blue OLED.

In an embodiment, the display panel may include a green phosphor layer inserted as a tandem structure of the OLED for improving light emission efficiency and increased lifespan, but further improvement in the light emission properties (e.g., EQE, etc.) of the light emitting panel may be still desirable.

In a color conversion panel including a semiconductor nanoparticle, the semiconductor nanoparticle may include a toxic heavy metal such as cadmium, lead, mercury, or a combination thereof to order to exhibit a desired level of light absorption and luminous properties. However, such nanostructures that include cadmium or the other toxic heavy metals may cause environment/health problems and is or are restricted elements, particularly in consumer devices. Accordingly, development of a cadmium-free luminescent nanostructure is desired in the light emitting or display art. To this end, a semiconductor nanocrystal including a Group III-V compound is one of the most researched materials. However, the present inventors have found that in the case of the InP-based quantum dot, absorption of blue light may occur in the InP core and a portion of the ZnSe shell. A semiconductor nanoparticle for green light emission may have a limited size (a size of about 2 nm) of the core that can serve as a light emission center, and thus, a technical challenge for the semiconductor nanoparticle to absorb blue light.

In order to improve the light absorption in a display panel with a light emitting device and a light emitting color conversion layer, a scattering element may be added to individual pixels or an increase in the thickness of the color conversion layer pixel may be considered. In an embodiment, taking into consideration an external light reflection and processability, an amount of a scatterer such as a titanium oxide may be about 3 to about 5 weight percent, and the thickness of the pixel may be 10 μm or less. Therefore, it may be desirable to develop a technology capable of increasing blue light absorption in a display panel including an OLED light source and a light emitting color conversion layer.

The display panel of an embodiment includes a Group I-III-VI-based semiconductor nanoparticle and a Group III-V-based semiconductor nanoparticle in green and red pixels of the color conversion panel, respectively, exhibiting improved performance for a display panel. In an embodiment of the display panel, a hyper fluorescence-based blue light emitted from organic light-emitting devices may be color-changed by the Group 1-III-VI-based semiconductor nanoparticle disposed in a green pixel and the Group III-V-based semiconductor nanoparticle disposed in a red pixel, thereby realizing improved properties (e.g., high luminance and color reproducibility) that have not been reported in a conventional display panel.

Figure 2:
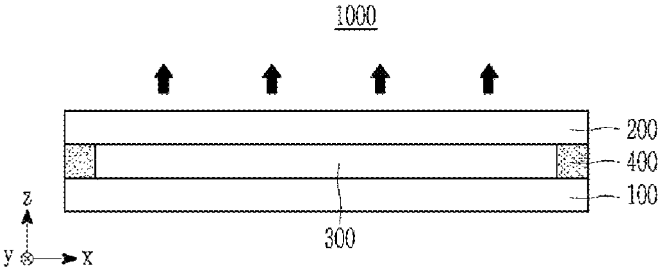
FIG. 2 is a cross-sectional view of the display panel of FIG. 1.

Hereinafter, a display panel according to one or more embodiments will be described. Referring to FIGS. 1 and 2, the display panel 1000 according to an embodiment may include a light emitting panel 100 and a color conversion panel 200 that includes a surface that is opposite a surface of the light emitting panel 100. In other words, the light emitting panel 100 and the color conversion panel 200 each have a surface that face each other. The display panel 1000 may further include a light transmitting layer 300 disposed between the light emitting panel 100 and the color conversion panel 200, a binding element 400 for combining (e.g., adhering) the light emitting panel 100 with (e.g., to) the color conversion panel 200, or a combination thereof.

In an embodiment, the light emitting panel 100 and the color conversion panel 200 may face each other with the light transmitting layer 300 therebetween, and the color conversion panel 200 may be positioned such that light emitted from the light emitting panel 100 is directed toward the color conversion panel 200. The binding element 400 may be along the edges of the light emitting panel 100 and the color conversion panel 200, and may be, for example, a sealant.

Figure 3:
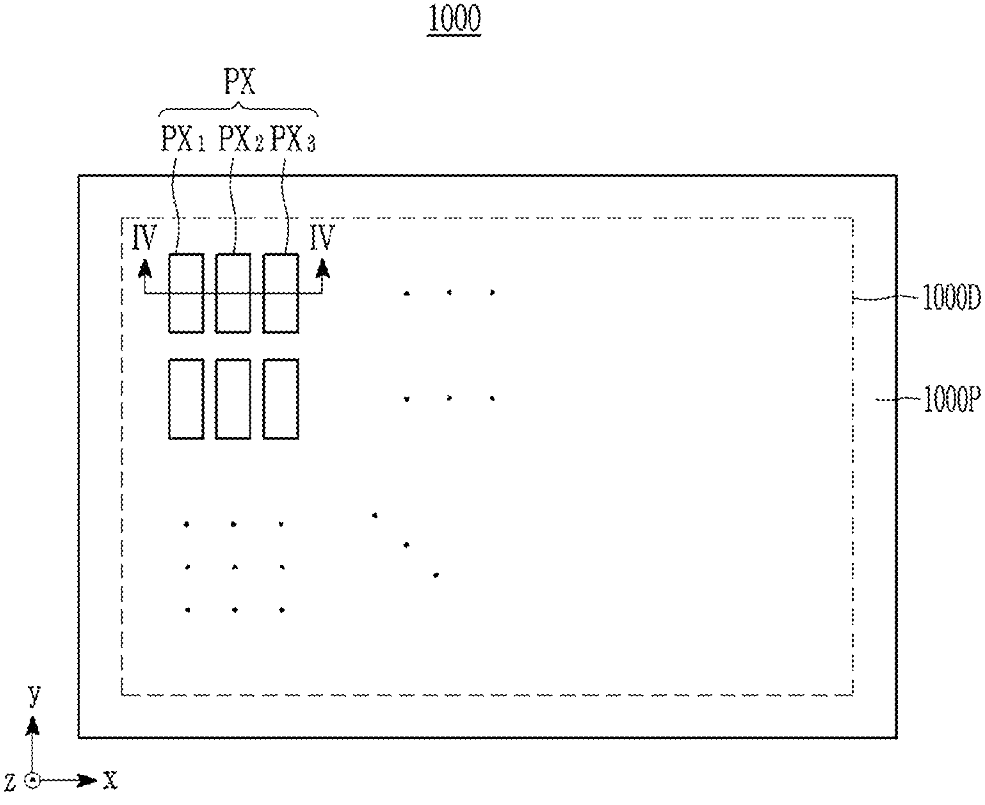
FIG. 3 is a plan view illustrating an example of a pixel arrangement of the display panel of FIG. 1.

Referring to FIG. 3, a display panel 1000 according to an embodiment may include a display area 1000D for displaying an image and a non-display area 1000P around the display area 1000D where the binding element 400 may be located.

The display area 1000D may include a plurality of pixels PXs arranged along a row (e.g., x direction) and/or a column (e.g., y direction), and each pixel PX may include a plurality of sub-pixels $PX_1$, $PX_2$, and $PX_3$ to display different colors. Herein, as an example, a configuration in which three sub-pixels $PX_1$, $PX_2$, and $PX_3$ constitute one pixel PX is illustrated, but the configuration is not limited thereto. An additional sub-pixel such as a white sub-pixel may be further included, and one or more sub-pixel displaying the same color may be included. The plurality of pixels PXs may be arranged in, for example, a Bayer matrix, a PENTILE® matrix or arrangement structure (e.g., an RGBG matrix, RGBG structure, or RGBG matrix structure), and/or a diamond matrix, but embodiments of the present disclosure are not limited thereto.

Each of the sub-pixels $PX_1$, $PX_2$, and $PX_3$ may display a color of three primary colors or a combination of three primary colors, for example, red, green, blue, or a combination thereof (e.g., white light). For example, the first sub-pixel $PX_1$ may display red, the second sub-pixel $PX_2$ may display green, and the third sub-pixel $PX_3$ may display blue.

In the drawings, an example in which all sub-pixels have the same size is illustrated, but the present disclosure is not limited thereto. At least one of the sub-pixels may be larger or smaller than the other sub-pixels. In the drawings, an example in which all sub-pixels have the same shape may be illustrated, but the present disclosure is not limited thereto. At least one of the sub-pixels may have a different shape from other sub-pixels.

Figure 8A:
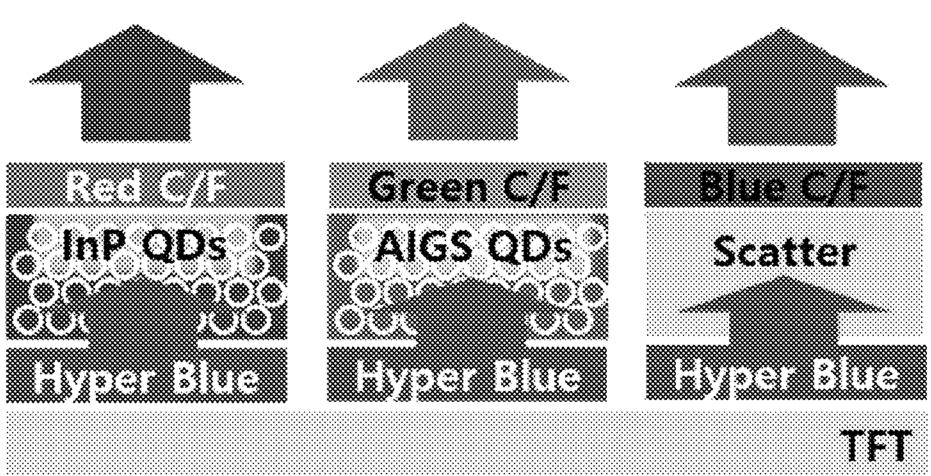
FIG. 8A is a schematic cross-sectional view of a display panel of an embodiment.
Figure 8B:
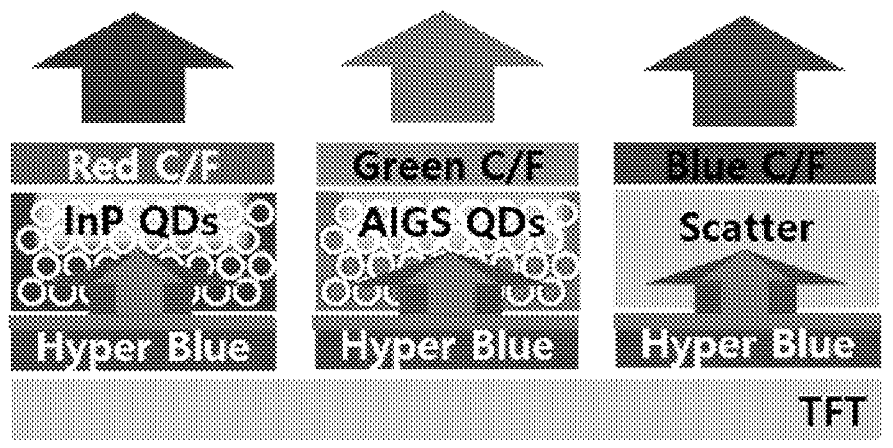
FIG. 8B is a schematic cross-sectional view of a display panel of an embodiment.
Figure 9:
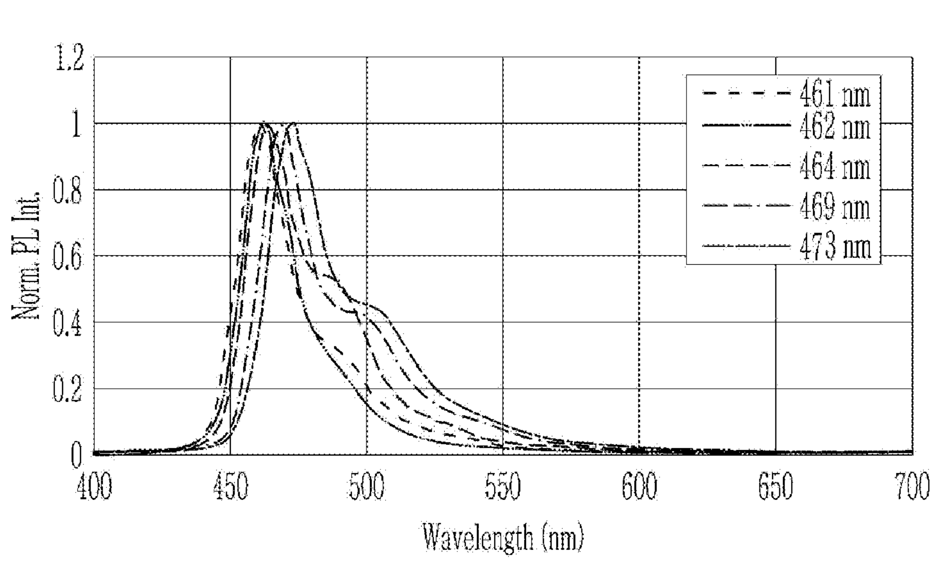
FIG. 9 show luminescent spectra of the blue light emitting unit used in the examples and the comparative examples of the application.

In an embodiment of the display panel, the light emitting panel 100 may be configured to emit incident light including (e.g., hyperfluorescent) blue light and optionally (phosphorescence) green light (see, FIG. 8A and FIG. 8B). The light emitting panel includes a blue light emitting unit configured to emit the blue light.

Referring to FIG. 1, FIG. 4, FIG. 8A and FIG. 8B, a display panel including a light emitting panel 100 and a color conversion panel 200 will be explained in further detail.

Figure 4:
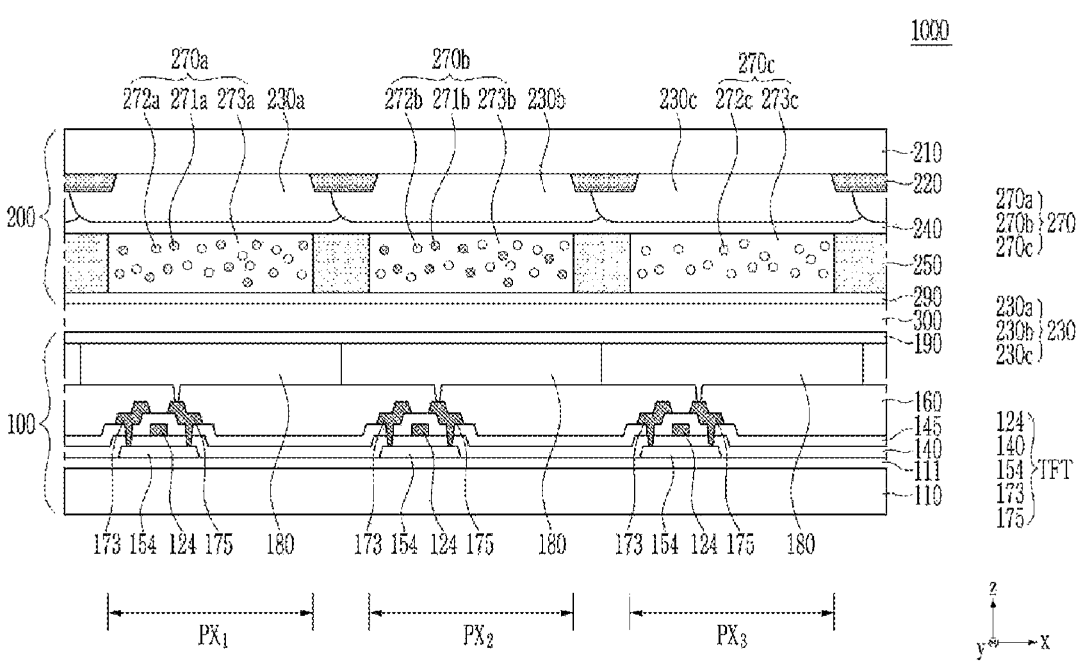
FIG. 4 is a cross-sectional view taken along line IV-IV (as shown in FIG. 3)

The light emitting panel 100 may include a light emitting device to emit light of predetermined wavelength region (spectrum), and a circuit element for switching and/or driving the light emitting device. Referring to FIG. 4, FIG. 8A and FIG. 8B, the light emitting panel 100 of an embodiment may include a lower substrate 110, a buffer layer 111, a thin film transistor TFT, a light emitting element 180, and an encapsulation layer 190.

The lower substrate 110 may include a glass substrate and/or a polymer substrate. The polymer substrate may include, for example, polyimide, polyamide, poly(amide-imide), polyethylene terephthalate, polyethylene naphthalene, polymethyl methacrylate, polycarbonate, a copolymer thereof, or a combination thereof, but is not limited thereto.

The buffer layer 111 may include an organic material, an inorganic material, an organic-inorganic material, or a combination thereof. The buffer layer 111 may include, for example, an oxide, a nitride, and/or an oxynitride, and may include, for example, silicon oxide, silicon nitride, silicon oxynitride, or a combination thereof, but is not limited thereto. The buffer layer 111 may be one layer or two or more layers and may cover a portion of or the entire surface of the lower substrate 110. In some embodiments, the buffer layer 111 may be omitted.

The thin film transistor TFT may be a three-terminal element for switching and/or driving the light emitting element 180, which will be further described below, and one or two or more may be included for each sub-pixel. The thin film transistor TFT may include a gate electrode 124, a semiconductor layer 154 overlapped with the gate electrode 124, a gate insulating layer 140 between the gate electrode 124 and the semiconductor layer 154, and a source electrode 173 and a drain electrode 175 electrically coupled to the semiconductor layer 154. In the drawings, a coplanar top gate structure may be shown as an example, but the structure is not limited thereto and may have various structures.

The gate electrode 124 may be electrically coupled to a gate line, and may include, for example, a low-resistance metal such as aluminum (Al), molybdenum (Mo), copper (Cu), titanium (Ti), silver (Ag), gold (Au), an alloy thereof, or a combination thereof, but is not limited thereto.

The semiconductor layer 154 may be an inorganic semiconductor such as amorphous silicon, polycrystalline silicon, and/or oxide semiconductor; an organic semiconductor; an organic-inorganic semiconductor; or a combination thereof. For example, the semiconductor layer 154 may include an oxide semiconductor including at least one of indium (In), zinc (Zn), tin (Sn), and gallium (Ga), and the oxide semiconductor may include, for example, indium-gallium-zinc oxide, zinc-tin oxide, or a combination thereof, but they are not limited thereto. The semiconductor layer 154 may include a channel region and doped regions on both sides of the channel region and may be electrically coupled to the source electrode 173 and the drain electrode 175, respectively.

The gate insulating layer 140 may include an organic material, an inorganic material, or an organic-inorganic material, and may include, for example, an oxide, a nitride, and/or an oxynitride, and may include, for example, silicon oxide, silicon nitride, silicon oxynitride, or a combination thereof, but is not limited thereto. In the drawings, an example in which the gate insulating layer 140 may be formed on the entire surface of the lower substrate 110 may be illustrated, but the present disclosure is not limited thereto and may be selectively formed between the gate electrode 124 and the semiconductor layer 154. The gate insulating layer 140 may be formed of one, two, or more layers.

The source electrode 173 and the drain electrode 175 may include, for example, a low-resistance metal such as aluminum (Al), molybdenum (Mo), copper (Cu), titanium (Ti), silver (Ag), gold (Au), an alloy thereof, or a combination thereof, but are not limited thereto. The source electrode 173 and the drain electrode 175 may be electrically coupled to the doped regions of the semiconductor layer 154, respectively. The source electrode 173 may be electrically coupled to a data line, and the drain electrode 175 may be electrically coupled to a light emitting device 180 to be further described below.

An interlayer insulating layer 145 may be additionally formed between the gate electrode 124 and the source/drain electrodes 173/175. The interlayer insulating layer 145 may include an organic material, an inorganic material, an organic-inorganic material, or a combination thereof, for example, oxide, nitride, and/or oxynitride, for example, silicon oxide, silicon nitride, silicon oxynitride, or a combination thereof, but is not limited thereto. The interlayer insulating layer 145 may be formed of one, two, or more layers.

A protective layer 160 may be formed on the thin film transistor TFT. The protective layer 160 may be, for example, a passivation layer. The protective layer 160 may include an organic material, an inorganic material, an organic-inorganic material, or a combination thereof, for example, polyacrylic, polyimide, polyamide, poly(amide-imide), or a combination thereof, but is not limited thereto. The protective layer 160 may be formed of one, two, or three or more layers.

The light emitting device 180 may be in each sub-pixel $PX_1$, $PX_2$, and $PX_3$, and the light emitting device 180 in each sub-pixel $PX_1$, $PX_2$, and $PX_3$ may be independently driven. The light emitting device 180 may be, for example, a light emitting diode, and may include a pair of electrodes and a light emitting unit between the pair of electrodes. The light emitting unit may include a blue light emitting unit that is configured to emit blue light (e.g., having a peak emission wavelength in a blue light wavelength range). (see FIG. 8A) The light emitting device 180 or the light emitting unit may further include a green light emitting unit. (see FIG. 8B)

Figure 5:
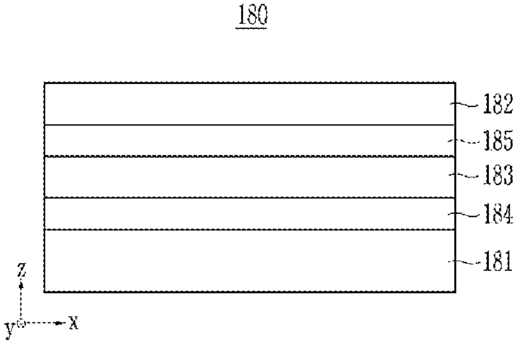
FIG. 5 is a cross-sectional view of a light emitting device included in a light emitting panel of an embodiment.
Figure 6:
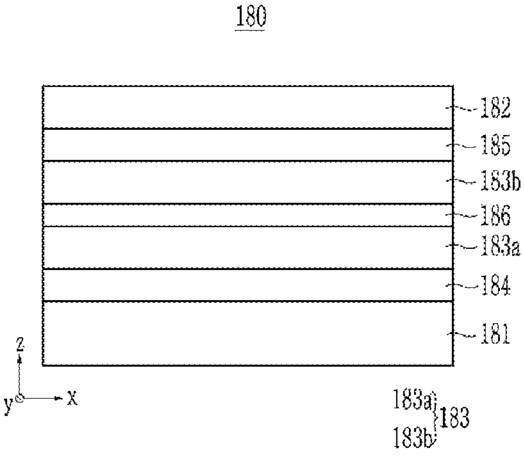
FIG. 6 is a cross-sectional view of a light emitting device included in a light emitting panel of an embodiment.
Figure 7:
FIG. 7 is a cross-sectional view of a light emitting device included in a light emitting panel of an embodiment.
Figure 7:
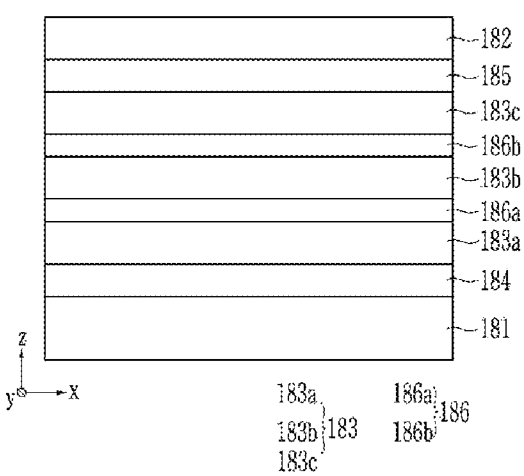

FIGS. 5 to 7 are cross-sectional views showing examples of light emitting elements.

Referring to FIG. 5, the light emitting device 180 may include a first electrode 181 and a second electrode 182 facing each other; and a blue light emitting unit disposed between the first electrode 181 and the second electrode 182. The blue light emitting unit may include an organic light emitting layer 183. In an embodiment, the light emitting device or the light emitting unit may further include auxiliary layers 184 and 185 between the first electrode 181 and the organic light emitting layer 183, between the second electrode 182 and the light emitting layer 183, and/or both, respectively. The first electrode and/or the second electrode may be patterned as a plurality of electrode elements to correspond to each pixel. The first electrode may be anode or cathode. The second electrode may be cathode or anode.

The first electrode 181 and the second electrode 182 each with a surface opposite the other (i.e., face each other along a thickness direction, (for example, the z direction), and any one of the first electrode 181 and the second electrode 182 may be an anode and the other may be a cathode. The first electrode 181 may be a light transmitting electrode, a translucent electrode (or a transreflective electrode), or a reflective electrode, and the second electrode 182 may be a light transmitting electrode, a translucent electrode, or a reflective electrode. The light transmitting electrode or transreflective electrode may be, for example, made of a single layer or multiple layers of a metal thin film including conductive oxides such as indium tin oxide (ITO), indium zinc oxide (IZO), zinc oxide (ZnO), tin oxide (SnO), aluminum tin oxide (AITO), and/or fluorine-doped tin oxide (FTO) and/or silver (Ag), copper (Cu), aluminum (Al), magnesium (Mg), magnesium-silver (Mg—Ag), magnesium-aluminum (Mg—Al), or a combination thereof. The reflective electrode may include a metal, a metal nitride, or a combination thereof, for example, silver (Ag), copper (Cu), aluminum (Al), gold (Au), titanium (Ti), chromium (Cr), nickel (Ni), an alloy thereof, a nitride thereof (e.g., TiN), or a combination thereof, but is not limited thereto.

In the blue light emitting unit, the organic light emitting layer(s) 183 may be configured to emit hyperfluorescence. The hyperfluorescence may be based on a combination of a fluorescent emitter and a sensor material described herein. It is believed that the degradation of conventional blue light-emitting organic light-emitting devices can be exacerbated by the long decay time of excitons, which can trigger triplet-triplet annihilation (TTA) or triplet-polaron quenching (TPQ). It is believed that in blue OLED devices, TTA and TPQ in the light emitting layer can produce high energy excited states (6.0 eV), which can induce chemical bond dissociation in the charge auxiliary layer or the light emitting layer, resulting in a decrease in light emission (or operational lifetime) of the device.

In the blue light emitting unit according to an embodiment, a combination of a fluorescent emitter and a sensor described herein can emit hyperfluorescence blue light, and it is believed that this hyperfluorescence blue light may be provided at a narrow full width at half maximum and with relative high efficiency. In an embodiment, the blue light emitting unit may be driven by the principle that in the sensitizer, a triplet exciton (T1) may transition into a singlet exciton (S1) through a reverse intersystem crossing process, and the formed singlet exciton (S1) may then migrate to the fluorescent emitter through energy transfer to emit light. In an embodiment, the blue light emitting unit may exhibit, for example, a foster-resonant energy transfer (FRET) from the S1 state of the phosphor sensitizer to the S1 state of the fluorescent emitter.

In the blue light emitting unit of an embodiment, the organic light emitting layer may be configured to emit light having a blue light emission spectrum (hereinafter, at times referred to as blue light). The peak emission wavelength of blue light may be greater than or equal to about 400 nm and less than about 500 nm, and may be in a wavelength range of from about 410 nm to about 490 nm, from about 420 nm to about 480 nm, from about 430 nm to about 470 nm, from about 440 nm to about 465 nm, from about 445 nm to about 460 nm, from about 450 nm to about 458 nm, or any combination of the stated wavelengths thereof.

In an embodiment, the peak emission wavelength of the blue light may be greater than or equal to about 450 nm, greater than or equal to about 451 nm, greater than or equal to about 452 nm, greater than or equal to about 453 nm, greater than or equal to about 454 nm, greater than or equal to about 455 nm, greater than or equal to about 456 nm, greater than or equal to about 457 nm, greater than or equal to about 458 nm, greater than or equal to about 459 nm, greater than or equal to about 460 nm and less than or equal to about 469 nm, less than or equal to about 465 nm, less than or equal to about 464 nm, less than or equal to about 463 nm, less than or equal to about 462 nm, less than or equal to about 461 nm, or less than or equal to about 460 nm.

In an embodiment, the light emitting device 180 may further include a unit emitting light of a green luminescent spectrum (i.e., green light), and the peak emission wavelength of the green light may be greater than or equal to about 500 nm and less than or equal to about 590 nm. The peak emission wavelength of the green light may be from about 510 nm to about 580 nm, from about 515 nm to about 570 nm, from about 520 nm to about 560 nm, from about 525 nm to about 555 nm, from about 530 nm to about 550 nm, from about 535 nm to about 545 nm, or any combination of the stated wavelengths thereof.

In an embodiment, the blue light emitting unit may emit blue light and the blue light having the peak emission wavelength in the range described herein may exhibit a full width at quarter maximum (FWQM) (optionally together with FWHM). The blue light may have a maximum external quantum efficiency described herein.

In an embodiment, the full width at quarter maximum (FWQM) of the blue light may be greater than or equal to about 20 nm, greater than or equal to about 25 nm, greater than or equal to about 30 nm, greater than or equal to about 35 nm, greater than or equal to about 40 nm, greater than or equal to about 45 nm, or greater than or equal to about 50 nm. In an embodiment, the FWQM of the blue light may be less than or equal to about 60 nm, less than or equal to about 59 nm, less than or equal to about 58 nm, less than or equal to about 57 nm, less than or equal to about 56 nm, less than or equal to about 55 nm, less than or equal to about 54 nm, less than or equal to about 53 nm, less than or equal to about 52 nm, less than or equal to about 51 nm, less than or equal to about 50 nm, less than or equal to about 49 nm, less than or equal to about 48 nm, less than or equal to about 47 nm, or less than or equal to about 46 nm.

In an embodiment, the full width at half maximum (FWHM) of the blue light may be greater than or equal to about 3 nm, greater than or equal to about 5 nm, greater than or equal to about 7 nm, greater than or equal to about 9 nm, greater than or equal to about 10 nm, greater than or equal to about 12 nm, greater than or equal to about 14 nm, greater than or equal to about 16 nm, greater than or equal to about 18 nm; less than or equal to about 38 nm, less than or equal to about 37 nm, less than or equal to about 35 nm, less than or equal to about 33 nm, less than or equal to about 30 nm, less than or equal to about 29 nm, less than or equal to about 27 nm, less than or equal to about 25 nm, less than or equal to about 23 nm, less than or equal to about 21 nm, less than or equal to about 19 nm, or less than or equal to about 17 nm; or any combination of the stated wavelengths thereof.

Figure 12:
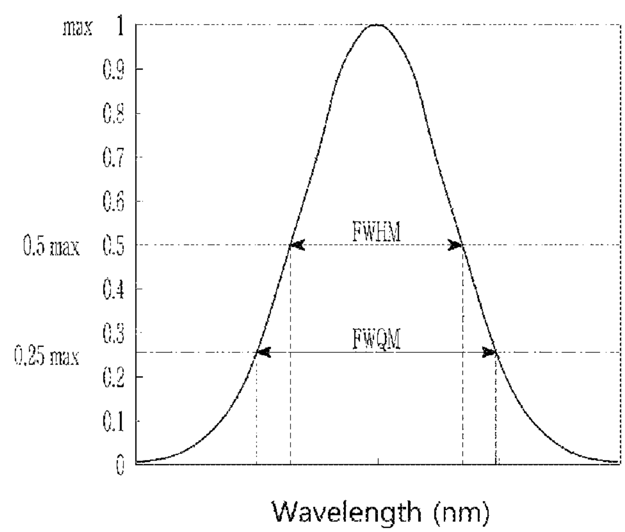
FIG. 12 is a view illustrating a full width at half maximum and a full width at quarter maximum.

The full width at half maximum (FWHM) is the width of the spectrum curve measured between points on the y-axis, at which is half of the maximum peak intensity, and the full width at quarter maximum (FWQM) is the width of the spectrum curve measured between points on the y-axis, at which is ¼ (25%) of the maximum peak intensity. (see FIG. 12)

In an embodiment, the maximum external quantum efficiency of the blue light may be greater than about 14%, for example, greater than or equal to about 15%, greater than or equal to about 17%, greater than or equal to about 19%, greater than or equal to about 20%, greater than or equal to about 21%, greater than or equal to about 23%, greater than or equal to about 25%, greater than or equal to about 27%, greater than or equal to about 29%, greater than or equal to about 31%, greater than or equal to about 33%, greater than or equal to about 35%, or greater than or equal to about 37%. The maximum external quantum efficiency of the blue light may be less than or equal to about 60%, less than or equal to about 50%, less than or equal to about 45%, less than or equal to about 43%, or less than or equal to about 40%.

In an embodiment, the organic light emitting layer 183 may include a host, a sensitizer, and an emitter. In an embodiment of the organic light emitting layer, the combination of these components may be configured to emit hyperfluorescent blue light that may be configured to exhibit the aforementioned FWQM (optionally together with the aforementioned FWHM) and the aforementioned max EQE.

In an embodiment, the sensitizer and the emitter can maintain a sufficient distance to prevent an unwanted exchange of triplet excitons through Dexter energy transfer between them. For example, at least one of the sensitizers or the emitters may include a bulky group such as a methyl group, a tertiary butyl group, a phenyl group, or a cumyl group. In addition, the concentration of the emitter in the organic emission layer can be kept relatively low, less than 10%, less than 5%, less than 3%, or less than 2% in the matrix, (e.g., based on a weight).

The sensitizer and the emitter may be selected to have a sufficient overlap between the photoluminescence spectrum of the sensitizer and the absorption spectrum of the emitter, for enhancing the efficiency of the FRET. In an embodiment, the molecular orbital energy levels of the host, sensitizer, and the emitter may be arranged so that on the fluorophore, the direct exiton formation via the charge trapping may be prevented. In an embodiment, the sensitizer may have a HOMO level comparable to the emitter, and a direct charge trapping on the fluorescent emitter may be effectively reduced or prevented.

In an embodiment, the FRET from the sensitizer to the emitter may be efficient to harvest triplet excitons for light emission. In addition, intermolecular spacing between the sensitizer and the emitter may be maintained so that the transition of dexter energy, which can lead to non-luminescence loss of the triplets, can be suppressed and triplet quenching can be minimized or suppressed.

In an embodiment, the host may include a single compound or may include two or more different compounds (e.g., of different types). The host may include an electron transport host (e.g., which may include an electron transport moiety), a hole transport host (e.g., which may not include an electron transport moiety), or a combination thereof.

In an embodiment, the electron transport moiety may include a cyano group, —F, $—CFH_2$, $—CF_2H$, $—CF_3$, a π-electron-deficient nitrogen-containing cyclic group, —(PO)—, —(P=S)—, —(S=O)—, $—(SO_2)—$, or a combination thereof. In an embodiment, the electron transport host may include a cyano group. In an embodiment, the electron transport host may include a cyano group, a π-electron-deficient nitrogen-containing cyclic group, or any combination thereof. In an embodiment, the electron transport host may include at least one cyano group. In an embodiment, the electron transport host may include at least one cyano group and at least one π-electron-deficient nitrogen-containing cyclic group.

In an embodiment, the hole transport host may include at least one π-electron-deficient nitrogen-free cyclic group and may not include an electron transport moiety.

In an embodiment, the π-electron-deficient nitrogen-containing cyclic group may be a cyclic group having at least one *—N=* moiety. The π-electron-deficient nitrogen-containing cyclic group may include: an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, or an azacarbazole group; a condensed cyclic group of two or more π-electron-deficient nitrogen-containing cyclic groups; or a combination thereof.

In an embodiment, the "π-electron-deficient nitrogen-free cyclic group" may include, for example, a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, or a triindolobenzene group; or a condensed cyclic group of two or more π-electron-deficient nitrogen-free cyclic groups, or a combination thereof.

In an embodiment, the host may include a compound including a substituted or unsubstituted biphenyl group, a substituted or unsubstituted carbazole group, a substituted or unsubstituted triazine group, or a combination thereof. The host may be a compound substituted with a cyano group.

In an embodiment, the host may include any one of the following compounds:

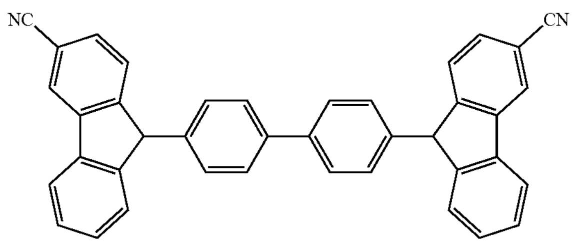

CBP-CN

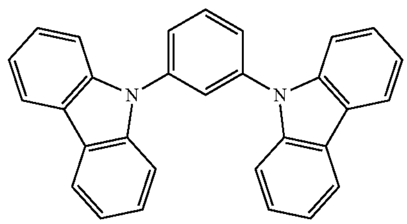

mCP

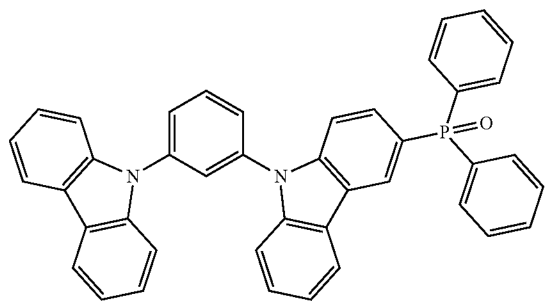

mCPPO1

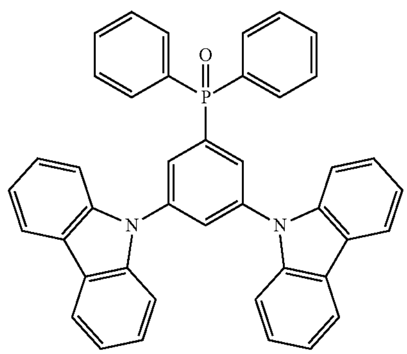

DCPPO

-continued

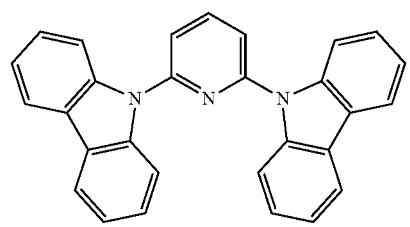

26mCPy

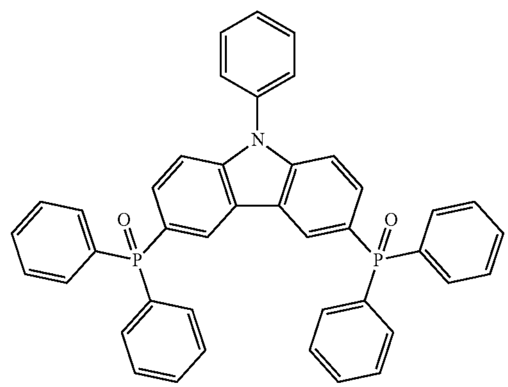

PPO2

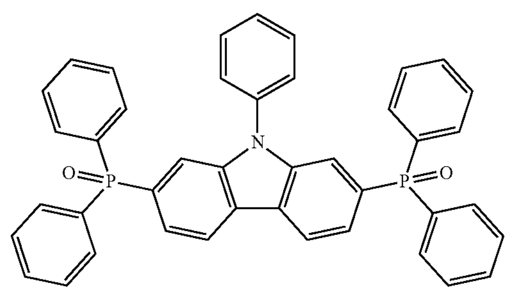

PPO27

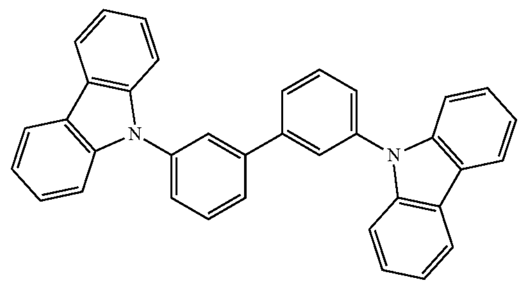

mCBP

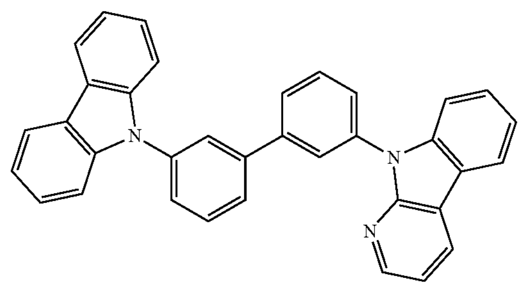

CzPBCb

-continued
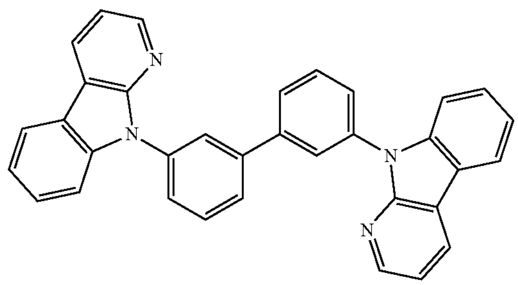
CbBPCb
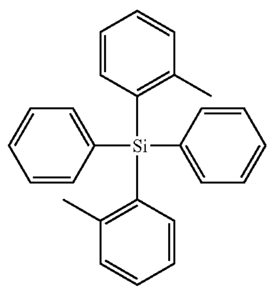
UGH1
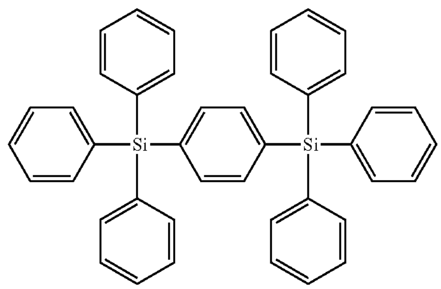
UGH2
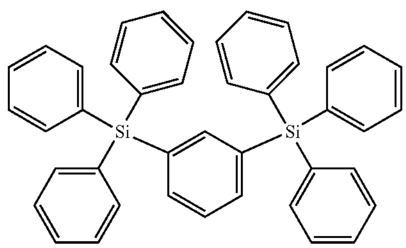
UGH3
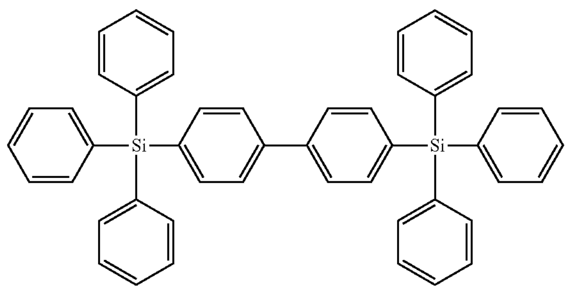
BSB
-continued
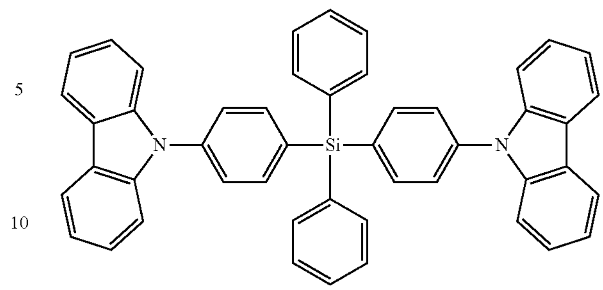
SiCa
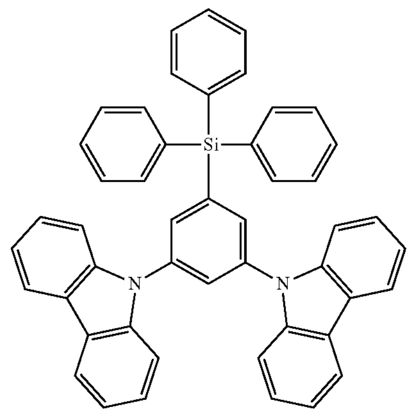
SimCP
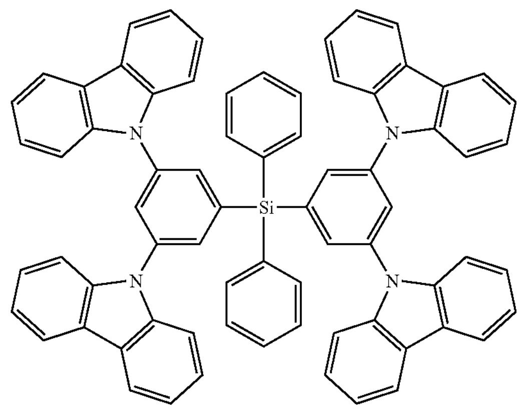
SimCP2

-continued
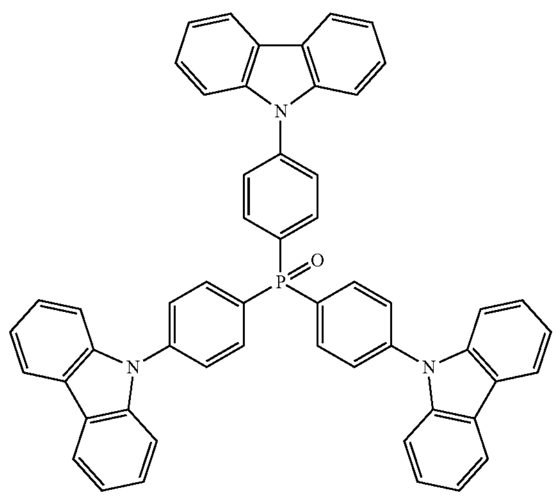
TCTP
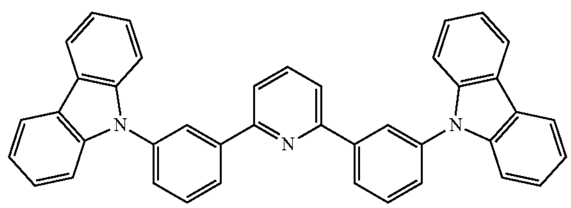
26DCzPPY
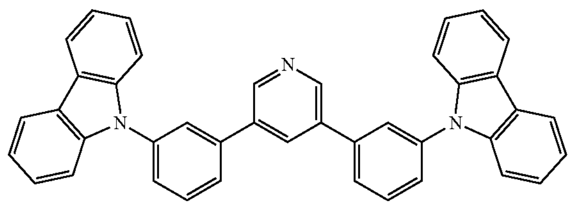
35DCzPPY
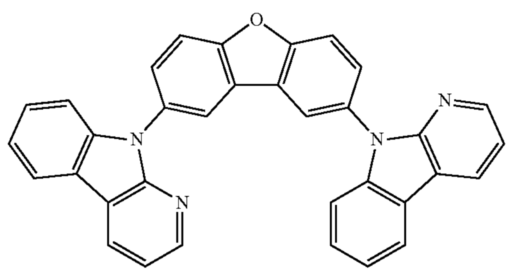
DBFCb
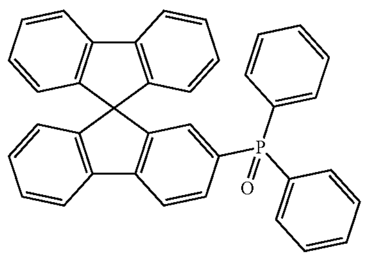
SPPO1
-continued
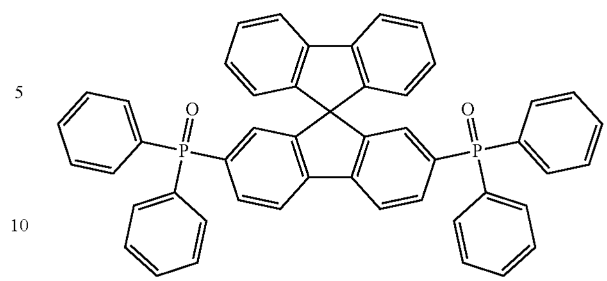
SPPO13
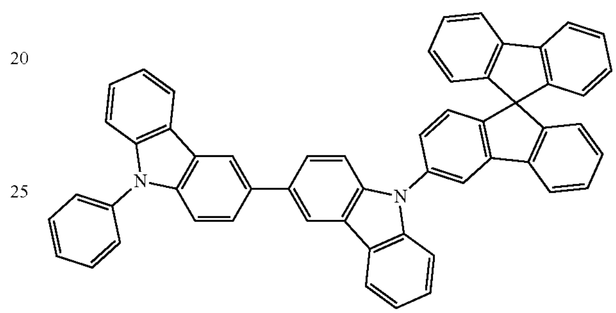
SF2BCz
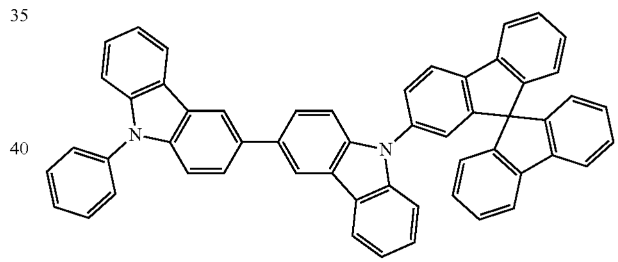
SF3BCz
In an embodiment, the host may be a combination of a hole transport host (e.g., oCBP) and an electron transport host (e.g., mCBP-CN):
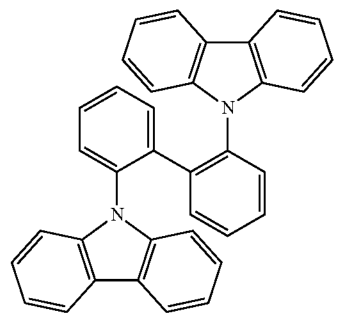
oCBP -continued

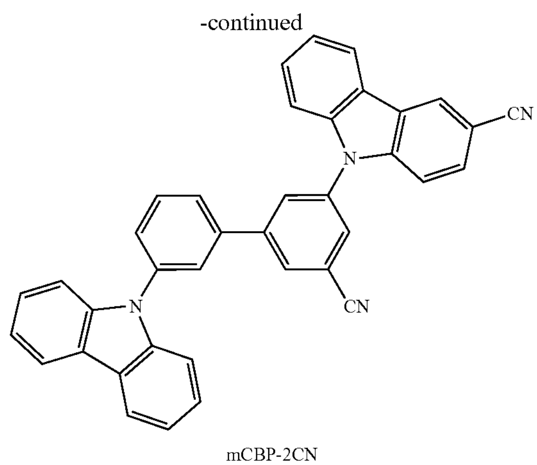

mCBP-2CN

In an embodiment, the host may be a mixture of an electron transport host and a hole transport host, and a weight ratio of the electron transport host and the hole transport host may be selected from 1:9 to 9:1, for example, 2:8 to 8:2, as another example, 4:6 to 6:4, and as another example, 5:5.

In an organic emitting layer 183 of an embodiment, the sensitizer may include an organic metal compound that includes iridium (Ir), platinum (Pt), palladium (Pd), osmium (Os), titanium (Ti), gold (Au), silver (Ag), copper (Cu), ruthenium (Ru), rhenium (Re), rhodium (Rh), terbium (Tb), thulium (Tm), or any combination thereof. The sensitizer or the organic metal compound may be configured to emit phosphorescence (e.g., a blue phosphorescence). In an embodiment, the sensitizer may include Ir, Pt, or any combination thereof. In an embodiment, the organic metal compound may include an organic metal compound having a square-planar coordination structure including a metal M, for example, as set forth herein. The sensitizer or the organic metal compound may include a substituted or unsubstituted $C_5$-$C_{30}$ carbocyclic group, a substituted or unsubstituted $C_1$-$C_{30}$ heterocyclic group, a substituted or unsubstituted non-cyclic group, or a combination thereof. The substituted or unsubstituted $C_5$-$C_{30}$ carbocyclic group and the substituted or unsubstituted $C_1$-$C_{30}$ heterocyclic group may be a 6-membered ring, a condensed ring in which two or more 6-membered rings are condensed each other, a condensed ring in which at least one 6-membered ring and one 5-membered ring are condensed each other, or a combination thereof. In an embodiment, the 6-membered ring may include a cyclohexane group, a cyclohexene group, an adamantane group, a norbornane group, a norbornene group, a benzene group, a pyridine group, a pyrimidine group, a pyrazine group, a pyridazine group, and a triazine group; and the 5-membered ring may be a cyclopentane group, a cyclopentene group, a cyclopentadiene group, a furan group, a thiophene group, a silole group, a pyrrole group, a pyrazole group, an imidazole group, a triazole group, an oxazole group, an isoxazole group, a thiazole group, an isothiazole group, an oxadiazole group, a thiadiazole group, or a combination thereof.

The sensitizer or the organic metal compound may include a metal M (e.g., as described herein) and an organic ligand, and the metal M and the organic ligand may form one, two, or three cyclometallated ring(s). The sensitizer or the organic metal compound may include a metal M and a four-coordinate organic ligand that forms three or four cyclometallated ring(s). The four-coordinate organic ligand may include a benzimidazole group, a benzene group, a pyridine group, an imidazole group, or a combination thereof, but is not limited thereto. The organic ligand may include selective substitution of hydrogen with one or more sites of deuteration.

In an embodiment, the sensitizer or the organic metal compound may include any one or more of the following compounds:

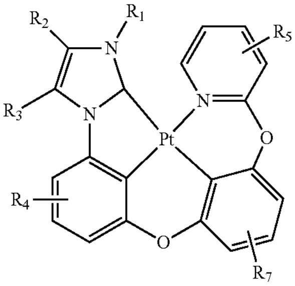

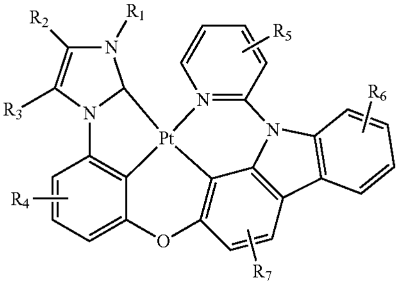

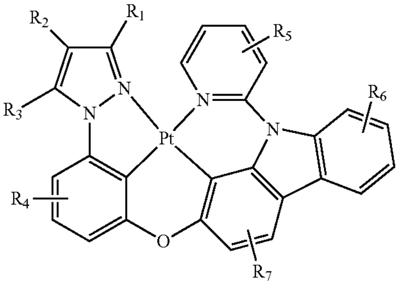

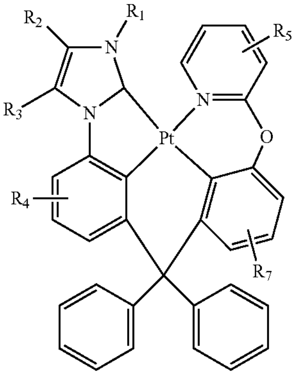

-continued
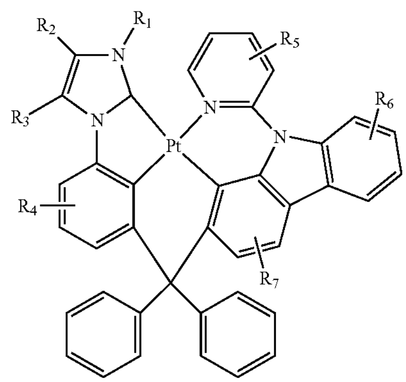
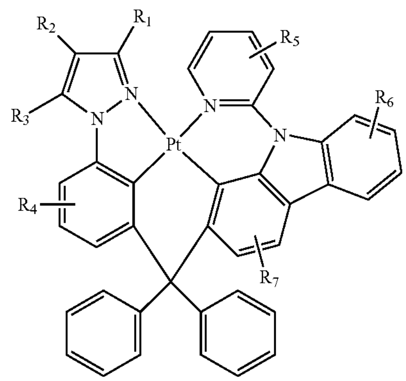
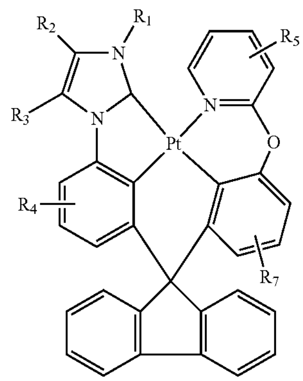
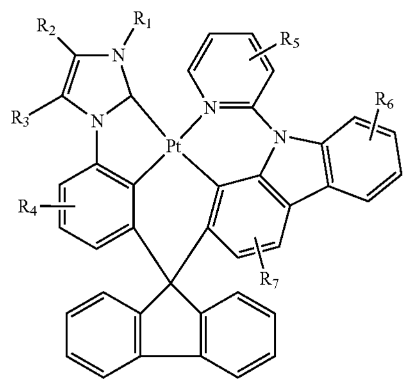
-continued
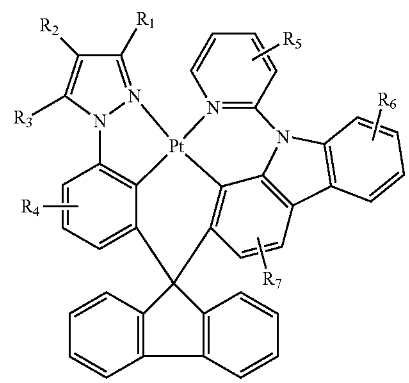
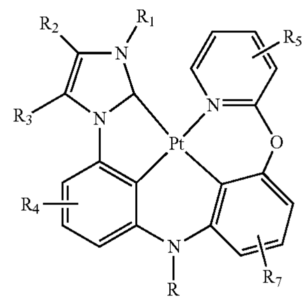
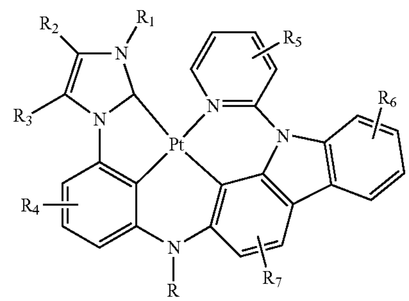
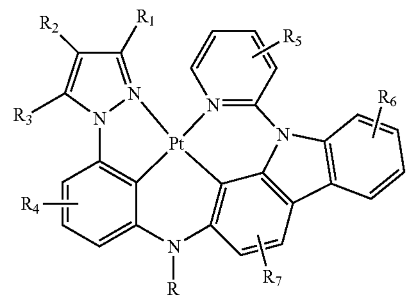
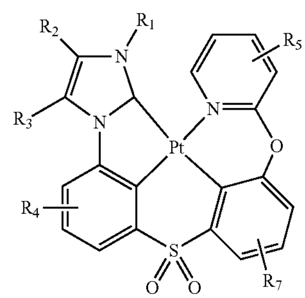

-continued

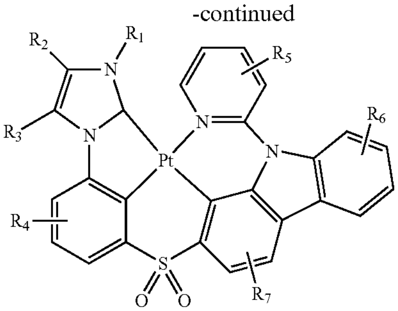

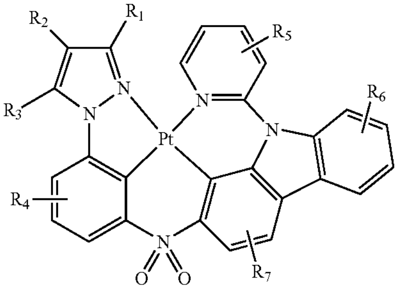

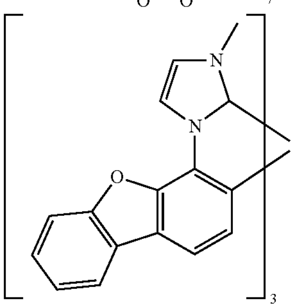

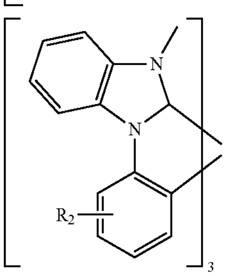

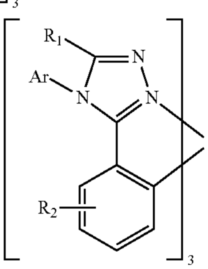

In the above formulae, R and $R_1$ to $R_7$ are the same or different and each independently hydrogen, deuterium, —F, —Cl, —Br, —I, a hydroxyl group, a cyano group, —$CF_3$, a trimethylsilyl group, a nitro group, an amidino group, a hydrazino group, a hydrazono group, a substituted or unsubstituted $C_1$-$C_{60}$ alkyl group (e.g., a halogen substituted alkyl group), a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$alkyl aryl group, a substituted or unsubstituted $C_6$-$C_{60}$aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

Any two adjacent groups of R1 to R7 may be optionally linked to each other to form a substituted or unsubstituted $C_5$-$C_0$ carbon (alicyclic or aromatic) ring or a substituted or unsubstituted $C_1$-$C_{60}$ hetero (heteroalicyclic or aromatic) ring.

In the above formulae, Ar may be a substituted or unsubstituted $C_5$-$C_{60}$ carbocyclic (e.g., alicyclic or aromatic) group such as a substituted or unsubstituted terphenyl moiety) or a substituted or unsubstituted $C_1$-$C_{60}$ heterocyclic (e.g., heteroalicyclic or heteroaromatic) group.

In an embodiment, the sensitizer may include a compound having the following structure:

D1

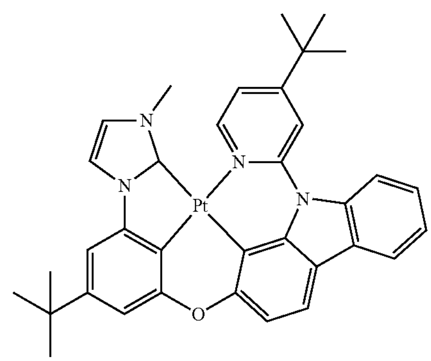

In an embodiment, the emitter may include a hydrocarbon-based fluorescent (HCF) emitter, multiple resonance fluorescent (MRF) emitter, or a combination thereof. The emitter may include a pyrene diamine compound with a bulky substituent (e.g., N1, N1, N6, N6-tetrakis (4-(tert-butyl)phenyl) pyrene-1,6-diamine). The emitter may include a boron compound. The emitter may include a compound represented by Chemical Formula 1, a compound represented by Chemical Formula 2, a compound represented by Chemical Formula 3, or a combination thereof:

Chemical Formula 1

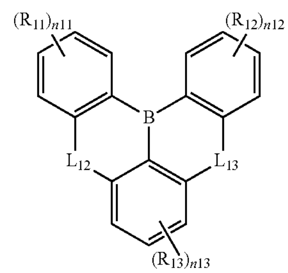

Chemical Formula 2

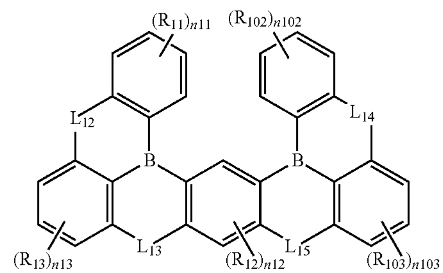

-continued

Chemical Formula 3

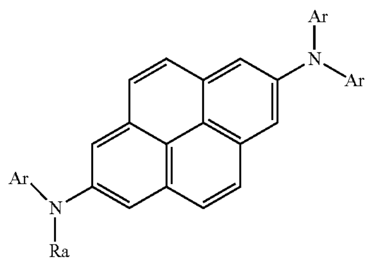

In Chemical Formulae 1, 2, and 3, $L_{12}$, $L_{13}$, $L_{14}$, and $L_{15}$ are each independently —NR— or —O—;

Ar may be a substituted or unsubstituted aromatic group (e.g., a substituted or unsubstituted aryl group);

R, $R_{11}$, $R_{12}$, $R_{13}$, $R_{102}$, and $R_{103}$ are the same or different and may be each independently hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), wherein in Chemical Formula 1, at least one of $R_{11}$, $R_{12}$, and $R_{13}$ is not hydrogen, and in Chemical Formula 2, at least one of $R_{11}$, $R_{12}$, $R_{13}$, $R_{102}$, and $R_{103}$ is not hydrogen, n11, n12, n13, n102, and n103 are each independently zero or an integer from 1 to 10, and $Q_1$, $Q_2$, and $Q_3$are the same or different, and each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$aryloxy group, a $C_6$-$C_{60}$arylthio group, a $C_1$-$C_{60}$ heteroaryl group, a $C_2$-$C_{60}$alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or any combination thereof, or a $C_6$-$C_{60}$ aryl group that is substituted with at least one deuterium, —F, a cyano group, a $C_1$-$C_{60}$ alkyl group, a $C_6$-$C_{60}$ aryl group, or any combination thereof.

In an embodiment, the emitter may include any of the following compounds:

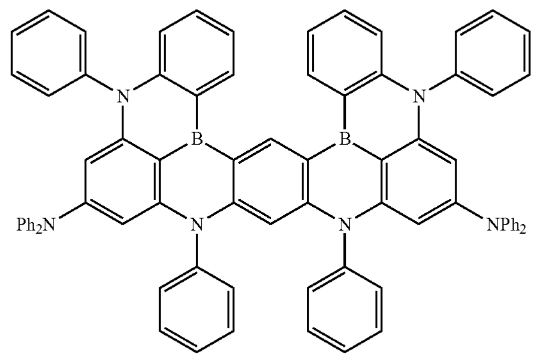

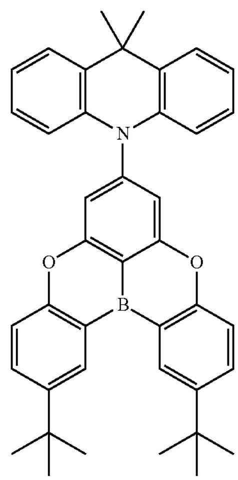

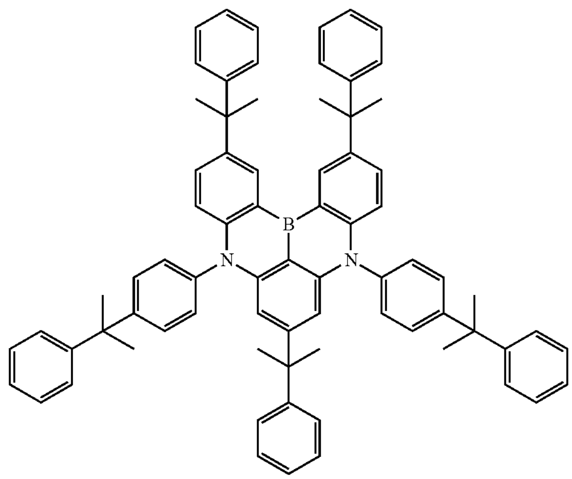

-continued

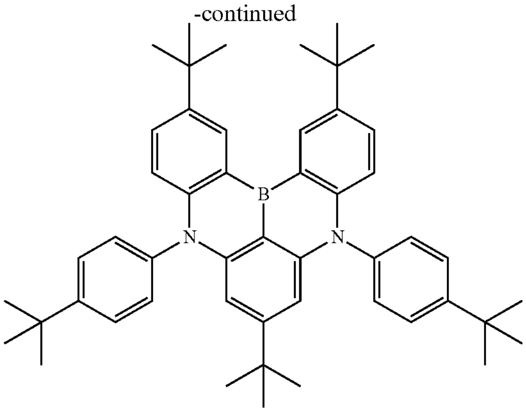

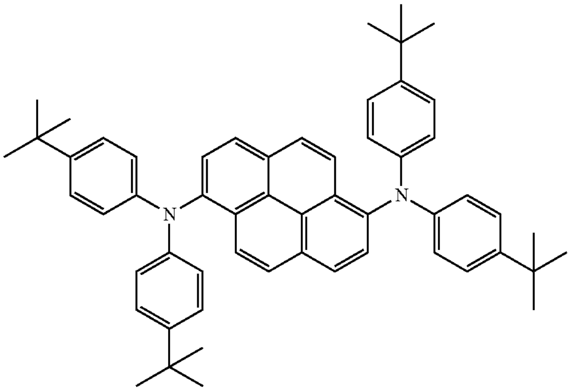 [SMILES: CC(C)(C)c1ccc(N(c2ccc(C(C)(C)C)cc2)c2ccc3ccc4c(N(c5ccc(C(C)(C)C)cc5)c5ccc(C(C)(C)C)cc5)ccc5ccc2c3c54)cc1]

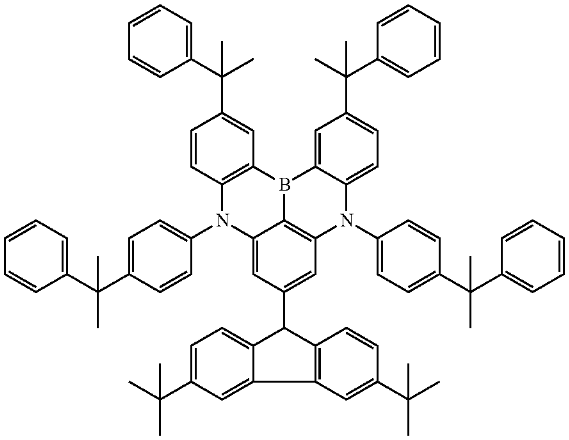 [SMILES: CC(C)(C)c1ccc2c(c1)-c1cc(C(C)(C)C)ccc1C2c1cc2c3c(c1)N(c1ccc(C(C)(C)c4ccccc4)cc1)c1ccc(C(C)(C)c4ccccc4)cc1B3c1cc(C(C)(C)c3ccccc3)ccc1N2c1ccc(C(C)(C)c2ccccc2)cc1]

In the light emitting layer 183 of an embodiment, an amount of the sensitizer may be selected appropriately, and is not particularly limited. In the light emitting layer, an amount of the sensitizer may be, based upon a total weight of the light emitting layer, greater than or equal to about 0.1 wt %, greater than or equal to about 0.3 wt %, greater than or equal to about 1 wt %, greater than or equal to about 2 wt %, greater than or equal to about 3 wt %, greater than or equal to about 4 wt %, or greater than or equal to about 5 wt %, and less than or equal to about 60 wt %, less than or equal to about 50 wt %, less than or equal to about 40 wt %, less than or equal to about 30 wt %, less than or equal to about 20 wt %, less than or equal to about 10 wt %, less than or equal to about 8 wt %, less than or equal to about 5 wt %, less than or equal to about 3 wt %, or less than or equal to about 2 wt %.

In the light emitting layer 183 of an embodiment, an amount of the emitter may be selected appropriately, and is not particularly limited. In the light emitting layer, an amount of the emitter may be, based upon a total weight of the light emitting layer, greater than or equal to about 0.1 wt %, greater than or equal to about 0.3 wt %, greater than or equal to about 1 wt %, greater than or equal to about 2 wt %, greater than or equal to about 3 wt %, greater than or equal to about 4 wt %, or greater than or equal to about 5 wt %, and less than or equal to about 60 wt %, less than or equal to about 50 wt %, less than or equal to about 40 wt %, less than or equal to about 30 wt %, less than or equal to about 20 wt %, less than or equal to about 10 wt %, or less than or equal to about 8 wt %.

In an embodiment, a thickness of the light emitting layer 183 may be selected appropriately and is not particularly limited. A thickness of the light emitting layer may be in a range of from about 10 angstrom to about 10000 angstrom, from about 100 angstrom to about 5000 angstrom, from about 300 angstrom to about 3000 angstrom, from about 400 angstrom to about 2000 angstrom, from about 500 angstrom to about 1000 angstrom, or a combination of stated thickness values thereof.

The blue light emitting unit may exhibit a ratio of current efficiency (CE)(Cd/A) to CIEy in a CIE1931 color coordination that is greater than or equal to about 100, greater than or equal to about 120, greater than or equal to about 130, greater than or equal to about 140, greater than or equal to about 150, greater than or equal to about 160, greater than or equal to about 170, greater than or equal to about 180, greater than or equal to about 185, greater than or equal to about 350, greater than or equal to about 360, greater than or equal to about 370, greater than or equal to about 380, greater than or equal to about 390, or greater than or equal to about 400. The ratio of a current efficiency (Cd/A) to CIEy in the CIE1931 color coordination of the blue light emitted may be less than or equal to about 800, less than or equal to about 700, less than or equal to about 600, less than or equal to about 500, less than or equal to about 300, less than or equal to about 250, less than or equal to about 200, or less than or equal to about 190.

The blue light emitting unit may exhibit a decay time (tau), as measured in a time resolved photoluminescent spectroscopy analysis, that may be greater than or equal to about 5 ns, greater than or equal to about 10 ns, greater than or equal to about 30 ns, greater than or equal to about 50 ns, greater than or equal to about 70 ns, greater than or equal to about 100 ns, greater than or equal to about 120 ns, greater than or equal to about 150 ns, greater than or equal to about 200 ns, greater than or equal to about 300 ns, greater than or equal to about 500 ns, greater than or equal to about 700 ns, greater than or equal to about 900 ns, greater than or equal to about 1 μs, greater than or equal to about 1.2 μs, greater than or equal to about 1.5 μs, greater than or equal to about 1.7 μs, greater than or equal to about 2 μs, or greater than or equal to about 2.5 μs. The decay time may be less than or equal to about 10 μs, less than or equal to about 9 μs, less than or equal to about 8 μs, less than or equal to about 7 μs, less than or equal to about 6 μs, less than or equal to about 5 μs, less than or equal to about 4 μs, less than or equal to about 3.5 μs, or less than or equal to about 3 μs.

The blue light emitting unit may exhibit a lifespan (T50), as measured at an initial luminance of about 1000 nit, that is greater than or equal to about 50 hours, greater than or equal to about 70 hours, greater than or equal to about 90 hours, greater than or equal to about 100 hours, greater than or equal to about 120 hours, greater than or equal to about 150 hours, or greater than or equal to about 200 hours. The blue light emitting unit may exhibit a lifespan (T50), as measured at an initial luminance of about 1000 nit, that is less than or equal to about 2000 hours, less than or equal to about 1800 hours, less than or equal to about 1600 hours, less than or equal to about 1500 hours, less than or equal to about 1200 hours, less than or equal to about 1000 hours, less than or equal to about 900 hours, less than or equal to about 800 hours, less than or equal to about 700 hours, less than or equal to about 600 hours, or less than or equal to about 500 hours. As used herein, the term "T50" is a time (hours, hr) the brightness (e.g., luminance) of a given device decreases to 50% of the initial brightness (100%) as, e.g., when, the given device is started to be driven, e.g., operated, at a predetermined initial brightness.

In an electroluminescent or a photoluminescent spectrum of the organic light emitting layer 183 of the blue light emitting unit, a ratio of the intensity at 500 nm to an intensity at a peak emission wavelength may be greater than or equal to about 0.001:1, greater than or equal to about 0.01:1, greater than or equal to about 0.05:1, greater than or equal to about 0.1:1, greater than or equal to about 0.15:1, greater than or equal to about 0.2:1, or greater than or equal to about 0.25:1. In an electroluminescent or a photoluminescent spectrum of the organic light emitting layer of the blue light emitting unit, a ratio of the intensity at 500 nm to an intensity at a peak emission wavelength may be less than or equal to about 0.4:1, less than or equal to about 0.38:1, less than or equal to about 0.36:1, less than or equal to about 0.35:1, less than or equal to about 0.34:1, less than or equal to about 0.33:1, less than or equal to about 0.32:1, less than or equal to about 0.31:1, less than or equal to about 0.3:1, less than or equal to about 0.28:1, less than or equal to about 0.25:1, less than or equal to about 0.24:1, less than or equal to about 0.23:1, less than or equal to about 0.22:1, less than or equal to about 0.21:1, less than or equal to about 0.2:1, or less than or equal to about 0.19:1.

In an embodiment, the light emitting device 180 or the blue light emitting unit may further include an auxiliary layer 184 and 185. The auxiliary layers 184 and 185 may be disposed between the first electrode 181 and the light emitting layer 183 or disposed between the second electrode 182 and the light emitting layer 183, respectively, and may be a charge auxiliary layer to control injection and/or mobility of charge carriers (electrons or holes), respectively.

In an embodiment, a hole auxiliary layer may be disposed between the anode and the light emitting layer, and an electron auxiliary layer may be disposed between the cathode and the light emitting layer. Each of the auxiliary layers 184 and 185 may be one or two or more layers, and may be, for example, a hole injection layer, a hole transport layer, an electron blocking layer, an electron injection layer, an electron transport layer, a hole blocking layer, or a combination thereof. In some embodiments, one or both of the auxiliary layers 184 and 185 may be omitted. A material for the auxiliary layer may be selected appropriately in accordance with the general knowledge in the art.

In one embodiment, the hole auxiliary layer may include a carbazole-containing amine-based compound, a carbazole free amine-based compound, or a combination thereof. The carbazole-containing amine-based compound may be, for example, a compound including a carbazole group and further including at least one of a dibenzofuran group, a dibenzothiophene group, a fluorene group, a spiro-bifluorene group, an indenocarbazole group, an indolocarbazole group, a benzofurocarbazole group, or a benzothienocarbazole group.

The carbazole-free amine-based compound may be, for example, a compound which does not include a carbazole group and which include at least one of a dibenzofuran group, a dibenzothiophene group, a fluorene group, a spiro-bifluorene group, an indenocarbazole group, an indolocarbazole group, a benzofurocarbazole group, a benzothienocarbazole group, or any combination thereof.

In an embodiment, the hole auxiliary layer may include, but is not limited to, the following compound or a combination thereof:

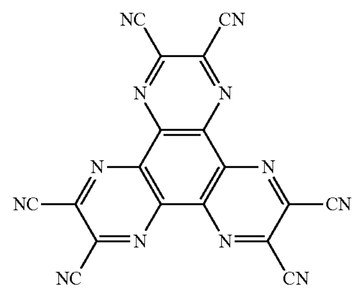

HAT-CN

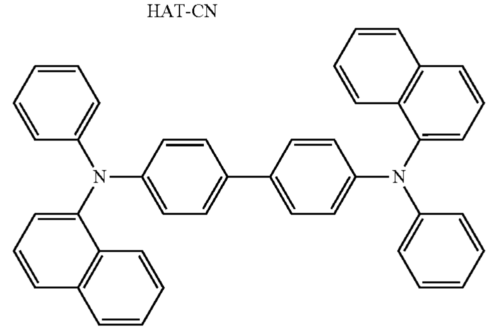

NPB

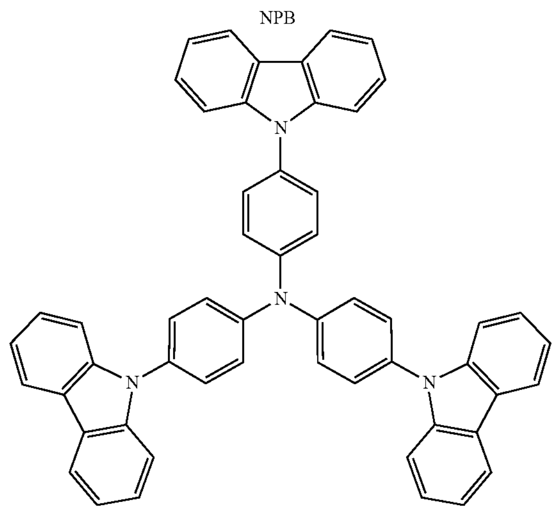

TCTA

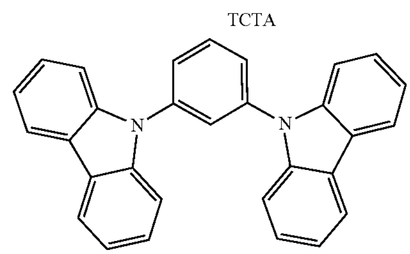

mCP

In an embodiment, the electron auxiliary layer (e.g., an electron transport layer, an electron injection layer, or a hole blocking layer) may include a material known for an organic electroluminescent device. In one embodiment, the electron auxiliary layer may include, but is not limited to, the following compounds or a combination thereof:

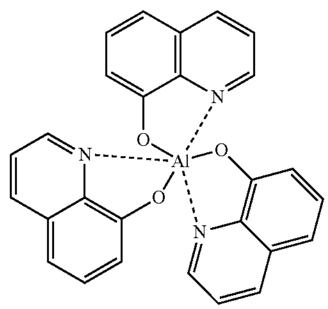

Alq3

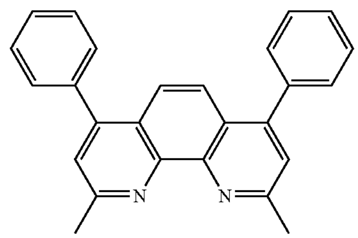

BCP

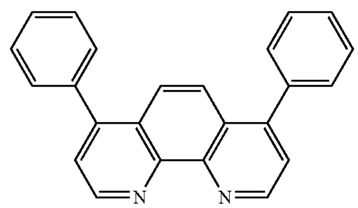

BPhen

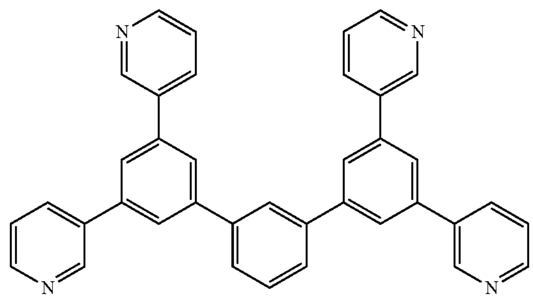

BmPyPB

-continued

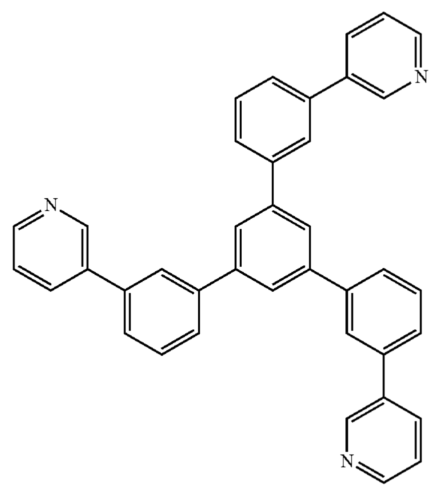

TmPyPB

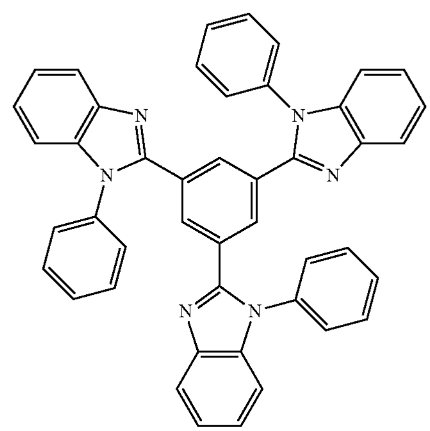

TPBi

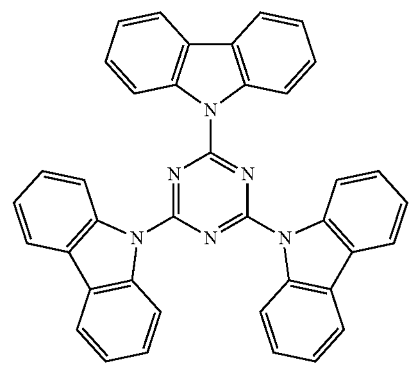

TRZ2

-continued

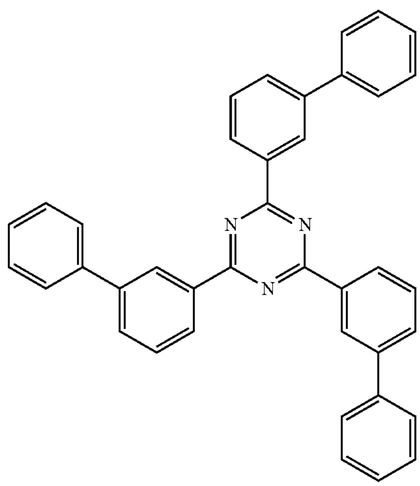

T2T

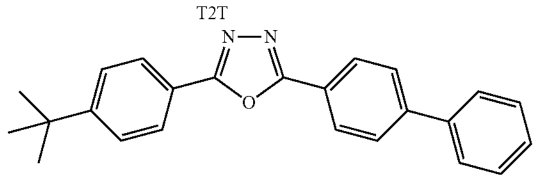

PBD

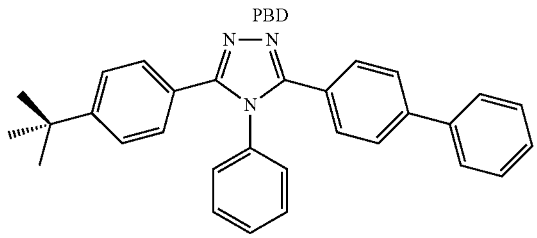

TAZ

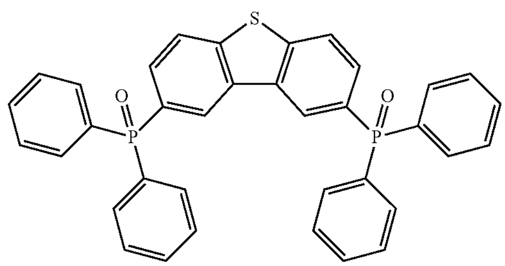

PO15

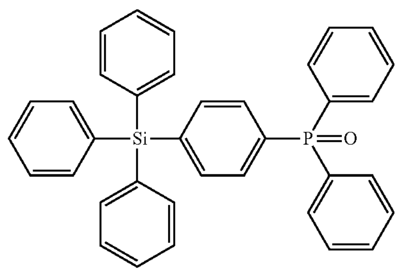

TSPO1

-continued

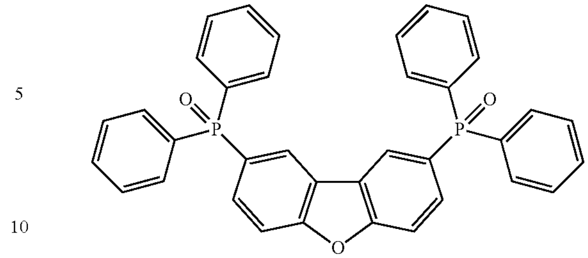

DBFPO

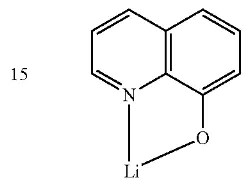

LiQ

A thickness of the hole auxiliary layer (e.g., a hole transport layer, a hole injection layer, an electron blocking layer, or a combination thereof) is not particularly limited and may be appropriately selected. The thickness of the hole transport layer, the hole injection layer, or a combination thereof may be in range of from about 10 angstrom to about 10000 angstrom, from about 100 angstrom to about 5000 angstrom, from about 300 angstrom to about 3000 angstrom, from about 400 angstrom to about 2000 angstrom, from about 500 angstrom to about 1000 angstrom, or a combination thereof.

A thickness of the electron auxiliary layer (e.g., an electron transport layer, an electron injection layer, a hole blocking layer, or a combination thereof) is not particularly limited and may be appropriately selected. The thickness of the electron transport layer, the electron injection layer, or a combination thereof may be from about 10 angstrom to about 10000 angstrom, from about 100 angstrom to about 5000 angstrom, from about 300 angstrom to about 3000 angstrom, from about 400 angstrom to about 2000 angstrom, from about 500 angstrom to about 1000 angstrom, or a combination thereof.

The light emitting panel may further include a green light emitting unit. See, FIG. 8B. In the light emitting panel of an embodiment, the light emitting device may have a tandem structure as described herein, where the green light emitting unit and the blue light emitting unit may be stacked. See, FIG. 6 and FIG. 7. In the green light emitting unit, the green light emitting organic layer may include a green light emitting material and optionally a host material. Details of the host material may be the same as described herein for the host. The green light emitting material may include a phosphorescent dopant. The phosphorescent dopant may include an organometallic compound including iridium (Ir), an organometallic compound including platinum (Pt), or an organometallic compound including osmium (Os). The phosphorescent dopant capable of emitting green light may select compounds known in the art.

In an embodiment, the phosphorescent dopant may include an organic metal compound having a square-planar coordination structure including a metal M, for example, as set forth herein. In an embodiment, the phosphorescent dopant may include a substituted or unsubstituted $C_5$-$C_{30}$ carbocyclic group, a substituted or unsubstituted $C_1$-$C_{30}$ heterocyclic group, a substituted or unsubstituted non-cyclic group, or a combination thereof. The substituted or unsubstituted $C_5$-$C_{30}$ carbocyclic group or the substituted or unsubstituted $C_1$-$C_{30}$ heterocyclic group may be a 6-membered ring, a condensed ring in which two or more 6-membered rings are condensed each other, a condensed ring in which at least one 6-membered ring and one 5-membered ring are condensed each other, or a combination thereof. In an embodiment, the 6-membered ring may include a cyclohexane group, a cyclohexene group, an adamantane group, a norbornane group, a norbornene group, a benzene group, a pyridine group, a pyrimidine group, a pyrazine group, a pyridazine group, a triazine group, or a combination thereof. The 5-membered ring may include a cyclopentane group, a cyclopentene group, a cyclopentadiene group, a furan group, a thiophene group, a silole group, a pyrrole group, a pyrazole group, an imidazole group, a triazole group, an oxazole group, an isoxazole group, a thiazole group, an isothiazole group, an oxadiazole group, a thiadiazole group, or a combination thereof.

The dopant may include a metal M (e.g., as described herein) and an organic ligand, and the metal M and the organic ligand may form one, two, or three cyclometallated ring(s). The dopant may include a metal M and a four-coordinate organic ligand that forms three or four cyclometallated ring(s). The four-coordinate organic ligand may include a benzimidazole group, a benzene group, a pyridine group, an imidazole group, or a combination thereof, but is not limited thereto.

The light emitting elements 180 in each of the sub-pixels $PX_1$, $PX_2$, and $PX_3$ may be the same or different from each other. The light emitting elements 180 in each of the sub-pixels $PX_1$, $PX_2$, and $PX_3$ may emit light of the same emission spectrum, for example, each may emit light of a blue emission spectrum; and optionally light of a green emission spectrum. The light emitting elements 180 in each of the sub-pixels $PX_1$, $PX_2$, and $PX_3$ may be separated by a pixel defining layer.

Referring to FIG. 6, the light emitting device 180 may have a tandem structure, and may include a first electrode 181 and a second electrode 182 facing each other; a first light emitting layer 183*a* and a second light emitting layer 183*b* disposed between the first electrode 181 and the second electrode 182; a charge generation layer 186 disposed between the first light emitting layer 183*a* and the second light emitting layer 183*b*, and optionally, auxiliary layer 184 disposed between the first electrode 181 and the first light emitting layer 183*a* and/or auxiliary layer 185 disposed between the second electrode 182 and the second light emitting layer 183*b*. The first electrode 181, the second electrode 182, and the auxiliary layers 184 and 185 may be similar to those described above. The first light emitting layer 183*a* and the second light emitting layer 183*b* may emit light having the same or different emission spectrums or a different maximum emission wavelength. In an embodiment, the first light emitting layer 183*a* may emit light of a blue light spectrum and the second light emitting layer 183*b* may emit light of a green light spectrum. The charge generation layer 186 may inject electric charges into the first light emitting layer 183*a* and/or the second light emitting layer 183*b*, and may control a charge balance between the first light emitting layer 183*a* and the second light emitting layer 183*b*. The charge generation layer 186 may include, for example, an n-type layer and a p-type layer, and may include, for example, an electron transport material and/or a hole transport material including an n-type dopant and/or a p-type dopant. The charge generation layer 186 may be one layer or two or more layers.

Referring to FIG. 7, the light emitting device 180 (e.g., having a tandem structure) may include a first electrode 181 and a second electrode 182 facing each other; a first light emitting layer 183*a*, a second light emitting layer 183*b*, and a third light emitting layer 183*c* disposed between the first electrode 181 and the second electrode 182; a first charge generation layer 186*a* disposed between the first light emitting layer 183*a* and the second light emitting layer 183*b*; a second charge generation layer 186*b* disposed between the second light emitting layer 183*b* and the third light emitting layer 183*c*; and optionally, auxiliary layers 184 disposed between the first electrode 181 and the first light emitting layer 183*a* and/or auxiliary layer 185 disposed between the second electrode 182 and the third light emitting layer 183*c*. The first electrode 181, the second electrode 182, and the auxiliary layers 184 and 185 may be similar to those described above. The first light emitting layer 183*a*, the second light emitting layer 183*b*, and the third light emitting layer 183*c* may emit light of the same or different emission spectrum. In an embodiment, the first light emitting layer 183*a* and the third light emitting layer 183*c* may emit light of a blue light spectrum and the second light emitting layer 183*b* may emit light of a green light spectrum. In an embodiment, the first light emitting layer 183*a* and the third light emitting layer 183*c* may emit light of a green light spectrum and the second light emitting layer 183*b* may emit light of a blue light spectrum.

The first charge generation layer 186*a* may inject electric charges into the first light emitting layer 183*a* and/or the second light emitting layer 183*b*, and may control charge balances between the first light emitting layer 183*a* and the second light emitting layer 183*b*. The second charge generation layer 186*b* may inject electric charges into the second light emitting layer 183*b* and/or the third light emitting layer 183*c*, and may control charge balances between the second light emitting layer 183*b* and the third light emitting layer 183*c*. Each of the first and second charge generation layers 186*a* and 186*b* may be one layer or two or more layers.

In an embodiment, the display panel includes a color conversion panel 200. See, FIG. 4. The color conversion panel 200 may be provided with incident light from the light emitting panel 100 and convert the spectrum of incident light into an emission spectrum different from that of the incident light. The emitted light from the color conversion panel 200 may then be directed out from the device to an observer (not shown). The color conversion panel may include a color conversion layer including a color conversion region, and optionally a partition wall defining each color conversion region of the color conversion layer. The color conversion region may include a first region corresponding to a green pixel and a second region corresponding to a red pixel. See, FIG. 8A and FIG. 8B)

Referring to FIG. 4, a color filter layer 230 may be positioned in a direction in which light passing through the color conversion layer 270 may be emitted. The color filter layer 230 may include color filters 230*a*, 230*b*, and 230*c* in each sub-pixel $PX_1$, $PX_2$, and $PX_3$ and selectively transmit light of different wavelength spectra. The color filters 230*a*, 230*b*, and 230*c* may selectively transmit light of each same wavelength spectrum as the color displayed in each sub-pixel $PX_1$, $PX_2$, and $PX_3$ and also, selectively transmit light of the emission spectrum converted in each region of the color conversion layer 270.

In an embodiment, the first sub-pixel $PX_1$, the second sub-pixel $PX_2$, and the third sub-pixel $PX_3$ respectively may display green, red, and blue, and when light of each green emission spectrum, red emission spectrum, and blue emission spectrum may be emitted from the first color conversion region 270*a*, the second color conversion region 270*b*, and the light transmitting region 270*c*, the first color filter 230*a* overlapped with the first color conversion region 270*a* may be a green filter, the second color filter 230*b* overlapped with the second color conversion region 270*b* may be a red filter, and the third color filter 230*c* overlapped with the light transmitting region 270*c* may be a blue filter. The first color filter 230*a*, the second color filter 230*b*, or the third color filter 230*c* may include a pigment and/or a dye to selectively transmit light of a green wavelength spectrum, a red wavelength spectrum, or a blue wavelength spectrum but absorb and/or reflect light of the other wavelength spectra.

The color filter layer 230 may more precisely filter light emitted from the color conversion layer 270, and thus, enhance color purity of the light emitted toward the upper substrate 210. For example, the first color filter 230*a* overlapped with the first color conversion region 270*a* may block (or reduce transmission of) light not converted by the first quantum dot 271*a* of the first color conversion region 270*a* and transmit the converted light to enhance color purity of light, e.g., light with a predominantly green emission spectrum. For example, the second color filter 230*b* overlapped with the second color conversion region 270*b* may block (or reduce transmission of) light not converted by the second quantum dot 271*b* of the second color conversion region 270*b* and transmit the converted light to enhance color purity of light, e.g., light with a predominantly red emission spectrum. For example, the third color filter 230*c* overlapped with the light transmitting region 270*c* may be configured to block (or reduce transmission of) light other than light of the blue emission spectrum and, for example, enhance color purity of light with a predominantly blue emission spectrum. For example, at least some of the first, second, and third color filters 230*a*, 230*b*, and 230*c* may be omitted, for example, the third color filter 230*c* overlapped with the light transmitting region 270*c* may be omitted. In an embodiment, the incident light emitted from the light emitting panel may include green light, and the third color filter may be a blue filter that is configured to block (or reduce transmission of) green light.

The light blocking pattern 220 may define each sub-pixel $PX_1$, $PX_2$, and $PX_3$ and be between the neighboring sub-pixels $PX_1$, $PX_2$, and $PX_3$. The light blocking pattern 220 may be, for example, a black matrix. The light blocking pattern 220 may be overlapped with the edges of the neighboring color filters 230*a*, 230*b*, and 230*c*.

The planarization layer 240 may be disposed between the color filter layer 230 and the color conversion layer 270 and may reduce or eliminate a step difference caused by the color filter layer 230. The planarization layer 240 may include an organic material, an inorganic material, an organic-inorganic material, or a combination thereof. The planarization layer 240 may include, for example, an oxide, a nitride, and/or an oxynitride, for example, silicon oxide, silicon nitride, silicon oxynitride, or a combination thereof, but is not limited thereto. The planarization layer 240 may be one layer or two or more layers and may cover the entire surface of the upper substrate 210.

The encapsulation layer 290 may cover the color conversion layer 270 and the bank 250, and may include a glass plate, a metal thin film, an organic film, an inorganic film, an organic-inorganic film, or a combination thereof. The organic film may include, for example, an acrylic resin, a (meth)acrylic resin, polyisoprene, a vinyl resin, an epoxy resin, a urethane resin, a cellulose resin, a perylene resin, and/or a combination thereof, but is not limited thereto. The inorganic film may include, for example, a lithium fluoride, an oxide, a nitride, and/or an oxynitride, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, or a combination thereof, but is not limited thereto. The organic-inorganic film may include, for example, polyorganosiloxane, but is not limited thereto. The encapsulation layer 290 may be one, two, or more layers.

A light transmitting layer 300 may be between the light emitting panel 100 and the color conversion panel 200. The light transmitting layer 300 may include, for example, a filling material. The light transmitting layer 300 may include an organic material, an inorganic material, an organic-inorganic material, or a combination thereof, and may include, for example, an epoxy resin, a silicone compound, a polyorganosiloxane, or a combination thereof.

In the color conversion zone, the third region may emit or pass at least a portion of incident light (e.g., blue light). The third area 270*c* may be a light-transmitting region. The third region (or the light transmitting region) may include a matrix 273*c* and titanium oxide particles 272*c* and/or blue light-emitting semiconductor nanoparticles (not shown) dispersed in the matrix, if desired. The third region may include a third composite including the matrix and titanium oxide particles and/or a blue light emitting semiconductor nanoparticle.

In the color conversion region, a first region 270*a* corresponding to a green pixel includes a matrix (e.g., a polymer matrix) 273*a*, and a first semiconductor nanoparticle 271*a* dispersed in the matrix, and optionally a titanium oxide particle 272*a*. The first region may include a first composite including the matrix and the first semiconductor nanoparticles described herein. In an embodiment, the first region 270*a* receives the incident light and converts the light spectrum of the incident light into a green light spectrum. The first region(s) 270*a* may be arranged to correspond to a green pixel. The first region 270*a* may include the first (luminescent) composite. In an embodiment, the first composite may include a matrix 273*a* (e.g. a polymer matrix) and a plurality of luminescent nanostructures 271*a* (e.g., first semiconductor nanoparticles or quantum dots) dispersed in the matrix 273*a*. In an embodiment, the first semiconductor nanoparticle 271*a* may include silver, a Group 13 metal (e.g., indium and gallium), and a chalcogen element (e.g., sulfur) and may be configured to emit green light. In an embodiment, the first semiconductor nanoparticle 271*a* may include a Group I-III-VI compound including silver, indium, gallium, and sulfur. The green light has a peak emission wavelength in a range of greater than or equal to about 500 nm and less than or equal to about 550 nm and optionally a full width at half maximum of greater than or equal to about 5 nm and less than or equal to about 40 nm.

In an embodiment, the first semiconductor nanoparticle may not include cadmium. In an embodiment, the first semiconductor nanoparticle may not include mercury, lead, or a combination thereof.

In the first semiconductor nanoparticle of an embodiment, the Group 13 metal may include indium and gallium and the chalcogen element may include sulfur, selenium, or a combination thereof. The first semiconductor nanoparticle may have a charge balance value as defined by Equation 1 that is greater than or equal to about 0.8 to less than or equal to about 1.5:

$$\text{charge balance value}=\{[Ag]+3[\text{Group 13 metal}]\}/2[CHA] \quad \text{Equation 1}$$

wherein, in Equation 1,

[Ag], [Group 13 metal], and [CHA] are molar amounts of the silver, the Group 13 metal (e.g., indium, gallium, and a combination thereof), and the chalcogen element (e.g., sulfur, selenium, or a combination thereof), respectively, in the first semiconductor nanoparticle.

In an embodiment, the Group 13 metal may include indium and gallium, and the chalcogen element may include sulfur, and the charge balance value may be represented by the following Equation 1A:

$$\text{charge balance value}=\{[Ag]+3([In]+[Ga])\}/2[S] \quad \text{Equation 1A}$$

wherein, in Equation 1A, [Ag], [In], [Ga], and [S] are molar amounts of silver, indium, gallium, and sulfur, respectively, in the first semiconductor nanoparticle.

In an embodiment, the first semiconductor nanoparticle may further include copper, and in this case, the charge balance value may be calculated by considering the contents of silver and copper together. In some embodiments, the first semiconductor nanoparticle or a first semiconductor nanocrystal described herein may not include copper.

The present inventors have found that by having the structure/composition described herein, the first semiconductor nanoparticle may emit light of a desired wavelength and may achieve an improved optical property (e.g., a narrow full width at half maximum, an increased quantum yield, and/or a relatively high level of a blue light absorbance) and may exhibit a reduced or suppressed emission (e.g., trap emission) in an unwanted wavelength range. In addition, the present inventors have found that these first semiconductor nanoparticle may absorb blue light provided from the light emitting panel containing the blue light emitting unit described herein with improved efficiency to achieve remarkably improved luminance as a whole display panel.

The present inventors have found that it would be difficult for the semiconductor nanoparticle including a Group 13 metal and a chalcogen element along with silver (Ag) to achieve desired luminous properties (for example, both of a narrower full width at half maximum and a higher quantum yield) simultaneously. In addition, the present inventors have found that most of the semiconductor nanoparticles including the Group 13 metal and the chalcogen element along with the silver prepared according to the prior art may provide a substantial amount of trap emission together with a band-edge emission, and thus, the emission (e.g., the trap emission or a defect emission) at an unwanted wavelength, for example, a wavelength significantly shifted to a longer wavelength than the maximum emission wavelength based on band-edge emission (hereinafter referred to as a trap emission wavelength) may account for a considerable portion of the emission in the light emitted from the semiconductor nanoparticle.

Without wishing to be bound by any theory, in the first semiconductor nanoparticle of one or more embodiments, the charge balance value (and in some embodiment, together with the molar ratio(s) between the components as described herein) may provide a desired semiconductor nanoparticle with considerably reduced or suppressed amount of unwanted by-products (e.g., gallium oxide), and the first semiconductor nanoparticle including the same may exhibit a desired composition. The present inventors have found that, in the preparation of the semiconductor nanoparticle including the Group 13 metal and the chalcogen element together with silver (Ag), a side reaction (e.g., oxidation) of precursors may not be controlled well, and thus, even in the case where mole amounts of the individual elements in a given semiconductor nanoparticle may be controlled within a desired range with a tolerable deviation, the properties exhibited by the given first semiconductor nanoparticle or a composite including the same may significantly vary depending on the charge balance value of the first semiconductor nanoparticle.

In an embodiments, the charge balance value according to Equation 1 may be less than or equal to about 1.5, less than or equal to about 1.45, less than or equal to about 1.4, less than or equal to about 1.35, less than or equal to about 1.34, less than or equal to about 1.33, less than or equal to about 1.32, less than or equal to about 1.31, less than or equal to about 1.3, less than or equal to about 1.29, less than or equal to about 1.28, less than or equal to about 1.27, less than or equal to about 1.26, less than or equal to about 1.25, less than or equal to about 1.24, less than or equal to about 1.23, less than or equal to about 1.22, less than or equal to about 1.21, less than or equal to about 1.2, or less than or equal to about 1.1.

The charge balance value according to Equation 1 may be greater than or equal to about 0.81, greater than or equal to about 0.85, greater than or equal to about 0.9, greater than or equal to about 0.95, greater than or equal to about 0.97, greater than or equal to about 0.99, greater than or equal to about 1, greater than or equal to about 1.01, greater than or equal to about 1.02, greater than or equal to about 1.03, greater than or equal to about 1.04, greater than or equal to about 1.05, greater than or equal to about 1.06, greater than or equal to about 1.07, greater than or equal to about 1.08, greater than or equal to about 1.09, greater than or equal to about 1.1, greater than or equal to about 1.11, greater than or equal to about 1.12, greater than or equal to about 1.13, greater than or equal to about 1.14, greater than or equal to about 1.15, greater than or equal to about 1.16, greater than or equal to about 1.17, greater than or equal to about 1.18, greater than or equal to about 1.19, greater than or equal to about 1.2, greater than or equal to about 1.21, greater than or equal to about 1.22, greater than or equal to about 1.23, greater than or equal to about 1.24, or greater than or equal to about 1.25.

In an embodiment, a mole ratio may be a mole ratio for the first semiconductor nanoparticle including indium and gallium as the Group 13 metal; and sulfur as the chalcogen element.

In the first semiconductor nanoparticle of one or more embodiments, a mole ratio of sulfur to a sum of silver, indium, and gallium, [S:(Ag+In+Ga)], may be greater than or equal to about 0.65:1, greater than or equal to about 0.68:1, greater than or equal to about 0.7:1, greater than or equal to about 0.75:1, greater than or equal to about 0.8:1, greater than or equal to about 0.85:1, greater than or equal to about 0.9:1, greater than or equal to about 0.95:1, greater than or equal to about 0.99:1, or greater than or equal to about 1.03:1. In the first semiconductor nanoparticle, the mole ratio of sulfur to a sum of silver, indium, and gallium, [S:(Ag+In+Ga)], may be less than or equal to about 1.35:1, less than or equal to about 1.33:1, less than or equal to about 1.3:1, less than or equal to about 1.25:1, less than or equal to about 1.2:1, less than or equal to about 1.17:1, less than or equal to about 1.15:1, less than or equal to about 1.09:1, less than or equal to about 1.08:1, less than or equal to about 1.07:1, less than or equal to about 1.06:1, less than or equal to about 1.05:1, less than or equal to about 1.04:1, less than or equal to about 1.03:1, less than or equal to about 1.02:1, less than or equal to about 1.01:1, less than or equal to about 1:1, or less than or equal to about 0.99:1.

In the first semiconductor nanoparticle of one or more embodiments, a mole ratio of a sum of indium and gallium to silver, [(In+Ga):Ag], may be greater than or equal to about 1.75:1, greater than or equal to about 1.8:1, greater than or equal to about 1.85:1, greater than or equal to about 1.9:1, greater than or equal to about 2:1, or greater than or equal to about 2.1:1. The mole ratio of a sum of indium and gallium to silver, [(In+Ga):Ag], may be less than or equal to about 3.7:1, less than or equal to about 3.5:1, less than or equal to about 3.2:1, less than or equal to about 3:1, less than or equal to about 2.8:1, less than or equal to about 2.6:1, less than or equal to about 2.4:1, or less than or equal to about 2.3:1.

In the first semiconductor nanoparticle of one or more embodiments, a mole ratio of gallium to a sum of indium and gallium, [Ga:(Ga+In)], may be greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.84:1, greater than or equal to about 0.85:1, greater than or equal to about 0.86:1, greater than or equal to about 0.87:1, or greater than or equal to about 0.88:1. The mole ratio of gallium to a sum of indium and gallium, [Ga:(Ga+In)], may be less than or equal to about 0.99:1, less than or equal to about 0.98:1, less than or equal to about 0.97:1, less than or equal to about 0.96:1, less than or equal to about 0.95:1, less than or equal to about 0.94:1, less than or equal to about 0.93:1, less than or equal to about 0.92:1, less than or equal to about 0.91:1, less than or equal to about 0.9:1, less than or equal to about 0.89:1, less than or equal to about 0.88:1, or less than or equal to about 0.87:1.

In the first semiconductor nanoparticle, a mole ratio of gallium to sulfur (Ga:S) may be greater than or equal to about 0.1:1, greater than or equal to about 0.15:1, greater than or equal to about 0.2:1, greater than or equal to about 0.25:1, greater than or equal to about 0.3:1, greater than or equal to about 0.47:1, greater than or equal to about 0.49:1, greater than or equal to about 0.5:1, greater than or equal to about 0.52:1, greater than or equal to about 0.53:1, greater than or equal to about 0.55:1, greater than or equal to about 0.56:1, greater than or equal to about 0.58:1, greater than or equal to about 0.6:1, or greater than or equal to about 0.62:1. The mole ratio of gallium to sulfur (Ga:S) may be less than or equal to about 1:1, less than or equal to about 0.9:1, less than or equal to about 0.8:1, less than or equal to about 0.7:1, less than or equal to about 0.64:1, less than or equal to about 0.62:1, less than or equal to about 0.58:1, or less than or equal to about 0.55:1.

In the first semiconductor nanoparticle, a mole ratio of silver to sulfur (Ag:S) may be greater than or equal to about 0.1:1, greater than or equal to about 0.15:1, greater than or equal to about 0.2:1, greater than or equal to about 0.25:1, greater than or equal to about 0.3:1, greater than or equal to about 0.31:1, greater than or equal to about 0.32:1, greater than or equal to about 0.33:1, greater than or equal to about 0.35:1, greater than or equal to about 0.38:1, greater than or equal to about 0.4:1, or greater than or equal to about 0.45:1. The mole ratio of silver to sulfur (Ag:S) may be less than or equal to about 1:1, less than or equal to about 0.6:1, less than or equal to about 0.5:1, less than or equal to about 0.4:1, less than or equal to about 0.38:1, or less than or equal to about 0.36:1.

In the first semiconductor nanoparticle of one or more embodiments, a mole ratio of indium to sulfur (In:S) may be greater than or equal to about 0.01:1, greater than or equal to about 0.03:1, greater than or equal to about 0.05:1, greater than or equal to about 0.08:1, greater than or equal to about 0.09:1, greater than or equal to about 0.1:1, greater than or equal to about 0.11:1, or greater than or equal to about 0.14:1. The mole ratio of indium to sulfur (In:S) may be less than or equal to about 0.5:1, less than or equal to about 0.4:1, less than or equal to about 0.3:1, less than or equal to about 0.25:1, less than or equal to about 0.15:1, less than or equal to about 0.13:1, less than or equal to about 0.12:1, or less than or equal to about 0.11:1.

In the first semiconductor nanoparticle of one or more embodiments, a mole ratio of a sum of indium and gallium to sulfur, [(In+Ga):S], may be greater than or equal to about 0.64:1, greater than or equal to about 0.65:1, greater than or equal to about 0.66:1, greater than or equal to about 0.68:1, or greater than or equal to about 0.73:1. The mole ratio of the sum of indium and gallium to sulfur [(In+Ga):S] may be less than or equal to about 1.16:1, less than or equal to about 1.051:1, less than or equal to about 1:1, or less than or equal to about 0.73:1.

In the first semiconductor nanoparticle, a mole ratio of silver to a sum of silver, indium, and gallium, [Ag:(Ag+In+Ga)], may be greater than or equal to about 0.31:1, greater than or equal to about 0.32:1, greater than or equal to about 0.33:1, or greater than or equal to about 0.34:1. The mole ratio of silver to a sum of silver, indium, and gallium, [Ag:(Ag+In+Ga)], may be less than or equal to about 0.45:1, less than or equal to about 0.4:1, less than or equal to about 0.39:1, less than or equal to about 0.385:1, less than or equal to about 0.37:1, less than or equal to about 0.36:1, or less than or equal to about 0.34:1.

In an embodiment, the first semiconductor nanoparticle may not include lithium. In an embodiment, the first semiconductor nanoparticle may not include an alkali metal such as sodium, potassium, or the like.

In the first semiconductor nanoparticle, an amount of the indium may have a concentration gradient varying (decreasing) in a radial direction (e.g., from its center to its surface). In the first semiconductor nanoparticle of one or more embodiments, an indium amount (or concentration) in a portion adjacent (proximate) to a surface (e.g., an outermost layer or a shell layer) of the first semiconductor nanoparticle may be less than an indium amount (or concentration) of an inner portion or a core of the first semiconductor nanoparticle. In an embodiment, a portion proximate (or adjacent) to a surface of the first semiconductor nanoparticle may not include indium.

In an embodiment, the first semiconductor nanoparticle may include a first semiconductor nanocrystal and a second semiconductor nanocrystal. The second semiconductor nanocrystal may be disposed on at least a portion of the first semiconductor nanocrystal. The second semiconductor nanocrystal may surround the first semiconductor nanocrystal. The first semiconductor nanocrystal may have a different composition from the second semiconductor nanocrystal. The first semiconductor nanoparticle may further include a semiconductor nanocrystal layer or an inorganic layer (can be referred to as "an inorganic layer", for example, including a fifth semiconductor nanocrystal) including a zinc chalcogenide, for example as an outermost layer thereof. The zinc chalcogenide may include zinc; and selenium, sulfur, or a combination thereof. The zinc chalcogenide may include a zinc sulfide (e.g., ZnS), a zinc selenide (e.g., ZnSe), a zinc sulfide selenide (e.g. ZnSeS), or a combination thereof. A bandgap energy of the second semiconductor nanocrystal may be less than a bandgap energy of the fifth semiconductor nanocrystal.

The second semiconductor nanocrystal may be disposed between the first semiconductor nanocrystal and the inorganic layer.

A size (or average size, hereinafter, can be simply referred to as "size") of the first semiconductor nanocrystal may be greater than or equal to about 0.5 nm, greater than or equal to about 1 nm, greater than or equal to about 1.5 nm, greater than or equal to about 1.7 nm, greater than or equal to about 1.9 nm, greater than or equal to about 2 nm, greater than or equal to about 2.1 nm, greater than or equal to about 2.3 nm, greater than or equal to about 2.5 nm, greater than or equal to about 2.7 nm, greater than or equal to about 2.9 nm, greater than or equal to about 3 nm, greater than or equal to about 3.1 nm, greater than or equal to about 3.3 nm, greater than or equal to about 3.5 nm, greater than or equal to about 3.7 nm, or greater than or equal to about 3.9 nm. The size of the first semiconductor nanocrystal may be less than or equal to about 5 nm, less than or equal to about 4.5 nm, less than or equal to about 4 nm, less than or equal to about 3.5 nm, less than or equal to about 3 nm, less than or equal to about 2.5 nm, less than or equal to about 2 nm, or less than or equal to about 1.5 nm.

A thickness (or an average thickness, hereinafter, simply referred to as "thickness") of the second semiconductor nanocrystal may be greater than or equal to about 0.1 nm, greater than or equal to about 0.3 nm, greater than or equal to about 0.5 nm, greater than or equal to about 0.7 nm, greater than or equal to about 1 nm, greater than or equal to about 1.5 nm, greater than or equal to about 1.7 nm, greater than or equal to about 1.9 nm, greater than or equal to about 2 nm, greater than or equal to about 2.1 nm, greater than or equal to about 2.3 nm, greater than or equal to about 2.5 nm, greater than or equal to about 2.7 nm, greater than or equal to about 2.9 nm, greater than or equal to about 3 nm, greater than or equal to about 3.1 nm, greater than or equal to about 3.3 nm, greater than or equal to about 3.5 nm, greater than or equal to about 3.7 nm, or greater than or equal to about 3.9 nm. The thickness of the second semiconductor nanocrystal may be less than or equal to about 5 nm, less than or equal to about 4.5 nm, less than or equal to about 4 nm, less than or equal to about 3.5 nm, less than or equal to about 3 nm, less than or equal to about 2.5 nm, less than or equal to about 2 nm, or less than or equal to about 1.5 nm.

A thickness of the inorganic layer may be appropriately selected. The thickness of the inorganic layer may be less than or equal to about 5 nm, less than or equal to about 4 nm, less than or equal to about 3.5 nm, less than or equal to about 3 nm, less than or equal to about 2.5 nm, less than or equal to about 2 nm, less than or equal to about 1.5 nm, less than or equal to about 1 nm, or less than or equal to about 0.8 nm. The thickness of the inorganic layer may be greater than or equal to about 0.1 nm, greater than or equal to about 0.3 nm, greater than or equal to about 0.5 nm, or greater than or equal to about 0.7 nm. The thickness of the inorganic layer may be about 0.1 nm to about 5 nm, about 0.3 nm to about 4 nm, about 0.5 nm to about 3.5 nm, about 0.7 nm to about 3 nm, about 0.9 nm to about 2.5 nm, about 1 nm to about 2 nm, about 1.5 nm to about 1.7 nm, or a combination thereof.

The thickness of the inorganic layer may be about 0.01 times or more, about 0.03 times or more, about 0.05 times or more, about 0.07 times or more, about 0.1 times or more, about 0.12 times or more, about 0.15 times or more, about 0.17 times or more, about 0.2 times or more, about 0.23 times or more, about 0.25 times or more, about 0.27 times or more, about 0.3 times or more, about 0.32 times or more, about 0.35 times or more, about 0.37 times or more, about 0.39 times or more, about 0.4 times or more, or about 0.45 times or more of the (average) radius of the first semiconductor nanoparticle. The thickness of the inorganic layer may be about 0.9 times or less, about 0.8 times or less, about 0.6 times or less, about 0.5 times or less, about 0.4 times or less, or about 0.35 times or less of the (average) radius of the first semiconductor nanoparticle.

The first semiconductor nanocrystal may include silver, a Group 13 metal (e.g., indium, gallium, or a combination thereof), and a chalcogen element (e.g., sulfur, and optionally selenium). The first semiconductor nanocrystal may include a quaternary alloy semiconductor material based on a Group 11-13-16 compound including silver (Ag), indium, gallium, and sulfur. The first semiconductor nanocrystal may include silver indium gallium sulfide, e.g., $Ag(In_xGa_{1-x})S_2$ (x is greater than 0 and less than 1). The mole ratios between the components in the first semiconductor nanocrystal may be adjusted so that the final semiconductor nanoparticle may have a desired composition and an optical property (e.g., a maximum emission wavelength).

The second semiconductor nanocrystal may include a Group 13 metal (indium, gallium, or a combination thereof), and a chalcogen element (sulfur, and optionally selenium). The second semiconductor nanocrystal may further include silver (Ag). The second semiconductor nanocrystal may include silver, gallium, and sulfur. The second semiconductor nanocrystal may include a ternary alloy semiconductor material including silver, gallium, and sulfur. The second semiconductor nanocrystal may have a different composition from that of the first semiconductor nanocrystal. The second semiconductor nanocrystal may include a Group 13-16 compound, a Group 11-13-16 compound, or a combination thereof. The Group 13-16 compound may include gallium sulfide, gallium selenide, indium sulfide, indium selenide, indium gallium sulfide, indium gallium selenide, indium gallium selenide sulfide, or a combination thereof. An energy bandgap of the second semiconductor nanocrystal may be different from that of the first semiconductor nanocrystal. The second semiconductor nanocrystal may cover at least a portion of the first semiconductor nanocrystal. An energy bandgap of the second semiconductor nanocrystal may be greater than an energy bandgap of the first semiconductor nanocrystal. An energy bandgap of the second semiconductor nanocrystal may be less than an energy bandgap of the first semiconductor nanocrystal. The molar ratios between each component in the second semiconductor nanocrystal may be adjusted so that the final semiconductor nanoparticle exhibits a desired composition and optical properties.

The second semiconductor nanocrystal or the first semiconductor nanocrystal may exhibit crystallinity when confirmed by, for example, an appropriate analytical means (e.g., an X-ray diffraction analysis, an electron microscope analysis such as high angle annular dark field (HAADF)-scanning transmission electron microscope (STEM) analysis, or the like). In an embodiment, the first semiconductor nanocrystal or the second semiconductor nanocrystal may be, for example, amorphous when confirmed by an appropriate analysis means.

A size (or an average size, hereinafter, simply referred to as "size") of the first semiconductor nanoparticle may be greater than or equal to about 1 nm, greater than or equal to about 1.5 nm, greater than or equal to about 2 nm, greater than or equal to about 2.5 nm, greater than or equal to about 3 nm, greater than or equal to about 3.5 nm, greater than or equal to about 4 nm, greater than or equal to about 4.5 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, greater than or equal to about 10 nm, or greater than or equal to about 10.5 nm. The size of the first semiconductor nanoparticle may be less than or equal to about 50 nm, less than or equal to about 48 nm, less than or equal to about 46 nm, less than or equal to about 44 nm, less than or equal to about 42 nm, less than or equal to about 40 nm, less than or equal to about 35 nm, less than or equal to about 30 nm, less than or equal to about 25 nm, less than or equal to about 20 nm, less than or equal to about 18 nm, less than or equal to about 16 nm, less than or equal to about 14 nm, less than or equal to about 12 nm, less than or equal to about 11 nm, less than or equal to about 10 nm, less than or equal to about 8 nm, less than or equal to about 6 nm, or less than or equal to about 4 nm.

As used herein, the size of the semiconductor nanoparticle may be a particle diameter. The size of the semiconductor nanoparticle may be an equivalent diameter thereof that is obtained by a calculation involving a conversion of a two-dimensional area of an electron microscopy image (e.g., a transmission electron microscopy image) of a given particle into a circle. In an embodiment, the size may be a value (e.g., a nominal particle size) calculated from a composition and an emission wavelength of the semiconductor nanoparticle.

The first semiconductor nanoparticle of one or more embodiments may be configured to emit a desired light (e.g., a first light) while exhibiting improved properties.

A maximum emission wavelength of the first light or a maximum emission wavelength of the first semiconductor nanoparticle may be greater than or equal to about 500 nm, greater than or equal to about 505 nm, greater than or equal to about 510 nm, greater than or equal to about 515 nm, greater than or equal to about 520 nm, greater than or equal to about 525 nm, greater than or equal to about 530 nm, greater than or equal to about 535 nm, greater than or equal to about 540 nm, greater than or equal to about 545 nm, greater than or equal to about 550 nm, greater than or equal to about 555 nm, greater than or equal to about 560 nm, greater than or equal to about 565 nm, greater than or equal to about 570 nm, greater than or equal to about 575 nm, greater than or equal to about 580 nm, greater than or equal to about 585 nm, or greater than or equal to about 590 nm. The maximum emission wavelength of the first light of the first semiconductor nanoparticle may be less than or equal to about 600 nm, less than or equal to about 595 nm, less than or equal to about 590 nm, less than or equal to about 580 nm, less than or equal to about 575 nm, less than or equal to about 570 nm, less than or equal to about 565 nm, less than or equal to about 560 nm, less than or equal to about 555 nm, less than or equal to about 550 nm, less than or equal to about 545 nm, less than or equal to about 540 nm, less than or equal to about 535 nm, less than or equal to about 530 nm, less than or equal to about 525 nm, less than or equal to about 520 nm, or less than or equal to about 515 nm.

A full width at half maximum (FWHM) of the first light or a FWHM of the first semiconductor nanoparticle may be greater than or equal to about 5 nm, greater than or equal to about 10 nm, greater than or equal to about 15 nm, greater than or equal to about 20 nm, greater than or equal to about 25 nm, or greater than or equal to about 30 nm. The full width at half maximum may be less than or equal to about 70 nm, less than or equal to about 65 nm, less than or equal to about 60 nm, less than or equal to about 55 nm, less than or equal to about 50 nm, less than or equal to about 45 nm, less than or equal to about 40 nm, less than or equal to about 38 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm.

The first semiconductor nanoparticle may exhibit a quantum yield of greater than or equal to about 50%. The quantum yield may be an absolute quantum yield. The quantum yield may be greater than or equal to about 55%, greater than or equal to about 60%, greater than or equal to about 65%, greater than or equal to about 70%, greater than or equal to about 75%, greater than or equal to about 80%, greater than or equal to about 85%, greater than or equal to about 90%, or greater than or equal to about 95%. The quantum yield may be less than or equal to about 100%, less than or equal to about 99.5%, less than or equal to about 99%, less than or equal to about 98%, or less than or equal to about 97%.

The first light may include band-edge emission. In an embodiment, the first light emitted by the first semiconductor nanoparticle may further include or may not include a defect site emission or a trap emission. The band-edge emission may be centered at a higher energy (a lower wavelength) with a smaller offset from the absorption onset energy compared to the trap emission. The band-edge emission may have a relatively narrower wavelength distribution than the trap emission. The band-edge emission may have a normal (e.g., Gaussian) wavelength distribution.

A difference between the band-edge maximum emission wavelength and the trap maximum emission wavelength may be, for example, greater than or equal to about 80 nm, greater than or equal to about 90 nm, or about 100 nm.

In an embodiment, at least about 90% of the emission of the first semiconductor nanoparticle may represent band-edge emission. A percentage of a band-edge emission may be calculated by fitting the Gaussian peaks (e.g., two or more) of the emission spectrum of the semiconductor nanoparticle and comparing an area of the peak closer in energy to the bandgap of the first semiconductor nanoparticle (representing the band-edge emission) with respect to the sum of all peak areas (e.g., the sum of band-edge emission and trap emission).

The percentage of the band-edge emission may be greater than or equal to about 95%, greater than or equal to about 95.5%, greater than or equal to about 96%, greater than or equal to about 96.5%, greater than or equal to about 97%, greater than or equal to about 97.5%, greater than or equal to about 98%, greater than or equal to about 98.5%, greater than or equal to about 99%, or greater than or equal to about 99.5%. The first semiconductor nanoparticle of one or more embodiments may have a band-edge emission percentage of substantially 100%.

In the photoluminescent spectrum of the first semiconductor nanoparticle, a ratio of a tail emission area (e.g., a peak area defined by a peak emission wavelength plus about 70 nm or greater, about 80 nm or greater, about 90 nm or greater, or about 100 nm greater) to a total emission peak area may be less than or equal to about 20%, less than or equal to about 15%, less than or equal to about 12%, less than or equal to about 10%, less than or equal to about 9%, less than or equal to about 8%, less than or equal to about 7%, less than or equal to about 6%, less than or equal to about 5%, less than or equal to about 4%, less than or equal to about 3%, or less than or equal to about 2%.

In the photoluminescent spectrum of the first semiconductor nanoparticle, a relative light emission (e.g., band-edge emission) intensity defined by the following Equation 2 may be greater than about 20, or greater than or equal to about 25:

relative light emission (e.g., band-edge emission) intensity=$A1/A2$ Equation 2 wherein, in Equation 2,

A1 is an intensity at the maximum emission wavelength, and

A2 is a maximum intensity in a tail wavelength range of a peak emission wavelength plus greater than or equal to about 80 nm (for example, greater than or equal to about 85 nm, greater than or equal to about 90 nm, greater than or equal to about 95 nm, greater than or equal to about 100 nm, greater than or equal to about 120 nm, greater than or equal to about 150 nm, greater than or equal to about 180 nm, or up to about 200 nm).

An upper limit of the wavelength range in A2 or the tail emission wavelength range may be a wavelength at which an intensity of the spectrum becomes zero. In an embodiment, the wavelength range may be the maximum emission wavelength plus less than or equal to about 200 nm or less than or equal to about 120 nm but is not limited thereto.

Without wishing to be bound by any theory, in the above equation, A1 may represent the band-edge emission and A2 may be substantially related to the trap emission.

in one or more embodiments, a relative light emission intensity of the first semiconductor nanoparticle may be greater than or equal to about 21, greater than or equal to about 23, greater than or equal to about 25, greater than or equal to about 27, greater than or equal to about 29, greater than or equal to about 31, greater than or equal to about 33, greater than or equal to about 35, greater than or equal to about 37, greater than or equal to about 39, greater than or equal to about 41, greater than or equal to about 43, greater than or equal to about 45, greater than or equal to about 47, greater than or equal to about 49, greater than or equal to about 51, greater than or equal to about 53, greater than or equal to about 55, greater than or equal to about 57, greater than or equal to about 59, greater than or equal to about 61, greater than or equal to about 63, greater than or equal to about 65, greater than or equal to about 67, greater than or equal to about 69, greater than or equal to about 71, greater than or equal to about 73, greater than or equal to about 75, greater than or equal to about 77, greater than or equal to about 79, greater than or equal to about 81, greater than or equal to about 83, greater than or equal to about 85, greater than or equal to about 87, greater than or equal to about 89, greater than or equal to about 91, greater than or equal to about 93, greater than or equal to about 95, greater than or equal to about 97, greater than or equal to about 99, or greater than or equal to about 100.

In one or more embodiments, the relative light emission intensity may be less than or equal to about 150, less than or equal to about 140, less than or equal to about 130, less than or equal to about 120, less than or equal to about 100, less than or equal to about 90, or less than or equal to about 80.

The color conversion region includes a second region 270*b* corresponding to a red pixel, the second region includes a matrix 273*b*, a second semiconductor nanoparticle (271*b*) dispersed in the matrix, and optionally a titanium oxide particle 272*b*. The second semiconductor nanoparticle includes a Group III-V compound containing indium and phosphorus, and the red wavelength is greater than or equal to about 600 nm and less than or equal to about 650 nm. The second region may include the second composite including the matrix and the second semiconductor nanoparticle.

In an embodiment, the second semiconductor nanoparticle (for example, included in the second composite) may include a third semiconductor nanocrystal including a Group III-V compound. The second semiconductor nanoparticle may further include a fourth semiconductor nanocrystal including a zinc chalcogenide. The second semiconductor nanoparticle may have a core shell structure including a core and a shell disposed on the core. The core may include the third semiconductor nanocrystal. The shell may include the fourth semiconductor nanocrystal. The second semiconductor nanoparticle may not include cadmium. The second semiconductor nanoparticle may not include cadmium, lead, mercury, or a combination thereof. In an embodiment, the second semiconductor nanoparticle may have a size (or an average size) of less than or equal to about 8.5 nm.

The Group III-V compound includes indium and phosphorus. The Group III-V compound may include an indium phosphide. The third semiconductor nanocrystal or the core may be an emissive center of the luminescent nanostructure. A size of the third semiconductor nanocrystal or the core may be selected taking into account a desired maximum luminescent peak wavelength of the luminescent nanostructure. In an embodiment, the third semiconductor nanocrystal or the core may have a size (or an average size) of greater than or equal to about 1 nm, greater than or equal to about 1.5 nm, greater than or equal to about 2 nm, greater than or equal to about 2.5 nm, greater than or equal to about 2.8 nm, greater than or equal to about 3 nm, or greater than or equal to about 3.5 nm. In an embodiment, the third semiconductor nanocrystal or the core may have a size (or an average size) of less than or equal to about 5 nm, less than or equal to about 4.5 nm, less than or equal to about 4 nm, less than or equal to about 3.8 nm, or less than or equal to about 3.5 nm.

In an embodiment, the fourth semiconductor nanocrystal may be disposed on the third semiconductor nanocrystal (or the core including the same) to form a shell of the second semiconductor nanoparticle. The zinc chalcogenide may include zinc, selenium, and sulfur.

The second semiconductor nanocrystal may form a shell of the luminescent nanostructures disposed on the first semiconductor nanocrystal (or a core including the same). In an embodiment, the fourth semiconductor nanocrystal or the shell including the same may be a multi-layered shell including at least two shell layers wherein adjacent shell layers may have different a composition than the other. The multi-layered shell may include a first shell layer including a semiconductor nanocrystal including zinc, selenium, and optionally sulfur; and a second shell layer being disposed on the first shell layer, the second shell layer including a semiconductor nanocrystal including zinc, sulfur, and optionally selenium. A composition of the semiconductor nanocrystal included in the first shell layer may be different from a composition of the semiconductor nanocrystal included in the second shell layer.

The second shell layer may include sulfur in a greater amount (e.g., mole) than the first shell layer. The first shell layer may include ZnSe, ZnSeS, or a combination thereof. The first shell layer may not include sulfur. The second shell layer may include ZnS, ZnSeS, or a combination thereof. The second shell layer may not include selenium. The first shell layer may be disposed on (e.g., directly on) the semiconductor nanocrystal core. The second shell layer may be disposed (e.g., directly on) the first shell layer. The second shell layer may be an outermost layer of the second semiconductor nanoparticle.

In an embodiment, the second semiconductor nanoparticle may include a mole ratio of zinc to indium (Zn:In) that is greater than or equal to about 7.5:1, greater than or equal to about 7.8:1, greater than or equal to about 7.9:1, greater than or equal to about 10:1, greater than or equal to about 10.2:1, or greater than or equal to about 11:1 and less than or equal to about 20:1, less than or equal to about 15:1, less than or equal to about 13:1, less than or equal to about 12.5:1, less than or equal to about 12.4:1, less than or equal to about 11.5:1, or less than or equal to about 10.2:1.

In an embodiment, the second semiconductor nanoparticle may include a mole ratio of sulfur to indium (S:In) that is greater than or equal to about 1.5:1, greater than or equal to about 1.6:1, greater than or equal to about 3:1, greater than or equal to about 3.2:1, or greater than or equal to about 4:1 and less than or equal to about 6:1, less than or equal to about 5.6:1, less than or equal to about 5.5:1, less than or equal to about 5:1, or less than or equal to about 4.5:1.

In an embodiment, the second semiconductor nanoparticle may include a mole ratio of sulfur to selenium (S:Se) that is greater than or equal to about 0.5:1, greater than or equal to about 0.55:1, or greater than or equal to about 0.69:1 (or greater than or equal to about 0.72:1, greater than or equal to about 0.75:1, or greater than or equal to about 0.83:1) and less than or equal to about 1.1:1, less than or equal to about 1.05:1, less than or equal to about 0.9:1, less than or equal to about 0.89:1, less than or equal to about 0.85:1, or less than or equal to about 0.78:1.

The second semiconductor nanoparticle may be configured to emit red light. A peak emission wavelength of the red light or the second semiconductor nanoparticle may be greater than or equal to about 600 nm, greater than or equal to about 610 nm, greater than or equal to about 615 nm, greater than or equal to about 620 nm, greater than or equal to about 625 nm, greater than or equal to about 630 nm, or greater than or equal to about 635 nm. The peak emission wavelength of the red light or the second semiconductor nanoparticle may be less than or equal to about 670 nm, less than or equal to about 660 nm, less than or equal to about 650 nm, less than or equal to about 645 nm, or less than or equal to about 640 nm.

As used herein, the term "semiconductor nanoparticle" may mean a single entity or a plurality of particles, and may refer to a singular or a plurality of particles.

In the second semiconductor nanoparticle of an embodiment, a mole ratio of sulfur to indium (S:In) may be greater than or equal to about 1.5:1, greater than or equal to about 1.6:1, greater than or equal to about 3:1, greater than or equal to about 3.1:1, greater than or equal to about 3.2:1, greater than or equal to about 3.4:1, greater than or equal to about 3.6:1, greater than or equal to about 3.8:1, greater than or equal to about 4:1, greater than or equal to about 4.1:1, greater than or equal to about 4.2:1, greater than or equal to about 4.3:1, greater than or equal to about 4.4:1, greater than or equal to about 4.5:1, or greater than or equal to about 4.6:1. In the second semiconductor nanoparticle, a mole ratio of sulfur to indium (S:In) may be less than or equal to about 6:1, less than or equal to about 5.9:1, less than or equal to about 5.8:1, less than or equal to about 5.7:1, less than or equal to about 5.6:1, less than or equal to about 5.5:1, less than or equal to about 5.4:1, less than or equal to about 5.3:1, less than or equal to about 5.2:1, less than or equal to about 5.1:1, less than or equal to about 5:1, less than or equal to about 4.9:1, less than or equal to about 4.8:1, or less than or equal to about 4.7.

In the second semiconductor nanoparticle, a mole ratio of sulfur to selenium (S:Se) may be less than or equal to about 1.1:1, less than or equal to about 1.05:1, less than or equal to about 1.02:1, less than or equal to about 0.895:1, less than or equal to about 0.89:1, less than or equal to about 0.885:1, less than or equal to about 0.88:1, less than or equal to about 0.875:1, or less than or equal to about 0.87:1. In the second semiconductor nanoparticle, a mole ratio of sulfur to selenium (S:Se) may be greater than or equal to about 0.69:1, greater than or equal to about 0.695:1, greater than or equal to about 0.70:1, greater than or equal to about 0.705:1, greater than or equal to about 0.71:1, greater than or equal to about 0.715:1, greater than or equal to about 0.72:1, greater than or equal to about 0.725:1, greater than or equal to about 0.73:1, greater than or equal to about 0.735:1, greater than or equal to about 0.74:1, greater than or equal to about 0.745:1, greater than or equal to about 0.75:1, greater than or equal to about 0.755:1, greater than or equal to about 0.76:1, greater than or equal to about 0.77:1, greater than or equal to about 0.78:1, greater than or equal to about 0.79:1, greater than or equal to about 0.8:1, greater than or equal to about 0.81:1, greater than or equal to about 0.82:1, or greater than or equal to about 0.83:1.

In the second semiconductor nanoparticle, a mole ratio of zinc to indium (Zn:In) may be greater than or equal to about 7:1, greater than or equal to about 7.5:1, greater than or equal to about 7.8:1, greater than or equal to about 8:1, greater than or equal to about 9:1, greater than or equal to about 10:1, greater than or equal to about 10.1:1, greater than or equal to about 10.2:1, greater than or equal to about 10.3:1, greater than or equal to about 10.4:1, greater than or equal to about 10.5:1, greater than or equal to about 10.6:1, greater than or equal to about 10.7:1, greater than or equal to about 10.8:1, greater than or equal to about 10.9:1, greater than or equal to about 11:1, greater than or equal to about 11.1:1, greater than or equal to about 11.2:1, greater than or equal to about 11.3:1, greater than or equal to about 11.4:1, or greater than or equal to about 11.5:1. In the second semiconductor nanoparticle, a mole ratio of zinc to indium (Zn:In) may be less than or equal to about 20:1, less than or equal to about 15:1, less than or equal to about 14:1, less than or equal to about 13.5:1, less than or equal to about 13:1, less than or equal to about 12.5:1, less than or equal to about 12.4:1, less than or equal to about 12.3:1, less than or equal to about 12.2:1, less than or equal to about 12.1:1, less than or equal to about 12:1, less than or equal to about 11.9:1, or less than or equal to about 11.8:1.

In the second semiconductor nanoparticle, a mole ratio of a sum of sulfur and selenium to indium [(S+Se):In] may be greater than or equal to about 4:1, greater than or equal to about 4.3:1, greater than or equal to about 4.4:1, greater than or equal to about 5:1, greater than or equal to about 6:1, greater than or equal to about 6.4:1, greater than or equal to about 7:1, greater than or equal to about 7.5:1, greater than or equal to about 8:1, greater than or equal to about 8.5:1, greater than or equal to about 8.96:1, greater than or equal to about 9.1:1, greater than or equal to about 9.2:1, greater than or equal to about 9.3:1, greater than or equal to about 9.4:1, greater than or equal to about 9.5:1, greater than or equal to about 9.6:1, greater than or equal to about 9.65:1, greater than or equal to about 9.7:1, greater than or equal to about 9.8:1, greater than or equal to about 9.9:1, greater than or equal to about 10:1, greater than or equal to about 10.1:1, or greater than or equal to about 10.2:1. In the second semiconductor nanoparticle, a mole ratio of a sum of sulfur and selenium to indium ((S+Se):In) may be less than or equal to about 11:1, less than or equal to about 10.9:1, less than or equal to about 10.5:1, less than or equal to about 10.3:1, or less than or equal to about 10.25:1.

In the second semiconductor nanoparticle, a mole ratio of selenium to indium (Se:In) may be greater than or equal to about 2.8:1, greater than or equal to about 3:1, greater than or equal to about 4:1, greater than or equal to about 5:1, greater than or equal to about 5.1:1, greater than or equal to about 5.2:1, greater than or equal to about 5.3:1, or greater than or equal to about 5.4:1. In the second semiconductor nanoparticle, a mole ratio of selenium to indium (Se:In) may be less than or equal to about 13:1, less than or equal to about 12:1, less than or equal to about 10:1, less than or equal to about 9:1, less than or equal to about 8:1, less than or equal to about 7:1, less than or equal to about 6.5:1, less than or equal to about 6.1:1, less than or equal to about 6:1, less than or equal to about 5.9:1, less than or equal to about 5.8:1, less than or equal to about 5.7:1, or less than or equal to about 5.6:1.

In the second semiconductor nanoparticle, a mole ratio of indium to a sum of sulfur and selenium In:(S+Se) may be greater than or equal to about 0.09:1, greater than or equal to about 0.095:1, greater than or equal to about 0.097:1, or greater than or equal to about 0.0975:1. In the second semiconductor nanoparticle, a mole ratio of indium to a sum of sulfur and selenium (In:(S+Se)) may be less than or equal to about 0.12:1, less than or equal to about 0.115:1, less than or equal to about 0.113:1, less than or equal to about 0.111:1, less than or equal to about 0.11:1, or less than or equal to about 0.109:1. In the second semiconductor nanoparticle, a mole ratio of indium to a sum of sulfur and selenium (In:(S+Se)) may be greater than or equal to about 0.05:1, greater than or equal to about 0.06:1, greater than or equal to about 0.07:1, greater than or equal to about 0.08:1, greater than or equal to about 0.09:1, or greater than or equal to about 0.096:1. In the second semiconductor nanoparticle, a mole ratio of indium to a sum of sulfur and selenium (In:(S+Se)) may be less than or equal to about 0.7:1, less than or equal to about 0.65:1, less than or equal to about 0.5:1, less than or equal to about 0.4:1, less than or equal to about 0.35:1, less than or equal to about 0.3:1, less than or equal to about 0.23:1, less than or equal to about 0.2:1, or less than or equal to about 0.109:1.

In an embodiment, the second semiconductor nanoparticle may have a thickness of the shell or a nominal thickness thereof (hereinafter, simply referred to as "shell thickness" at times) that is greater than or equal to about 1.5 nm, greater than or equal to about 1.6 nm, greater than or equal to about 1.7 nm, greater than or equal to about 1.8 nm, greater than or equal to about 1.9 nm, greater than or equal to about 2 nm, or greater than or equal to about 2.1 nm. In an embodiment, the shell thickness may be less than or equal to about 2.5 nm, less than or equal to about 2.4 nm, less than or equal to about 2.3 nm, less than or equal to about 2.2 nm, less than or equal to about 2.1 nm, less than or equal to about 2 nm, less than or equal to about 1.9 nm, less than or equal to about 1.8 nm, less than or equal to about 1.7 nm, or less than or equal to about 1.6 nm.

In an embodiment, the shell of the second semiconductor nanoparticle may be a multi-layered shell including a first shell layer and a second shell layer, and a thickness of the first shell layer (e.g., an average thickness or a nominal thickness thereof) may be greater than or equal to about 3 monolayers (ML), for example, greater than or equal to about 3.5 ML, greater than or equal to about 3.6 ML, greater than or equal to about 3.7 ML, greater than or equal to about 3.8 ML, greater than or equal to about 3.9 ML, greater than or equal to about 4 ML, greater than or equal to about 4.1 ML, greater than or equal to about 4.2 ML, greater than or equal to about 4.3 ML, or greater than or equal to about 4.4 ML.

The thickness of the first shell layer may be less than or equal to about 7 ML, less than or equal to about 6 ML, or less than or equal to about 5 ML. In an embodiment, the thickness of the first shell layer may be greater than or equal to about 0.9 nm, greater than or equal to about 1 nm, greater than or equal to about 1.1 nm, greater than or equal to about 1.2 nm, greater than or equal to about 1.3 nm, greater than or equal to about 1.4 nm, greater than or equal to about 1.43 nm, or greater than or equal to about 1.45 nm. In an embodiment, the thickness of the first shell layer may be less than or equal to about 1.8 nm, less than or equal to about 1.75 nm, less than or equal to about 1.7 nm, less than or equal to about 1.6 nm, less than or equal to about 1.55 nm, or less than or equal to about 1.51 nm.

In an embodiment, a thickness of the second shell layer (e.g., an average thickness or a nominal thickness) may be less than or equal to about 0.65 nm, less than or equal to about 0.64 nm, less than or equal to about 0.63 nm, less than or equal to about 0.62 nm, less than or equal to about 0.61 nm, less than or equal to about 0.6 nm, or less than or equal to about 0.59 nm. In an embodiment, a thickness of the second shell layer may be greater than or equal to about 0.3 nm, greater than or equal to about 0.35 nm, greater than or equal to about 0.4 nm, greater than or equal to about 0.45 nm, greater than or equal to about 0.5 nm, greater than or equal to about 0.51 nm, greater than or equal to about 0.52 nm, greater than or equal to about 0.53 nm, or greater than or equal to about 0.54 nm.

The second semiconductor nanoparticle can exhibit an increased absorption for light in a green wavelength region (e.g., a wavelength range of 520 nm to 540 nm) compared to blue light, so red light can be emitted with improved light emission efficiency for example in a display panel using mixed light as a light source. In a display panel of an embodiment, an incident light absorption by the color conversion panel may be greater than or equal to about 80%, greater than or equal to about 81%, greater than or equal to about 82%, greater than or equal to about 83%, greater than or equal to about 84%, or greater than or equal to about 85%.

In an embodiment, a size of the second semiconductor nanoparticle may be greater than or equal to about 6 nm, greater than or equal to about 6.2 nm, greater than or equal to about 6.5 nm, greater than or equal to about 6.8 nm, greater than or equal to about 7.5 nm, greater than or equal to about 7.6 nm, or greater than or equal to about 7.7 nm. In an embodiment, a size of the second semiconductor nanoparticle may be less than or equal to about 9 nm, less than or equal to about 8.5 nm, less than or equal to about 8 nm, less than or equal to about 7.9 nm, or less than or equal to about 7.8 nm.

In an embodiment, the size of the semiconductor nanoparticle (e.g., a quantum dot) may be obtained from an electron microscopy image. The size may be a diameter or an equivalent diameter obtained from the electron microscopy image. In an embodiment, the size of the semiconductor nanoparticle (or a population thereof) may be a nominal (calculated) size that can be calculated from a compositional analysis and a measurement of optical properties (e.g., a UV-absorption peak wavelength) of a given semiconductor nanoparticle. The nominal size may be calculated for a given semiconductor nanoparticle from the core size and the shell thickness information obtained from the compositional analysis of the semiconductor nanoparticle. The compositional analysis of the semiconductor nanoparticle may be made for example by using an appropriate analysis tool such as an inductively coupled plasma atomic emission spectroscopy. The nominal size and the size obtained from the electron microscopy analysis may be in an identical range.

In an embodiment, for a given semiconductor nanoparticle to calculate the size, the core size may be determined from a core composition of the semiconductor nanoparticle and an optical property (e.g., an UV absorption wavelength such as a first absorption peak wavelength) thereof. The method of measurement is described in Nanotechnology 24 (2013) 215201 (5 pp), the entire content of which is herein incorporated by reference.

In an embodiment, if a given semiconductor nanoparticle includes a core of an indium phosphide, a bandgap energy thereof is greater than or equal to about 2 electron Volts (eV) and less than or equal to about 4.8 eV, and a core size may be determined in a range of greater than or equal to about 1 nm and less than or equal to about 4.5 nm. In an embodiment, a semiconductor nanoparticle having an indium phosphide-based core may have a UV absorption wavelength (e.g., the first absorption peak wavelength) of about 570 nm, the size of the core may be determined to be from about 3.5 nm to about 3.7 nm (or about 3.6 nm).

Under the assumption that a given semiconductor nanoparticle has a spherical shape, a shell thickness for the semiconductor nanoparticle may be arithmetically determined by using the following information together with the measured mole ratios of the chalcogen elements (e.g., sulfur and selenium) with respect to indium in the semiconductor nanoparticle:

A core size (i.e., a core diameter) and a volume of the core calculated from the core diameter; a bulk density and a molar mass of the core component (e.g., a bulk density of the indium phosphide=4.81 grams per cubic centimeter ($g/cm^3$) and a molar mass of InP=145.79 grams per mole (g/mol)); a mole number of the indium included in a given core, which is calculated from the bulk density and the molar mass of the core component; a shell volume if a ZnS or ZnSe shell having a predetermined thickness is formed on the core; and a bulk density and a molar mass of each of the shell components (for example, ZnS, ZnSe, or a combination thereof) (for example, ZnSe=5.27 $g/cm^3$ and 144.35 g/mol, ZnS=4.090 $g/cm^3$ and 97.474 g/mol).

Under an assumption of that the semiconductor nanoparticle is in the form of a sphere, a mole ratio of each of the chalcogen element components (for example, sulfur or selenium) of the chalcogenide shell having a predetermined thickness with respect to indium in the core having a predetermined diameter may be calculated, from which, information about a shell thickness for a given core diameter may be determined.

In an embodiment, the semiconductor nanocrystal core may include InP. A size (or an average size) of the core(s) or a nominal size of the cores may be greater than or equal to about 1 nm, greater than or equal to about 1.5 nm, greater than or equal to about 2 nm, greater than or equal to about 3 nm, greater than or equal to about 3.3 nm, or greater than or equal to about 3.5 nm. In an embodiment, the core size may be less than or equal to about 5 nm, less than or equal to about 4 nm, less than or equal to about 3.8 nm, or less than or equal to about 3.7 nm.

In an embodiment of the display panel, the first region or the second region of the color conversion layer may further include a metal oxide fine particle (e.g., titanium oxide fine particles) (for example, dispersed in the matrix). The metal oxide fine particle may include $TiO_2$, $SiO_2$, $BaTiO_3$, $Ba_2TiO_4$, ZnO, or a combination thereof. The metal oxide fine particle may include a titanium oxide. In a given composite (e.g., a first composite, a second composite, or both), an amount of the metal oxide may be, based on a total weight of the composite, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, or greater than or equal to about 15 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, less than or equal to about 7 wt %, less than or equal to about 5 wt %, or less than or equal to about 3 wt %.

The diameter of the metal oxide fine particles is not particularly limited and may be appropriately selected. The diameter of the metal oxide fine particles may be greater than or equal to about 100 nm, greater than or equal to about 150 nm, or greater than or equal to about 200 nm and less than or equal to about 1000 nm, or less than or equal to about 800 nm.

In an embodiment, a titanium oxide particle is included in the color conversion layer, and an amount ratio (e.g., based on atomic %) of silver for titanium (Ag:Ti) in the color conversion layer may be greater than or equal to about 0.01:1, greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.6:1, greater than or equal to about 0.7:1, greater than or equal to about 0.8:1, greater than or equal to about 0.9:1, greater than or equal to about 1:1, greater than or equal to about 1.5:1, greater than or equal to about 2:1, and less than or equal to about 5:1, less than or equal to about 4:1, less than or equal to about 3:1, less than or equal to about 2.5:1, less than or equal to about 2:1, less than or equal to about 1.5:1, less than or equal to about 1.3:1, less than or equal to about 1.2:1, less than or equal to about 1.1:1, less than or equal to about 1:1, less than or equal to about 0.9:1; or less than or equal to about 0.8:1.

In the display panel of an embodiment, the color conversion layer may have an amount ratio (e.g., based on atomic %) of gallium to titanium (Ga:Ti) that is greater than or equal to about 0.01:1, greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.6:1, greater than or equal to about 0.7:1, greater than or equal to about 0.8:1, greater than or equal to about 0.9:1, greater than or equal to about 1:1, greater than or equal to about 1.5:1, or greater than or equal to about 2:1, and less than or equal to about 5:1, less than or equal to about 4:1, less than or equal to about 3:1, less than or equal to about 2.5:1, less than or equal to about 2:1, less than or equal to about 1.5:1, less than or equal to about 1.3:1, less than or equal to about 1.2:1, less than or equal to about 1.1:1, less than or equal to about 1:1, less than or equal to about 0.9:1, or less than or equal to about 0.85:1.

In the display panel of an embodiment, for blue light with a wavelength of greater than or equal to about 455 nm and less than or equal to about 460 nm, the color conversion layer may have a ratio of blue light absorption in the first region to blue light absorption in the second region from about 0.88:1 to about 1.2:1, from about 0.9:1 to about 1.1:1, from about 0.92:1 to about 1:1, from about 0.95:1 to about 0.98:1, from about 0.96:1 to about 0.97:1, or a combination of any two stated values thereof.

In an embodiment, the (first or second) composite is in a form of film (e.g., a patterned film) and the film of the composite may have a thickness of less than or equal to about 30 micrometer (μm), for example, less than or equal to about 25 μm, less than or equal to about 20 μm, less than or equal to about 15 μm, less than or equal to about 10 μm, less than or equal to about 8 μm, or less than or equal to about 7 μm and greater than or equal to about 2 μm, for example, greater than or equal to about 3 μm, greater than or equal to about 3.5 μm, greater than or equal to about 4 μm, greater than or equal to about 5 μm, or greater than or equal to about 6 μm. In an embodiment, the composite may be in a form a film having a thickness of greater than or equal to about 6 μm (e.g., about 10 μm) with an amount of the semiconductor nanoparticle of less than or equal to about 45 wt %.

The first composite or the film thereof may exhibit light absorption to blue light that is greater than or equal to about 88%, greater than or equal to about 90%, greater than or equal to about 91%, greater than or equal to about 92%, or greater than or equal to about 93%. In an embodiment, the blue light absorption of the composite may be from about 90% to about 99%, from about 91% to about 98%, from about 93% to about 96%, or a combination thereof.

The display panel may exhibit relatively improved luminance and color conversion by including the light emitting panel and the color conversion panel described herein. Without wishing to be bound by any theory, in the display panel of an embodiment, the light emitting panel emitting hyper fluorescence blue light is combined with a color conversion panel including the green light-emitting semiconductor nanoparticle based on the Group I-III-VI compound, whereby the display panel may exhibit balanced relative absorption, and thus increased and balanced blue light absorption and blue light conversion at a high efficiency may be achieved. Therefore, in an embodiment of the display panel, the brightness of full white light may be greater than or equal to about 300 cd/m$^2$ (nit), greater than or equal to about 305 nit, greater than or equal to about 310 nit, greater than or equal to about 315 nit, or greater than or equal to about 320 nit.

In the display panel of an embodiment, the color reproduction under the standard of BT2020 may be greater than or equal to about 80%, greater than or equal to about 85%, greater than or equal to about 86%, greater than or equal to about 87%, greater than or equal to about 88%, greater than or equal to about 89%, greater than or equal to about 90%, greater than or equal to about 91%, greater than or equal to about 92%, greater than or equal to about 93%, greater than or equal to about 94%, greater than or equal to about 95%.

Method of Manufacturing the First Semiconductor Nanoparticle

In an embodiment, the first semiconductor nanoparticle may be prepared by a method that includes:

obtaining a first semiconductor nanocrystal including silver, a Group 13 metal, and a chalcogen element;

preparing a reaction medium including a first precursor, an organic solvent, and optionally an organic ligand;

heating the reaction medium to a first temperature;

adding the first semiconductor nanocrystal and a second precursor to the reaction medium to obtain a reaction mixture, wherein one of the first precursor and the second precursor is a gallium precursor and the other is a sulfur precursor; and heating the reaction medium to a second temperature for a first reaction time to form the first semiconductor nanoparticle, wherein the first temperature is greater than or equal to about 120° C. (e.g., greater than or equal to about 180° C.) to less than or equal to about 280° C., and the second temperature is greater than or equal to about 180° C. (or greater than or equal to about 190° C. or greater than or equal to about 240° C.) to less than or equal to about 380° C.

The first reaction time may be controlled to obtain a charge balance value as described herein for the first semiconductor nanoparticle. The first temperature and the second temperature may be different. The second temperature may be higher than the first temperature. The second temperature may be lower than the first temperature. The details of the first semiconductor nanocrystal, the first semiconductor nanoparticle, and the charge balance value are as described herein.

In an embodiment, the first precursor may be a gallium precursor, and the second precursor may be a sulfur precursor. In an embodiment, the first precursor may be a sulfur precursor, and the second precursor may be a gallium precursor. According to the method of an embodiment, oxidation of the gallium precursor may be suppressed more efficiently.

In an embodiment, the method may further include preparing an additional reaction medium including an organic ligand and a zinc precursor in an organic solvent; heating the additional reaction medium to a reaction temperature; adding the first semiconductor nanoparticle formed above and a chalcogen precursor to conduct a reaction and to provide an outer layer including zinc chalcogenide on the first semiconductor nanoparticle. The chalcogen precursor may include a sulfur precursor, a selenium precursor, or a combination thereof. Details of the reaction temperature are as described herein for the second temperature.

The detailed description of the first semiconductor nanocrystal is as described herein. The first semiconductor nanocrystal may include silver (Ag), indium, gallium, and sulfur. A method of producing the first semiconductor nanocrystal is not particularly limited and may be appropriately selected. In an embodiment, the first semiconductor nanocrystal may be obtained by reacting the required precursors depending on the composition, such as a silver precursor, an indium precursor, a gallium precursor, and a sulfur precursor in a solution including an organic ligand and an organic solvent at a predetermined reaction temperature (e.g., about 20° C. to about 300° C., about 80° C. to about 295° C., about 120° C. to about 290° C., or about 200° C. to about 280° C.) and separating the same. For separation and recovery, a method to be described herein may be referred to.

In the preparation of the first semiconductor nanocrystal, mole ratios among the precursors may be varied to obtain a desired composition of the first semiconductor nanocrystal. In an embodiment, an amount of the silver (Ag) precursor may be, per one mole of indium, greater than or equal to about 0.1 moles, greater than or equal to about 0.3 moles, greater than or equal to about 0.5 moles, greater than or equal to about 0.7 moles, greater than or equal to about 1 mole, greater than or equal to about 1.5 moles, greater than or equal to about 2 moles, or greater than or equal to about 2.5 moles. In an embodiment, an amount of the silver (Ag) precursor may be, per one mole of indium, less than or equal to about 10 moles, less than or equal to about 8 moles, less than or equal to about 6 moles, less than or equal to about 4 moles, less than or equal to about 2 moles, less than or equal to about 1.2 moles, less than or equal to about 1 mole, or less than or equal to about 0.5 moles. In an embodiment, an amount of the silver (Ag) precursor may be, per one mole of indium, greater than or equal to about 0.5 moles to less than or equal to about 1.2 moles.

In an embodiment, an amount of the gallium precursor may be, per one mole of indium, greater than or equal to about 0.5 moles, greater than or equal to about 1 mole, greater than or equal to about 1.5 moles, greater than or equal to about 2 moles, or greater than or equal to about 2.5 moles. In an embodiment, an amount of the gallium precursor may be, per one mole of indium, less than or equal to about 15 moles, less than or equal to about 12 moles, less than or equal to about 10 moles, less than or equal to about 8 moles, less than or equal to about 5 moles, or less than or equal to about 3 moles.

In an embodiment, an amount of the sulfur precursor may be, per one mole of indium, greater than or equal to about 0.5 moles, greater than or equal to about 1 mole, greater than or equal to about 1.5 moles, greater than or equal to about 2 moles, greater than or equal to about 2.5 moles, greater than or equal to about 3 moles, greater than or equal to about 3.5 moles, greater than or equal to about 4 moles, or greater than or equal to about 4.5 moles. In an embodiment, an amount of the sulfur precursor may be, per one mole of indium, less than or equal to about 20 moles, less than or equal to about 15 moles, less than or equal to about 10 moles, less than or equal to about 8 moles, less than or equal to about 6 moles, less than or equal to about 4 moles, or less than or equal to about 2 moles.

A difference between the first temperature and the second temperature may be greater than or equal to about 10° C., greater than or equal to about 20° C., greater than or equal to about 30° C., greater than or equal to about 40° C., greater than or equal to about 50° C., greater than or equal to about 60° C., greater than or equal to about 70° C., greater than or equal to about 80° C., greater than or equal to about 90° C., or greater than or equal to about 100° C. The difference between the first temperature and the second temperature may be less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., less than or equal to about 120° C., less than or equal to about 110° C., less than or equal to about 100° C., less than or equal to about 90° C., less than or equal to about 80° C., less than or equal to about 70° C., less than or equal to about 60° C., less than or equal to about 50° C., less than or equal to about 40° C., less than or equal to about 30° C., or less than or equal to about 20° C.

The first temperature may be greater than or equal to about 120° C., greater than or equal to about 200° C., greater than or equal to about 210° C., greater than or equal to about 220° C., greater than or equal to about 230° C., greater than or equal to about 240° C., or greater than or equal to about 250° C. The first temperature may be less than or equal to about 280° C., less than or equal to about 275° C., less than or equal to about 270° C., less than or equal to about 265° C., less than or equal to about 260° C., less than or equal to about 255° C., less than or equal to about 250° C., less than or equal to about 240° C., less than or equal to about 230° C., less than or equal to about 220° C., less than or equal to about 210° C., less than or equal to about 200° C., less than or equal to about 190° C., less than or equal to about 180° C., less than or equal to about 170° C., less than or equal to about 160° C., or less than or equal to about 150° C.

The second temperature may be greater than or equal to about 240° C., greater than or equal to about 245° C., greater than or equal to about 250° C., greater than or equal to about 255° C., greater than or equal to about 260° C., greater than or equal to about 265° C., greater than or equal to about 270° C., greater than or equal to about 275° C., greater than or equal to about 280° C., greater than or equal to about 285° C., greater than or equal to about 290° C., greater than or equal to about 295° C., greater than or equal to about 300° C., greater than or equal to about 305° C., greater than or equal to about 310° C., greater than or equal to about 315° C., greater than or equal to about 320° C., greater than or equal to about 330° C., greater than or equal to about 335° C., greater than or equal to about 340° C., or greater than or equal to about 345° C. The second temperature may be less than or equal to about 380° C., less than or equal to about 375° C., less than or equal to about 370° C., less than or equal to about 365° C., less than or equal to about 360° C., less than or equal to about 355° C., less than or equal to about 350° C., less than or equal to about 340° C., less than or equal to about 330° C., less than or equal to about 320° C., less than or equal to about 310° C., less than or equal to about 300° C., less than or equal to about 290° C., less than or equal to about 280° C., less than or equal to about 270° C., less than or equal to about 260° C., or less than or equal to about 250° C.

The first reaction time may be controlled to obtain a charge balance value of the first semiconductor nanoparticle. Surprisingly, the present inventors have found that by controlling the first temperature and the second temperature and the first reaction time in the aforementioned reaction, generation of side reaction products (e.g., gallium oxide) may be effectively suppressed during the formation of a first semiconductor nanoparticle, and whereby the final first semiconductor nanoparticle may have the charge balance value described herein (optionally together with the molar ratios between each component described herein), which may contribute to achieving the properties of the first semiconductor nanoparticle described herein.

In an embodiment, the first reaction time may be in a range of about 1 minute to about 200 minutes, about 10 minutes to about 3 hours, about 20 minutes to about 150 minutes, about 30 minutes to about 100 minutes, or a combination thereof. The first reaction time may be selected taking into consideration the types of precursors, the reaction temperature, the desired composition of the final particles, or the like. In an embodiment, the second temperature may be within a relatively high temperature range (e.g., greater than or equal to about 280° C., about 285° C. to about 340° C., or about 290° C. to about 330° C.), and the first reaction time may be greater than or equal to about 1 minute, greater than or equal to about 5 minutes, greater than or equal to about 10 minutes, greater than or equal to about 15 minutes, greater than or equal to about 20 minutes, or greater than or equal to about 25 minutes to less than or equal to about 2 hours, less than or equal to about 90 minutes, less than or equal to about 80 minutes, less than or equal to about 70 minutes, less than or equal to about 60 minutes, less than or equal to about 50 minutes, less than or equal to about 45 minutes, less than or equal to about 40 minutes, less than or equal to about 35 minutes, less than or equal to about 25 minutes, less than or equal to about 20 minutes, less than or equal to about 15 minutes, or less than or equal to about 12 minutes. In an embodiment, the second temperature may be within a relatively low temperature range (e.g., less than or equal to about 290° C., less than or equal to about 280° C., less than or equal to about 270° C., less than or equal to about 260° C., less than or equal to about 250° C., less than or equal to about 240° C., less than or equal to about 230° C., less than or equal to about 220° C., or less than or equal to about 210° C.) and the first reaction time may be greater than or equal to about 30 minutes, greater than or equal to about 35 minutes, greater than or equal to about 40 minutes, greater than or equal to about 45 minutes, greater than or equal to about 50 minutes, greater than or equal to about 55 minutes, greater than or equal to about 60 minutes, greater than or equal to about 65 minutes, greater than or equal to about 70 minutes, greater than or equal to about 75 minutes, or greater than or equal to about 80 minutes.

Method of Manufacturing the Second Semiconductor Nanoparticle

In an embodiment, the second semiconductor nanoparticle (e.g., included in the second composite of an embodiment) may be prepared by a method, which includes:

vacuum-treating, e.g., subjecting to vacuum conditions, a solution including a zinc compound, an organic ligand, and an organic solvent under a controlled state (i.e., under a condition where oxidation may be substantially suppressed or prevented), and optionally, carrying out a ligand reaction to prepare a reaction medium including a zinc precursor;

heating the reaction medium at a first temperature and adding a third semiconductor nanocrystal including indium and phosphorus (or a particle including the same) to obtain a first mixture;

heating the first mixture at a second temperature and adding a selenium precursor, a sulfur precursor, or both; and optionally, a zinc precursor to obtain a second mixture; and carrying out a reaction (for forming a fourth semiconductor nanocrystal) for a predetermined time (a first duration) whereby obtaining the second semiconductor nanoparticle of an embodiment.

The method may further include maintaining a temperature of the second mixture at the second temperature and adding the sulfur precursor and optionally the zinc precursor and reacting them at a predetermined time (a second duration).

The method may further include adding an additional selenium precursor, and optionally, a zinc precursor to the second mixture.

In the method of an embodiment, the addition of the sulfur precursor may be conducted with a single addition at a necessary amount to obtain a desired quantum dot composition. In the method of an embodiment, the addition of the sulfur precursor may be performed with separate multiple additions (i.e., at least two separate additions or at least three separate additions) to provide a necessary amount to obtain a desired quantum dot composition.

It is believed that during the preparation of the zinc precursor, it may be difficult to completely avoid oxidation and the consequent decomposition of the zinc compound and the organic ligand even if the preparation process is conducted under a condition of strictly controlling the presence of oxygen (e.g., under a vacuum or a nitrogen atmosphere). In the method of producing the second semiconductor nanoparticle of an embodiment, the zinc precursor may be prepared under a controlled state, e.g., under a condition where, a side reaction such as an oxidation can be minimized, and a quality of the shell coating on the core may be improved.

The present inventors have found that during the vacuum treating of the compound, the amount of the zinc compound and the treating time with the ligand under the reaction conditions that will be described herein may affect the activity of the zinc precursor during the shell formation reaction. In the method of an embodiment, the amount of the zinc compound to be vacuum-treated may be increased, and the period of time of the vacuum treating may be controlled (or limited), and then, under a nitrogen atmosphere, a post thermal treatment may be carried out at a temperature higher than the temperature of the vacuum treating for a controlled time. As a result, the activity of the zinc precursor may be increased to form a shell coating with an improved quality.

In an embodiment, an amount of the zinc compound (e.g., zinc acetate) may be greater than or equal to about 3 millimoles (mmol), greater than or equal to about 5 mmol, greater than or equal to about 7 mmol, greater than or equal to about 9 mmol, greater than or equal to about 15 mmol, greater than or equal to about 20 mmol, or greater than or equal to about 50 mmol. The duration of the vacuum treating may be less than or equal to about 50 minutes, less than or equal to about 45 minutes, less than or equal to about 40 minutes, less than or equal to about 30 minutes, less than or equal to about 25 minutes, or less than or equal to about 20 minutes. A temperature of the vacuum treating may be dependent on the amount of the precursor and may be greater than or equal to about 100° C., greater than or equal to about 110° C., greater than or equal to about 120° C., or greater than or equal to about 150° C. and less than or equal to about 200° C., or less than or equal to about 180° C.

During the ligand reaction, the zinc compound may react with the ligand to provide a zinc precursor that is different from the initial zinc compound added to the reaction vessel. The temperature of the ligand reaction may be selected taking into consideration the type of the initial zinc compound and the organic ligand. The ligand reaction may be carried out under an inert gas atmosphere, and a temperature of the ligand reaction may be greater than or equal to about 250° C., greater than or equal to about 270° C., or greater than or equal to about 280° C. and less than or equal to about 300° C., less than or equal to about 290° C., less than or equal to about 280° C., less than or equal to about 270° C., less than or equal to about 250° C., or less than or equal to about 240° C. The time for the ligand reaction may be greater than or equal to about 5 minutes, greater than or equal to about 10 minutes, greater than or equal to about 20 minutes, greater than or equal to about 30 minutes and less than or equal to about 40 minutes, less than or equal to about 30 minutes, less than or equal to about 25 minutes, less than or equal to about 10 minutes.

The first temperature (for adding the third semiconductor nanocrystal) may be greater than or equal to about 150° C., greater than or equal to about 160° C., greater than or equal to about 170° C., greater than or equal to about 180° C., greater than or equal to about 190° C., greater than or equal to about 200° C., greater than or equal to about 210° C., greater than or equal to about 220° C., greater than or equal to about 230° C., greater than or equal to about 240° C., or greater than or equal to about 250° C. The first temperature may be less than or equal to about 330° C., less than or equal to about 320° C., less than or equal to about 310° C., less than or equal to about 300° C., or less than or equal to about 290° C.

In the method of an embodiment, the second temperature (for adding the selenium precursor to the first mixture) may be greater than or equal to about 300° C., greater than or equal to about 310° C., greater than or equal to about 320° C., greater than or equal to about 340° C., or greater than or equal to about 345° C. The second temperature may be less than or equal to about 380° C., less than or equal to about 370° C., less than or equal to about 360° C., or less than or equal to about 350° C.

On the addition of the sulfur precursor, and optionally, the zinc precursor, the reaction medium may include or may not include the selenium precursor. The addition of the sulfur precursor, and optionally, the zinc precursor, may not include decreasing a temperature of the reaction medium under a temperature of less than or equal to about 50° C. (e.g., a temperature of less than or equal to about 30° C.) or to room temperature.

Without wishing to be bound by any theory, according to the method of an embodiment, the zinc precursor, which is prepared in the aforementioned process of suppressing or controlling oxidation of the zinc, may come in contact with the selenium precursor at a temperature within the aforementioned range, and the quality of the shell coating including the zinc selenide may be further improved. Accordingly, even with a relatively thin shell coating formed on the core, the resulting second semiconductor nanoparticle may exhibit a substantially decreased tail emission for example in the green light region.

The reaction time for each step (e.g., for forming each of the first shell layer and the second shell layer) may be controlled taking into consideration the type of the precursor, and the composition and the structure of the final quantum dots. In each step, the reaction time (the first duration and the second duration) may be each independently greater than or equal to about 40 minutes, greater than or equal to about 50 minutes, greater than or equal to about 60 minutes, greater than or equal to about 70 minutes, greater than or equal to about 80 minutes, or greater than or equal to about 90 minutes. In each step, the reaction time (the first time and the second time) may be each independently less than or equal to about 4 hours, less than or equal to about 3 hours, or less than or equal to about 2 hours.

In the reaction medium, a concentration of the zinc precursor may not particularly limited and selected appropriately.

In the reaction (or in the first mixture, the second mixture, or each of the first mixture and the second mixture), the amounts of the zinc precursor, the selenium precursor, and the sulfur precursor with respect to the indium and the total amount used during the formation of the shell coating may be controlled to obtain desired compositional ratios of the elements in the final quantum dots. In each step of the process, the reaction time may be controlled to obtain desired compositional ratios of the elements and the structures (e.g., a core and multi-shell structure) in the resulting second semiconductor nanoparticle.

The mole amount of selenium, which is derived from a selenium precursor, per one mole of indium in the method or in the second mixture may be greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, greater than or equal to about 10 moles, or greater than or equal to about 12 moles. The mole amount of selenium per one mole of indium in the method or in the second mixture may be less than or equal to about 25 moles, less than or equal to about 20 moles, less than or equal to about 18 moles, less than or equal to about 15 moles, less than or equal to about 12 moles, less than or equal to about 10 moles, or less than or equal to about 9 moles.

The mole amount of sulfur, which is derived from a sulfur precursor, per one mole of indium in the method may be greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. The mole amount of sulfur per one mole of indium in the method may be less than or equal to about 45 moles, less than or equal to about 40 moles, less than or equal to about 35 moles, less than or equal to about 30 moles, less than or equal to about 25 moles, less than or equal to about 20 moles, less than or equal to about 19 moles, less than or equal to about 18 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, or less than or equal to about 5 moles.

In the method of an embodiment, the mole amount of zinc, which is derived from a zinc compound, per one mole of indium may be determined taking into consideration the type of the compound and the composition of the final quantum dots. In an embodiment, the mole amount of zinc per one mole of indium may be greater than or equal to about 5 moles, greater than or equal to about 6 moles, greater than or equal to about 7 moles, greater than or equal to about 8 moles, greater than or equal to about 9 moles, greater than or equal to about 10 moles, greater than or equal to about 11 moles, or greater than or equal to about 12 moles. In an embodiment, the mole amount of zinc per one mole of indium in the method may be less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 11 moles, or less than or equal to about 10 moles.

Types of the zinc compound that can be used in the preparation of the first semiconductor nanoparticle or the second semiconductor nanoparticle is not particularly limited and may be selected appropriately. In an embodiment, the zinc compound may include a Zn metal powder, an alkylated Zn compound (e.g., dimethyl zinc, diethyl zinc, or a combination thereof), a Zn alkoxide, a Zn carboxylate (e.g., zinc acetate), a zinc carbonate, a Zn nitrate, a Zn perchlorate, a Zn sulfate, a Zn acetylacetonate, a Zn halide (e.g., zinc chloride, zinc bromide, zinc iodide, zinc fluoride, or a combination thereof), a Zn cyanide, a Zn hydroxide, a Zn oxide, a Zn peroxide, or a combination thereof. Examples of the zinc compound may include, but are not limited to dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc oleate, and the like. The zinc compound may be used alone or in a combination of two or more different compounds.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$ (wherein R and R' are the same or different, and are independently a hydrogen, a C1 to C40 (or C3 to C24) aliphatic hydrocarbon group (e.g., an alkyl group, an alkenyl group, or an alkynyl group), a C6 to C40 aromatic hydrocarbon group (such as a C6 to C20 aryl group)), a polymeric organic ligand, or a combination thereof. The organic ligand may coordinate to, e.g., be bound to, the surface of the obtained nanocrystal and help the nanocrystal to be well dispersed in the solution.

In the method of an embodiment, the ligand reaction may be carried out to provide a zinc precursor, which is a reaction product between the zinc compound and the organic ligand. In an embodiment, the reaction product may be a zinc carboxylate, a product of a reaction between the zinc compound and a C8 to C40 fatty acid. The reaction medium may include an organic solvent and the organic ligand.

The organic ligand may coordinate to a surface of the prepared nanocrystal, and thus, facilitate dispersing the nanocrystal in a solution. Examples of the organic ligand may include a thiol such as methane thiol, ethane thiol, propane thiol, butane thiol, pentane thiol, hexane thiol, octane thiol, dodecane thiol, hexadecane thiol, octadecane thiol, or benzyl thiol; an amine such as methane amine, ethane amine, propane amine, butyl amine, pentyl amine, hexyl amine, octyl amine, dodecyl amine, hexadecyl amine, octadecyl amine, dimethyl amine, diethyl amine, or dipropyl amine; methanoic (formic) acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO); diphenyl phosphine, triphenyl phosphine, diphenyl phosphine oxide, or triphenyl phosphine oxide; an alkylphosphinic acid for example, a C5 to C20 alkyl phosphinic acid (e.g., hexyl phosphinic acid, octyl phosphinic acid, dodecanyl phosphinic acid, tetradecanyl phosphinic acid, hexadecanyl phosphinic acid, octadecanyl phosphinic acid, or the like; an alkylphosphonic acid such as a C5 to C20 alkylphosphonic acid; or the like), but are not limited thereto. The organic ligand may be used alone or as a mixture of at least two different ligand compounds.

The (organic) solvent may include a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. Types and amounts of the organic solvent may be appropriately selected taking into consideration precursors and organic ligands.

Details of the first semiconductor nanocrystal (hereinafter, the core) including the indium and the phosphorous are the same as set forth herein. The core may be commercially available or may be prepared in any appropriate method. The preparation of the core is not particularly limited and may be performed in any method of producing an indium phosphide-based core. In an embodiment, the core may be synthesized in a hot injection manner wherein a solution including a metal precursor (e.g., an indium precursor) and optionally a ligand is heated at a high temperature (e.g., of greater than or equal to about 200° C.) and then a phosphorous precursor is injected the heated hot solution.

A type of the silver precursor is not particularly limited and may be selected appropriately. The silver precursor may include a silver powder, an alkylated silver compound, a silver alkoxide, a silver carboxylate, a silver acetylacetonate, a silver nitrate, a silver sulfate, a silver halide, a silver cyanide, a silver hydroxide, a silver oxide, a silver peroxide, a silver carbonate, a silver acetate, or a combination thereof. The silver precursor may include a silver nitrate, a silver acetate, a silver acetylacetonate, a silver chloride, a silver bromide, a silver iodide, or a combination thereof.

A type of the indium precursor is not particularly limited and may be selected appropriately. The indium precursor may include an indium powder, an alkylated indium compound, an indium alkoxide, an indium carboxylate, an indium nitrate, an indium perchlorate, an indium sulfate, an indium acetylacetonate, an indium halide, an indium cyanide, an indium hydroxide, an indium oxide, an indium peroxide, an indium carbonate, an indium acetate, or a combination thereof. The indium precursor may include an indium carboxylate such as indium oleate and indium myristate, an indium acetate, an indium hydroxide, an indium chloride, an indium bromide, an indium iodide, or a combination thereof.

A type of the gallium precursor is not particularly limited and may be appropriately selected. The gallium precursor may include a gallium powder, an alkylated gallium compound, a gallium alkoxide, a gallium carboxylate, a gallium nitrate, a gallium perchlorate, a gallium sulfate, a gallium acetylacetonate, a gallium halide, a gallium cyanide, a gallium hydroxide, a gallium oxide, a gallium peroxide, a gallium carbonate, a gallium acetate, or a combination thereof. The gallium precursor may include a gallium chloride, a gallium iodide, a gallium bromide, a gallium acetate, a gallium acetylacetonate, a gallium oleate, a gallium palmitate, a gallium stearate, a gallium myristate, a gallium hydroxide, or a combination thereof.

A type of the sulfur precursor is not particularly limited and may be appropriately selected. The sulfur precursor may be an organic solvent dispersion or a reaction product of sulfur and an organic solvent, for example, a octadecene sulfide (S-ODE), a trioctylphosphine-sulfide (S-TOP), a tributylphosphine-sulfide (S-TBP), a triphenylphosphine-sulfide (S-TPP), a trioctylamine-sulfide (S-TOA), a bis (trimethylsilylalkyl) sulfide, a bis(trimethylsilyl) sulfide, a mercapto propyl silane, an ammonium sulfide, a sodium sulfide, a C1 to C30 thiol compound (e.g., α-toluene thiol, octane thiol, dodecanethiol, octadecene thiol, or the like), an isothiocyanate compound (e.g., cyclohexyl isothiocyanate or the like), an alkylenetrithiocarbonate (e.g., ethylene trithiocarbonate or the like), allyl mercaptan, a thiourea compound (e.g., (di)alkylthiourea having a C1 to C40 alkyl group, for example, methylthiourea, dimethylthiourea, ethylthiourea, diethyl thiourea, ethyl methyl thiourea, dipropyl thiourea, or the like; or an arylthiourea such as a phenyl thiourea), or a combination thereof.

The selenium precursor, if present, may include selenium-trioctylphosphine (Se-TOP), selenium-tributylphosphine (Se-TBP), selenium-triphenylphosphine (Se-TPP), or a combination thereof.

Amounts of the organic ligand and the precursors in the reaction medium may be selected appropriately in consideration of the type of solvent, the type of the organic ligand and each precursor, and the size and composition of desired particles. Mole ratios between the precursors may be changed taking into consideration the desired mole ratios in the final nanoparticle, the reactivities among the precursors, or the like. In one or more embodiments, a manner of adding each of the precursors is not particularly limited. In one or more embodiments, a total amount of a precursor may be added at one time. In one or more embodiments, a total amount of a precursor may be divided and added into greater than or equal to about 2 aliquots and less than or equal to about 10 aliquots. The precursors may be added simultaneously or sequentially in a predetermined order. The reaction may be carried out in an inert gas atmosphere, in air, or in a vacuum state, but embodiments are not limited thereto.

After the completion of the reaction, a nonsolvent may be added to a final reaction solution to facilitate separation (e.g., precipitation) of a semiconductor nanoparticle as synthesized (for example, with a coordinating organic ligand). The nonsolvent may be a polar solvent that is miscible with the solvent used in the reaction, but cannot disperse the nanocrystals. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed by centrifugation, precipitation, chromatography, or distillation. Separated nanocrystals may be washed by adding to a washing solvent as needed. The washing solvent is not particularly limited, and a solvent having a solubility parameter similar to that of the organic solvent or ligand may be used. The nonsolvent or washing solvent may be an alcohol; an alkane solvent such as hexane, heptane, octane, or the like; an aromatic solvent such as chloroform; toluene, benzene, or the like; or a combination thereof, but embodiments are not limited thereto.

The first semiconductor nanoparticle and the second semiconductor nanoparticle thus prepared may be dispersed in a dispersion solvent. The semiconductor nanoparticle thus prepared may form an organic solvent dispersion. The organic solvent dispersion may not include water and/or an organic solvent miscible with water. The dispersion solvent may be appropriately selected. The dispersion solvent may include the aforementioned organic solvent. The dispersion solvent may include a substituted or unsubstituted C1 to C40 aliphatic hydrocarbon, a substituted or unsubstituted C6 to C40 aromatic hydrocarbon, or a combination thereof.

A shape of the (first or second) semiconductor nanoparticle thus prepared is not particularly limited, and may include, for example, spherical, polyhedral, pyramidal, multipod, cubic, nanotubes, nanowires, nanofibers, nanosheets, or a combination thereof, but embodiments are not limited thereto.

The (first or second) semiconductor nanoparticle of one or more embodiments may include an organic ligand and/or an organic solvent on a surface of the semiconductor nanoparticle. The organic ligand and/or the organic solvent may be bound to a surface of the semiconductor nanoparticle of one or more embodiments.

In an embodiment, a color conversion panel includes a color conversion layer that includes at least a first region and a second region. In an embodiment, the first composite includes a matrix and the first semiconductor nanoparticles dispersed in the matrix, and the second composite includes a matrix and the second semiconductor nanoparticles dispersed in the matrix.

The first composite and the second composite are disposed in the first region and in the second region, respectively. The color conversion layer may include a plurality of the first regions disposed in a predetermined pattern, each of the first regions may include the first composite or a pattern thereof. The color conversion layer may include a plurality of second regions disposed in a predetermined pattern, each of the second regions may include the second composite or a pattern thereof. The respective composites (or a patterns thereof) may be prepared from an composition, e.g., an ink composition, by any suitable method, for example, in a photolithography manner or in an inkjet printing manner. Accordingly, one or more embodiments also relates to an ink composition including a liquid vehicle and the semiconductor nanoparticle as described herein. The first (or second) semiconductor nanoparticle may be dispersed in the liquid vehicle. The first composite of an embodiment may be prepared from a composition including the first semiconductor nanoparticle, for example, via a polymerization into a solid state. The second composite of an embodiment may be prepared from a composition including the second semiconductor nanoparticle, for example, via a polymerization into a solid state.

The liquid vehicle may include a liquid monomer, an organic solvent, or a combination thereof. The ink composition may further include a metal oxide fine particle, for example, dispersed in the liquid vehicle. The ink composition may further include a dispersant (for dispersing the semiconductor nanoparticles and/or the metal oxide particle). The dispersant may include a carboxylic acid group-containing organic compound (monomer or polymer). The liquid vehicle may not include an (e.g., volatile) organic solvent. The ink composition may be a solvent-free system.

The liquid monomer may include a (photo)polymerizable monomer including a carbon-carbon double bond. The composition may optionally further include a thermal initiator or a photoinitiator. The polymerization of the composition may be initiated by light or heat.

Details of the (first or second) semiconductor nanoparticle in the composition or in the composite are as described herein. An amount of the semiconductor nanoparticle in the composition or in the composite may be appropriately adjusted taking into consideration a desired end use (for example, a use as a luminescent type color filter). In one or more embodiments, an amount of the semiconductor nanoparticle in the respective compositions (or composites) may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on the solid content of the composition or composite (hereinafter, the solid content may be a solid content of the composition or a solid content of the composite). The amount of the semiconductor nanoparticle may be less than or equal to about 70 wt %, for example, less than or equal to about 65 wt %, less than or equal to about 60 wt %, less than or equal to about 55 wt %, or less than or equal to about 50 wt %, based on the solid content of the composition or composite. A weight percentage of a given component with respect to a total solid content in a composition may represent an amount of the given component in the composite as described herein.

In one or more embodiments, an ink composition may be a semiconductor nanoparticle-containing photoresist composition that can be used in a photolithography process. In one or more embodiments, an ink composition may be a semiconductor nanoparticle-containing composition capable of providing a pattern in a printing process (e.g., a droplet discharging method such as an inkjet printing). The composition according to one or more embodiments may not include a conjugated (or conductive) polymer (except for a cardo binder to be described herein). The composition according to one or more embodiments may include a conjugated polymer. In one or more embodiments, the conjugated polymer may include a polymer having a conjugated double bond in the main chain (e.g., polyphenylenevinylene, or the like).

In the composition according to one or more embodiments, the dispersant may ensure dispersibility of the nanoparticles. In one or more embodiments, the dispersant may be a binder (or a binder polymer). The binder may include a carboxylic acid group (e.g., in the repeating unit). The binder may be an insulating polymer. The binder may be a carboxylic acid group-containing compound (monomer or polymer).

In the composition (or the composite), an amount of the dispersant may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on the total solid content of the composition (or composite). The amount of the dispersant may be less than or equal to about 55 wt %, less than or equal to about 35 wt %, less than or equal to about 33 wt %, or less than or equal to about 30 wt %, based on the total solid content of the composition (or composite).

In the composition (or the liquid vehicle), a liquid monomer or a polymerizable (e.g., photopolymerizable) monomer (hereinafter, referred to as a monomer) including the carbon-carbon double bond may include a (e.g., photopolymerizable) (meth)acryl-containing monomer. The monomer may be a precursor for an insulating polymer.

An amount of the (photopolymerizable) monomer, based on a total weight of the composition, may be greater than or equal to about 0.5 wt %, for example, greater than or equal to about 1 wt %, greater than or equal to about 2 wt %, greater than or equal to about 3 wt %, greater than or equal to about 5 wt %, or greater than or equal to about 10 wt %. An amount of the (photopolymerizable) monomer, based on the total weight of the composition, may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %.

The (photo)initiator included in the composition may be used for (photo)polymerization of the aforementioned monomer. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, an amount of the initiator may be appropriately adjusted considering types and contents of the polymerizable monomers. In one or more embodiments, The amount of the initiator may be greater than or equal to about 0.01 wt %, for example, greater than or equal to about 1 wt %, and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on the total weight of the composition (or the total weight of the solid content), but embodiments are not limited thereto.

The composition (or composite) may further include a (poly or mono) thiol compound having at least one thiol group at the terminal end (or a moiety derived therefrom, such as a moiety produced by a reaction between a thiol and a carbon-carbon double bond, for example a sulfide group), metal oxide fine particle, or a combination thereof.

The metal oxide (fine) particle may include $TiO_2$, $SiO_2$, $BaTiO_3$, $Ba_2TiO_4$, ZnO, or a combination thereof. In the composition (or composite), an amount of the metal oxide may be greater than or equal to about 1 wt %, greater than or equal to about 2 wt %, greater than or equal to about 3 wt %, greater than or equal to about 5 wt %, or greater than or equal to about 10 wt % to less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, less than or equal to about 7 wt %, less than or equal to about 5 wt %, or less than or equal to about 3 wt %, based on the total solid content.

A diameter of the metal oxide (fine) particle is not particularly limited, and may be appropriately selected. The diameter of the metal oxide (fine) particle may be greater than or equal to about 100 nm, for example greater than or equal to about 150 nm, or greater than or equal to about 200 nm and less than or equal to about 1000 nm, or less than or equal to about 800 nm.

The polythiol compound may be a dithiol compound, a trithiol compound, a tetrathiol compound, or a combination thereof. For example, the thiol compound may be ethylene glycol bis(3-mercaptopropionate), ethylene glycol dimercapto acetate, trimethylolpropane tris(3-mercaptopropionate), pentaerythritol tetrakis(3-mercaptopropionate), pentaerythritol tetrakis(2-mercaptoacetate), 1,6-hexane dithiol, 1,3-propane dithiol, 1,2-ethane dithiol, polyethylene glycol dithiol including 1 to 10 ethylene glycol repeating units, or a combination thereof.

An amount of the thiol compound (or moieties derived therefrom) may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on the total solid content. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 18 wt %, or greater than or equal to about 20 wt %, based on the total solid content.

The composition or the liquid vehicle may include an organic solvent. The composition or the liquid vehicle may not include an organic solvent. If present, the type of the organic solvent that may be used is not particularly limited. The type and amount of the organic solvent is appropriately determined in consideration of the types and amounts of the aforementioned main components (i.e., nanoparticles, dispersants, polymerizable monomers, initiators, thiol compounds, or the like, if present) and other additives to be described herein. The composition may include an organic solvent in a residual amount except for a desired content of the (non-volatile) solid. In one or more embodiments, examples of the organic solvent may be an ethylene glycol solvent such as ethylene glycol, diethylene glycol, polyethylene glycol, and the like; a glycol ether solvent such as ethylene glycol monomethyl ether, ethylene glycol monoethyl ether, diethylene glycol monomethyl ether, ethylene glycol diethyl ether, diethylene glycol dimethyl ether, or the like; a glycol ether acetate solvent such as ethylene glycol acetate, ethylene glycol monomethylether acetate, diethylene glycol monomethylether acetate, diethylene glycol monobutylether acetate, or the like; a propylene glycol solvent such as propylene glycol, or the like; a propylene glycol ether solvent such as propylene glycol monomethyl ether, propylene glycol monoethyl ether, propylene glycol monopropyl ether, propylene glycol monobutyl ether, propylene glycol dimethylether, dipropylene glycol dimethyl ether, propylene glycol diethyl ether, dipropylene glycol diethyl ether, or the like; a propylene glycol ether acetate solvent such as propylene glycol monomethyl ether acetate, dipropylene glycol monoethyl ether acetate, or the like; an amide solvent such as N-methylpyrrolidone, dimethyl formamide, dimethyl acetamide, or the like; a ketone solvent such as methylethylketone (MEK), methylisobutylketone (MIBK), cyclohexanone, or the like; a petroleum solvent such as toluene, xylene, solvent naphtha, and the like; an ester solvent such as ethyl acetate, butyl acetate, ethyl lactate, ethyl 3-ethoxy propionate, or the like; an ether solvent such as diethyl ether, dipropyl ether, dibutyl ether, or the like; chloroform; a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon; or a combination thereof.

In addition to the aforementioned components, the composition (or composite) of one or more embodiments may further include an additive such as a light diffusing agent, a leveling agent, a coupling agent, or a combination thereof. Components (binder, monomer, solvent, additives, thiol compound, cardo binder, or the like) included in the composition of one or more embodiments may be appropriately selected, and for specific details thereof, for example, US-2017-0052444-A1 may be referred to, the entire contents of which are incorporated herein by reference.

The composition according to an embodiment may be prepared by a method that includes preparing a nanoparticle (or a nanoparticle dispersion including the semiconductor nanoparticle, the dispersant, and a solvent); and mixing the nanoparticle (or the nanoparticle dispersion) with an initiator, a polymerizable monomer (e.g., a (meth)acryl-containing monomer), optionally a thiol compound, optionally a metal oxide fine particle, optionally the dispersant, optionally the organic solvent, and optionally the additive. Each of the aforementioned components may be mixed sequentially or simultaneously, and the mixing order is not particularly limited.

The composition may provide a color conversion layer (or a patterned film of the composite) by (e.g., radical) polymerization. The color conversion layer (or the patterned film of the composite) may be produced using a photoresist composition. This method may include forming a film of the aforementioned composition on a substrate; prebaking the film according to selection; exposing a selected region of the film to light (e.g., having a wavelength of less than or equal to about 400 nm); and developing the exposed film with an alkali developing solution to obtain a pattern of a quantum dot-polymer composite.

The composition of an embodiment may be applied to a predetermined thickness on a substrate using an appropriate method such as spin coating or slit coating to form a film. The formed film may be optionally subjected to a pre-baking (PRB) step. The pre-baking may be performed by selecting an appropriate condition from known conditions of a temperature, time, an atmosphere, orthe like.

The formed (and optionally prebaked) film may be exposed to light having a predetermined wavelength under a mask having a predetermined pattern. A wavelength and intensity of the light may be selected considering types and contents of the photoinitiator, types and contents of the quantum dots, or the like.

The exposed film may be treated with an alkali developing solution (e.g., dipping or spraying) to dissolve an unexposed region and obtain a desired pattern. The obtained pattern may be, optionally, post-baked (POB) to improve crack resistance and solvent resistance of the pattern, for example, at a temperature of about 150° C. to about 230° C. for a predetermined time (e.g., greater than or equal to about 10 minutes, or greater than or equal to about 20 minutes).

When the color conversion layer or the patterned film of the nanoparticle composite has a plurality of repeating sections (that is, color conversion regions), each repeating section may be formed by preparing a plurality of compositions including quantum dots (e.g., red light emitting quantum dots, green light emitting quantum dots, or optionally, blue light emitting quantum dots) having desired luminous properties (photoluminescence peak wavelength or the like) and repeating the aforementioned pattern-forming process as many times as necessary (e.g., 2 times or more, or 3 times or more) for each composition, resultantly obtaining a nanoparticle-polymer composite having a desired pattern. For example, the nanoparticle-polymer composite may have a pattern of at least two repeating color sections (e.g., RGB color sections). This nanoparticle-polymer composite pattern may be used as a photoluminescence type color filter in a display device.

The color conversion layer or patterned film of the nanoparticle composite may be produced using an ink composition configured to form a pattern in an inkjet manner. Such a method may include preparing an ink composition according to one or more embodiments, providing a substrate (e.g., with pixel areas patterned by electrodes and optionally banks or trench type partition walls, or the like), and depositing an ink composition on the substrate (or the pixel area) to form, for example, a first composite layer (or first region). The method may include depositing an ink composition on the substrate (or the pixel area) to form, for example, a second composite layer (or second region). The forming of the first composite layer and forming of the second composite layer may be simultaneously or sequentially carried out.

The depositing of the ink composition may be performed using an appropriate liquid crystal discharger, for example, an inkjet or nozzle printing system (having an ink storage and at least one print head). The deposited ink composition may provide a (first or second) composite layer through the solvent removal and polymerization by the heating. The method may provide a highly precise nanoparticle-polymer composite film or patterned film for a short time by the simple method.

In the nanoparticle-polymer composite (e.g., a first composite) of one or more embodiments, the (polymer) matrix may include the components described herein with respect to the composition. In the composite, an amount of the matrix, based on a total weight of the composite, may be greater than or equal to about 10 wt %, greater than or equal to about 20 wt %, greater than or equal to about 30 wt %, greater than or equal to about 40 wt %, greater than or equal to about 50 wt %, or greater than or equal to about 60 wt %. The amount of the matrix may be, based on a total weight of the composite, less than or equal to about 95 wt %, less than or equal to about 90 wt %, less than or equal to about 80 wt %, less than or equal to about 70 wt %, less than or equal to about 60 wt %, or less than or equal to about 50 wt %.

The (polymer) matrix may include at least one of a dispersant (e.g., a carboxylic acid group-containing binder polymer), a polymerization product (e.g., an insulating polymer) of a polymerizable monomer including (at least one, for example, at least two, at least three, at least four, or at least five) carbon-carbon double bonds, and a polymerization product of the polymerizable monomer and a polythiol compound having at least two thiol groups at a terminal end. The matrix may include a linear polymer, a crosslinked polymer, or a combination thereof. The (polymer) matrix may not include a conjugated polymer (excluding cardo resin). The matrix may include a conjugated polymer.

The crosslinked polymer may include a thiol-ene resin, a crosslinked poly(meth)acrylate, a crosslinked polyurethane, a crosslinked epoxy resin, a crosslinked vinyl polymer, a crosslinked silicone resin, or a combination thereof. In one or more embodiments, the crosslinked polymer may be a polymerization product of the aforementioned polymerizable monomers and optionally a polythiol compound.

The linear polymer may include a repeating unit derived from a carbon-carbon unsaturated bond (e.g., a carbon-carbon double bond). The repeating unit may include a carboxylic acid group. The linear polymer may include an ethylene repeating unit.

The (polymer) matrix may include a carboxylic acid group-containing compound (e.g., a binder, a binder polymer, or a dispersant) (e.g., for dispersion of nanoparticles or a binder).

The (first or second) composite (or film or pattern thereof) may have, for example, a thickness of less than or equal to about 25 μm, less than or equal to about 20 μm, less than or equal to about 15 μm, less than or equal to about 10 μm, less than or equal to about 8 μm, or less than or equal to about 7 μm to greater than about 2 μm, for example, greater than or equal to about 3 μm, greater than or equal to about 3.5 μm, greater than or equal to about 4 μm, greater than or equal to about 5 μm, greater than or equal to about 6 μm, greater than or equal to about 7 μm, greater than or equal to about 8 μm, greater than or equal to about 9 μm, or greater than or equal to about 10 μm.

In the color conversion panel of an embodiment, an amount of the semiconductor nanoparticles (e.g., first semiconductor nanoparticles, second semiconductor nanoparticles, or both) in each pixel may be greater than or equal to about 3% by weight, greater than or equal to about 5% by weight, greater than or equal to about 10% by weight, greater than or equal to about 15% by weight, or greater than or equal to about 20% by weight. In the color conversion panel of an embodiment, an amount of the semiconductor nanoparticle (e.g., first semiconductor nanoparticles, second semiconductor nanoparticles, or both) in each pixel may be less than or equal to about 40% by weight, less than or equal to about 35% by weight, less than or equal to about 30% by weight, less than or equal to about 25% by weight.

In the color conversion panel of an embodiment, an amount of the metal oxide particles (e.g., a titanium oxide particle) in the entire color conversion layer or each pixel may be greater than or equal to about 0.5% by weight, greater than or equal to about 1% by weight, greater than or equal to about 2% by weight, greater than or equal to about 3% by weight (based on the total weight of the composites contained in each). In the color conversion panel of an embodiment, the amount of the metal oxide particle (e.g., titanium oxide particles) in the color conversion layer or each pixel may be less than or equal to about 7% by weight, less than or equal to about 6% by weight, less than or equal to about 5% by weight, less than or equal to about 4% by weight, less than or equal to about 3% by weight, or less than or equal to about 2% by weight.

The aforementioned display panel may be included in an electronic device. Such an electronic device may include a display device, a light emitting diode (LED), an organic light emitting diode (OLED), a quantum dot LED, a sensor, a solar cell, an imaging sensor, a photodetector, or a liquid crystal display device, but is not limited thereto. The aforementioned quantum dots may be included in an electronic apparatus. Such an electronic apparatus may include a portable terminal device, a monitor, a notebook personal computer (PC), a television, an electronic display, a camera, an automobile, and the like, but are not limited thereto. The electronic apparatus may be a portable terminal device including a display device (or light emitting device) including quantum dots, a monitor, a notebook PC, or a television. The electronic apparatus may be a camera or a portable terminal device including an image sensor including quantum dots. The electronic apparatus may be a camera or a vehicle. The electronic apparatus may include a photodetector including the quantum dots.

Hereinafter, the embodiments are illustrated in more detail with reference to examples. However, they are exemplary embodiments of the present invention, and the present invention is not limited thereto.

EXAMPLES

Analysis Methods

[1] Ultraviolet (UV)-Visible (Vis) Absorption Spectroscopy Analysis

An Agilent Cary5000 spectrometer was used to perform UV-Visible absorption spectroscopy analysis.

[2] Photoluminescence Spectroscopy Analysis

A photoluminescence (PL) spectroscopy analysis was carried out by using a Hitachi F-7000 spectrophotometer.

[3] Inductively Coupled Plasma-atomic emission spectroscopy (ICP-AES) Analysis

An inductively coupled plasma-atomic emission spectroscopy (ICP-AES) analysis was performed using Shimadzu ICPS-8100.

[4] Blue Light Absorbance for Composite

An amount of incident light of a wavelength of 450 nm (B) was measured by using an integrating hemisphere of an absolute quantum efficiency-measuring device (e.g., QE-2100, Otsuka Electronics Co., Ltd.). Subsequently, a QD polymer composite was placed in the integrating hemisphere, and then, the incident light was irradiated to measure an amount of first light from the composite (A), and an amount of the incident light passing through the composite (B') were measured, respectively.

Using the measured amounts of light, an incident light absorbance and the light conversion efficiency were calculated according to Equation 3:

$$\text{incident light absorbance (\%)}=[(B-B')/B]\times 100\% \qquad \text{Equation 3}$$

wherein

B is an amount of incident light provided with the first composite, and

B' is an amount of incident light passing through the first composite.

[5] photoluminescence quantum yield (PLQY) is measured by using a PLQY spectrometer (Quantaurus-QY, C11347, Hamamatsu Photonics). The transient photoluminescence is measured by using fluorescence lifetime spectrometer (FluoTime 300, Pi-coQuant).

Preparation Examples 1 to 3

A glass substrate of ITO electrode pattern (50 mm×50 mm×0.5 mm) was ultrasonically cleaned in acetone, isopropyl alcohol, and pure water for 15 minutes each, and then cleaned by exposure of UV ozone for 30 minutes.

Subsequently, HAT-CN was deposited to form a hole injection layer of a thickness of 100 angstrom, and NPB was vapor-deposited to form a first hole transporting layer at a thickness of about 500 angstrom. Then, TCTA was vapor deposited to form a second hole transporting layer at a thickness of about 50 angstrom, and then mCP was vapor deposited to form an electron blocking layer at a thickness of 50 angstrom, on the ITO electrode (anode) of the glass substrate in this stated order.

Thereafter, a host, a sensitizer (D1), and an emitter (D2) shown below were co-deposited at a weight ratio of 89.5:10:0.5 (for Preparation Example 1), 89:10:1 (for Preparation Example 2), or 88.5:10:1.5 (for Preparation Example 3) to thereby form an emission layer having a thickness of 400 angstrom.

Atop the emission layer, DBFPO was deposited to form a hole blocking layer at a thickness of 100 angstrom, DBFPO and Liq were co-deposited to form an electron transporting layer at a thickness of 300 angstrom, Liq was deposited to form an electron injection layer at a thickness of 10 angstrom, and Al was deposited to form a cathode at a thickness of 1000 angstrom, thereby completing the manufacture of an organic light-emitting device.

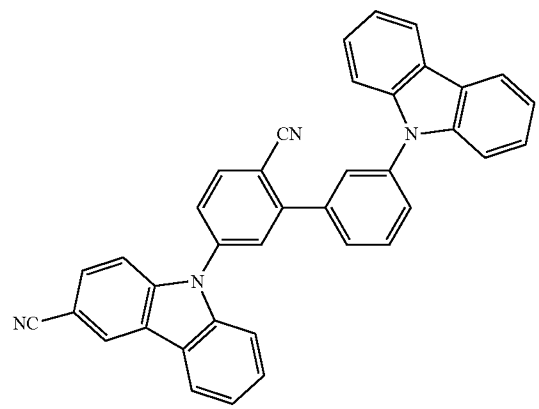

Host

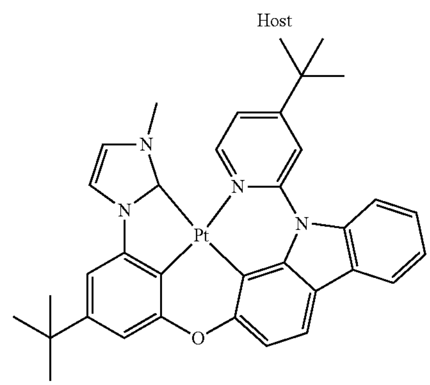

D1

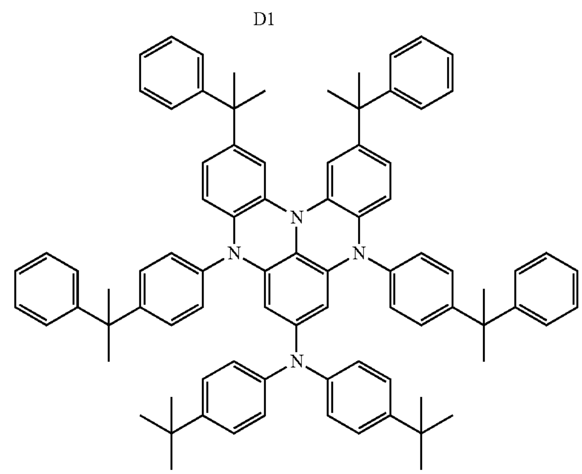

D2

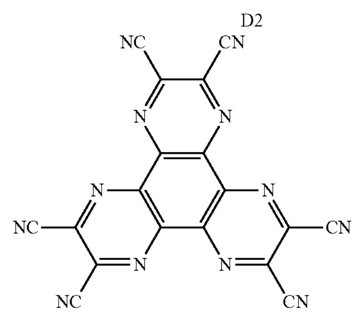

HAT-CN

-continued

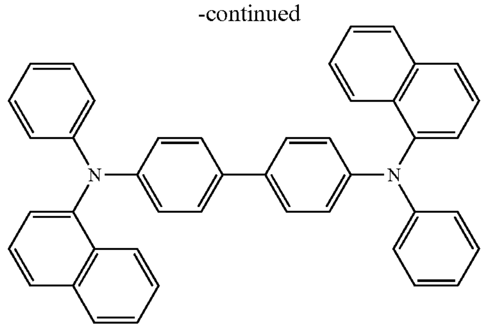

NPB

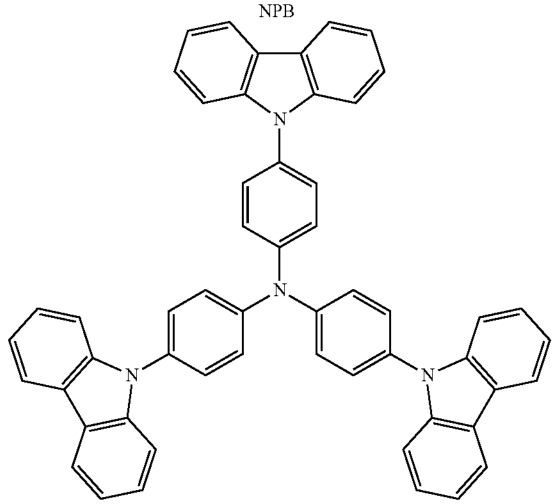

TCTA

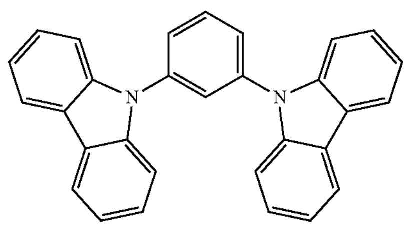

mCP

-continued

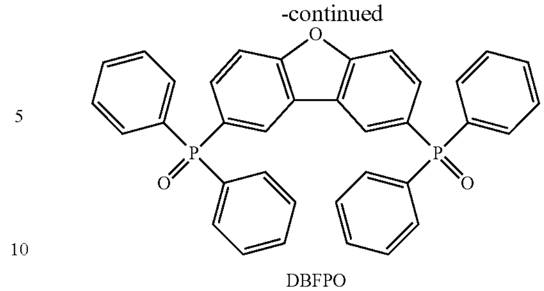

DBFPO

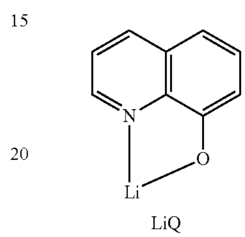

LiQ

The layered structure of the organic light-emitting device is as follows: ITO (50 nm)/HIL (HAT-CN, 10 nm)/HTL1 (NPB, 50 nm)/HTL2(TCTA, 5 nm)/EBL (mCP, 5 nm)/EML (40 nm)/HBL (DBFPO, 10 nm)/electron transport layer (DBFPO:LiQ, 30 nm)/electron injection layer (LiQ, 1 nm)/Al (100 nm)

For the prepared organic light-emitting device, current density-voltage-luminance (J-V-L) characteristics were measured by using source meter (2636B, Keith-ley) and radio spectrometer (SR-3AR, Topcon).

Preparation Comp. Example 1 and Preparation Comp. Example 2

A hyper BOLEDs were prepared except that the amounts of the emitter and the sensitizer are controlled to have a weight ratio of a host:a sensitizer (D1):an emitter (D2) being 87.5:10:2.5 (for Preparation Comp. Example 1) and 87:10:3 (for Preparation Comp. Example 2), respectively. The electroluminescent properties of the prepared BOLEDs were measured and the results are shown in Table 1.

TABLE 1

| | EL λ (nm) | FWHM (nm) | FWQM (nm) | Max EQE (%) | Current efficiency (max) (Cd/A) | CIEy | Decay time (μs) |
|---|---|---|---|---|---|---|---|
| Prep. Example 1 | 461 | 23.4 | 50 | 21.9 | 21.5 | 0.116 | 3.3 |
| Prep. Example 2 | 462 | 21.9 | 44 | 23.2 | 21.0 | 0.112 | 5.9 |
| Prep. Example 3 | 464 | 37 | 54 | 22.7 | 24.2 | 0.157 | 4.6 |
| Prep. Comparative Example 1 | 469 | 24.7 | 59 | 14.9 | 21.0 | 0.225 | 0.3 |
| Prep. Comparative Example 2 | 473 | 28.6 | 62 | 17.4 | 26.3 | 0.264 | 0.3 |

Preparation Example 4: [Preparation of a First Semiconductor Nanoparticle, AIGS_G]

Silver acetate was dissolved in oleylamine to provide a 0.06 molar (M) silver precursor containing solution (hereinafter, abbreviated as "silver precursor"). Sulfur was dissolved in oleylamine to provide a 1 M sulfur precursor containing solution (hereinafter, abbreviated as "sulfur precursor"). Indium chloride was dissolved in ethanol to provide a 1 M indium precursor containing solution (hereinafter, abbreviated as an indium precursor).

Gallium acetylacetonate, octadecene (ODE), and dodecanethiol were placed in a 100 milliliter (mL) reaction flask and heated at 120° C. for 10 minutes under vacuum. After cooling to room temperature and introducing nitrogen into the flask, the silver precursor, the sulfur precursor, and the indium precursor were added to the flask. The flask was heated at a reaction temperature of 210° C., and a reaction proceeded for 60 minutes. After lowering the temperature of the flask to 180° C., trioctylphosphine (TOP) was added, and then hexane and ethanol were added to the mixture to promote precipitation. The first semiconductor nanocrystals were separated via centrifugation and dispersed in toluene.

A mole ratio among the indium precursor, the gallium precursor, and the sulfur precursor as used (added) was 1:2.3:4.8.

Gallium chloride was dissolved in toluene to provide a 4.5 M gallium precursor containing solution (hereinafter, abbreviated as a "gallium precursor").

Dimethylthiourea (DMTU), oleyl amine, and dodecanethiol were placed in a reaction flask, and the mixture was vacuum-treated at 120° C. for 10 minutes. Nitrogen gas is introduced into the reaction flask and the flask was heated to 240° C. (a first temperature), the first semiconductor nanocrystal obtained as Reference Example 1 (having a maximum emission wavelength of about 524 nm and a full width at half maximum of about 44 nm) and the gallium precursor were then added to the flask. The reaction flask was heated to 320° C. (a second temperature) and the reaction proceeded for about 10 minutes (a first reaction time). The reaction flask was cooled to 180° C., and trioctylphosphine was added. The reaction solution was allowed to cool to room temperature. Hexane and ethanol were added to the reaction mixture to facilitate precipitation of a first semiconductor nanoparticle, which was separated via centrifugation and dispersed in toluene.

A mole ratio of the gallium precursor to the sulfur precursor as used (added) was 1.1:1.

Figure 10A:
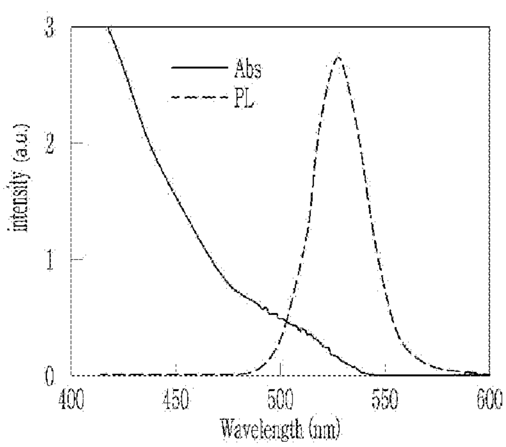
FIG. 10A is a photoluminescent spectrum and a UV-Vis absorption spectrum of the first semiconductor nanoparticle (AIGS_G) prepared in preparation Example 4.

An ICP-AES analysis was performed with respect to the obtained first semiconductor nanoparticle (AIGS_G), and the results are shown in Table 2. A photoluminescence spectroscopy analysis and an UV-Vis absorption spectroscopy were performed with respect to the obtained first semiconductor nanoparticles, and the results are shown in Table 3 and FIG. 10A.

The first semiconductor nanoparticle (AIGS_G) thus obtained exhibited a percentage of the band-edge emission that is greater than or equal to about 99%. The first semiconductor nanoparticle (AIGS_G) exhibited a relative band-edge emission intensity defined according to Equation 2 of greater than or equal to about 100 (e.g., about 210):

$$\text{relative band-edge emission intensity} = A1/A2 \qquad \text{Equation 2}$$

wherein, A1 is an intensity of the spectrum at a maximum emission wavelength, and A2 is a maximum intensity of the spectrum in a range of the maximum emission wavelength+greater than or equal to about 80 nm, e.g., about 100 nm.

TABLE 2

| | ICP mole ratio | | | | | | | |
|---|---|---|---|---|---|---|---|---|
| | Ag:S | In:S | Ga:S | Ga:(In + Ga) | (In + Ga)/Ag | (In + Ga):S | S:(AIG)[1] | CBV[2] |
| Preparation Example 4 | 0.31:1 | 0.11:1 | 0.55:1 | 0.84:1 | 2.1:1 | 0.66:1 | 1.03:1 | 1.15 |
| Preparation Comp. Ex 3-1 | 0.025:1 | 0.021:1 | 1.03:1 | 0.98:1 | 42.3:1 | 1.051:1 | 0.93:1 | 1.59 |

Note 1:
S:AIG is mole ratio of sulfur to a sum of silver, indium, and gallium.
Note 2:
CBV is charge balance value according to Equation 1.

Preparation Comparative Example 3-1

The semiconductor nanoparticle was prepared in a similar manner as Preparation Example 4, except that a mixture of gallium chloride and gallium acetylacetonate (mixing mole ratio=1:1) were used as a gallium precursor, the second temperature was 200° C., and the first reaction time was 80 minutes.

An ICP-AES analysis was performed with respect to the obtained semiconductor nanoparticle, and the results are shown in Table 2. A photoluminescence spectroscopy analysis and an UV-Vis absorption spectroscopy were performed with respect to the obtained semiconductor nanoparticle, and the results are shown in Table 3.

Preparation Comparative Example 3-2

Zinc acetate and oleic acid were dissolved in octadecene in a 250 mL reaction flask, and the solution was vacuum-treated at 120° C. and cooled to room temperature to obtain a zinc oleate solution. To the reaction flask indium acetate and lauric acid were added and the reaction mixture heated at 120° C. under vacuum. After 1 hour, nitrogen gas was introduced into the flask. The reaction flask was then heated to a temperature of 250° C., and a mixed solution of tris(trimethylsilyl)phosphine ($TMS_3P$) and trioctylphosphine was rapidly injected into the reaction flask, and a reaction was conducted. The reaction solution was rapidly cooled to room temperature and acetone was added to facilitate formation of a precipitate. The precipitate was separated via a centrifuge to obtain the core including the InP semiconductor nanocrystal (or referred to as the InP semiconductor nanocrystal core).

Selenium was dispersed in trioctylphosphine to prepare a 0.4 M Se/TOP stock solution, and sulfur was dispersed in trioctylphosphine to prepare a 2 M S/TOP stock solution.

Zinc acetate and oleic acid were dissolved in trioctylamine in a 200 mL reaction flask, and the solution was vacuum-treated at 120° C. for 10 minutes. Nitrogen was then introduced into the reaction flask. The reaction flask was heated to 320° C., the toluene dispersion of the InP semiconductor nanocrystal core prepared above, the Se/TOP stock solution, the S/TOP stock solution were added to the reaction flask and a reaction proceeded.

After the completion of the reaction, the reaction solution is cooled to room temperature and an excess amount of ethanol was added to facilitate the formation of a precipitate, and the green light emitting semiconductor nanoparticles (InP_G) were centrifuged and dried.

Figure 10B:
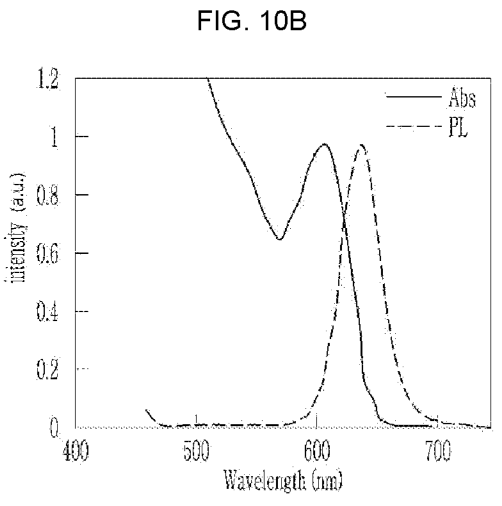
FIG. 10B is a photoluminescent spectrum and a UV-Vis absorption spectrum of the second semiconductor nanoparticle (InP_R) prepared in preparation Example 5.
Figure 10C:
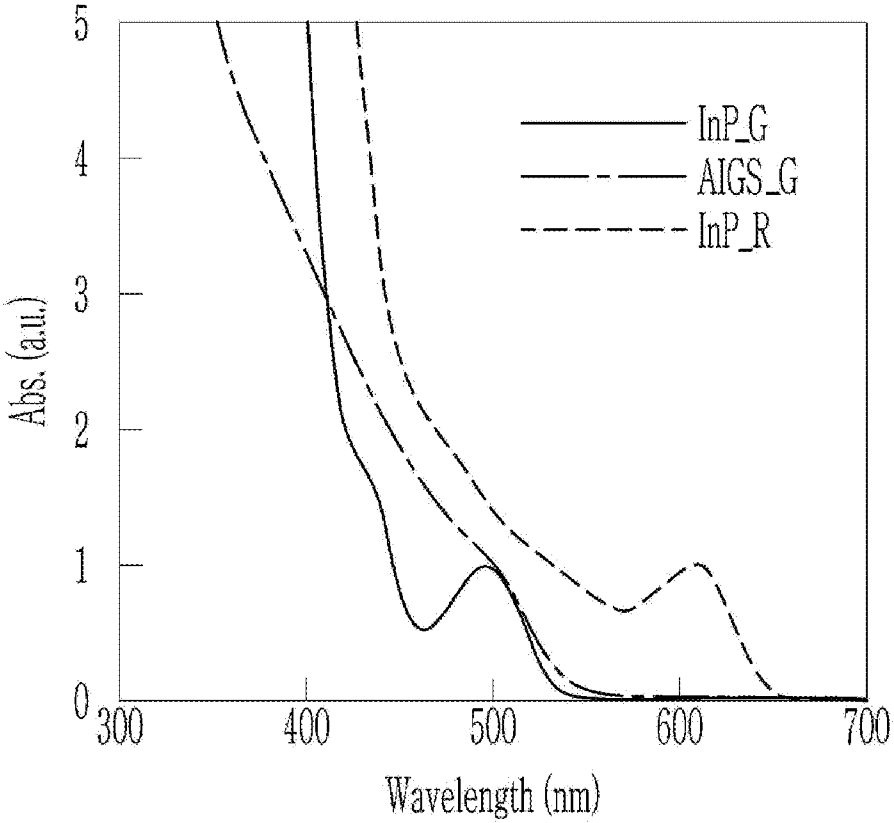
FIG. 10C shows UV-Vis absorption spectrums of the semiconductor nanoparticle prepared in the preparation Examples and preparation Comparative Example.

A photoluminescence spectroscopy analysis and an UV-Vis absorption spectroscopy were performed with respect to the obtained semiconductor nanoparticles, and the results are shown in Table 3 and FIG. 10C.

Preparation Example 5: Preparation of Second Semiconductor Nanoparticle (InP_R)

Indium acetate and palmitic acid were dissolved in 1-octadecene in a 200 milliliters (mL) reaction flask, and the solution was subjected to vacuum at 120° C. for one hour. A mole ratio of indium to palmitic acid of 1:3 was used. Nitrogen gas was introduced into the flask, and the flask was heated to 280° C. A mixed solution of tris(trimethylsilyl) phosphine ($TMS_3P$) and trioctylphosphine (TOP) was quickly injected, and the reaction proceeds for a predetermined time (e.g., for about 20 minutes). The reaction mixture was rapidly cooled to room temperature, and acetone was added to facilitate the precipitation of nanocrystals, which were separated by centrifugation and dispersed in toluene to obtain a toluene dispersion of InP core nanocrystals. The amount of the $TMS_3P$ added to the reaction flask was about 0.5 moles per one mole of indium. The amount of the trioctylphosphine added to the reaction flask was about 0.1 moles to about 10 moles (e.g., about 0.5 moles) per one mole of indium. An average particle size of the InP core was about 3.6 nanometers (nm).

Selenium and sulfur were dispersed in trioctylphosphine (TOP) to obtain a Se/TOP stock solution and a S/TOP stock solution, respectively.

In a 200 mL reaction flask, 7.2 mmol of zinc acetate and oleic acid were dissolved in trioctyl amine and the solution was subjected to vacuum at 120° C. for 30 minutes, then heated under a nitrogen atmosphere to 280° C. for 10 minutes to prepare a reaction medium including a zinc precursor.

The reaction medium including the zinc precursor was cooled to about 180° C. and a toluene dispersion of the prepared InP semiconductor nanocrystal core was injected into the reaction medium, which was then heated to 320° C. and the Se/TOP stock solution, and optionally, an additional zinc precursor were added to the reaction flask. A reaction was carried out for about 30 minutes. Then, the S/TOP stock solution and an additional zinc precursor prepared separately in the same manner as disclosed were injected to the reaction mixture and a reaction was carried out for about 60 minutes. The resulting mixture was cooled rapidly to room temperature.

An excess amount of ethanol was added to the reaction mixture to facilitate precipitation including the final second semiconductor nanoparticle having a structure of InP/ZnSe/ZnS. The precipitate was separated by centrifuge, the supernatant is discarded, and the precipitate is dried to obtain the second semiconductor nanoparticle (InP_R).

A UV-Vis absorption spectroscopy analysis and ICP-AES analysis of the prepared quantum dots is performed and the results are listed in Table 3 and FIG. 10B.

TABLE 3

| | Peak emission wavelength (PWL) (nm) | Quantum yield (QY) | fwhm (nm) |
|---|---|---|---|
| Prep. Example 4 | 530 nm | 92% | 30 nm |
| Prep. Comparative Example 3-1 | 529 nm | 6.1% | greater than 40 nm |
| Prep. Comparative Example 3-2 | 525 nm | 95% | 35 nm |
| Prep. Example 5 | 640 nm | 95% | 37 nm |

Experimental Example 1

10 micron-thick QD-polymer composites were produced using the green light emitting first semiconductor nanoparticles of Preparation Example 4, the red light emitting second semiconductor nanoparticles of Preparation Example 5, and the semiconductor nanoparticles of Preparation Comparative Example 3-2, respectively, and a relative absorption is measured using the hyper BOLEDs of Preparation Example 1-3, and Preparation comparative examples 1 and 2, respectively.

For Preparation Comparative Example 3-2, when the Hyper BOLED light source of Preparation Example 3 is used, the absorbance is set to 1. The results are summarized in FIG. 11. When Preparation Comparative Example 3-1 was used, the absorption was significantly lower than Preparation Comparative Example 3-2.

Figure 11:
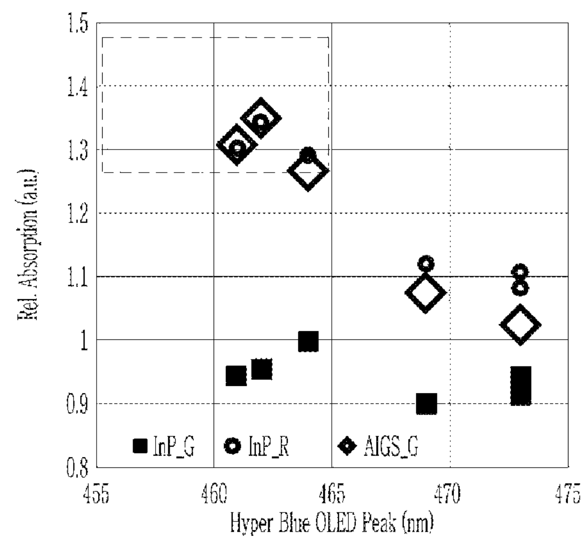
FIG. 11 shows a relative absorption of the semiconductor nanoparticles used in Example and Comparative Example with respect to the blue light provided from the blue light emitting unit.

From the results of FIG. 11, it can be understood that the semiconductor nanoparticles of Preparation Example 4 exhibit significantly improved absorption compared to the semiconductor nanoparticles of Preparation Comparative Example 3-2. Moreover, the absorption of the green light-emitting first semiconductor nanoparticles of Preparation Example 4 is comparable to the absorption of the red light emitting second semiconductor nanoparticles of Preparation Example 5.

Examples 1 to 3 and Comparative Examples 6, and Comparative Example 7

A color conversion panel including patterns of semiconductor nanoparticle composite was prepared using the green light emitting first semiconductor nanoparticles of Preparation Example 4 and the red light emitting second semiconductor nanoparticles of Preparation Example 5.

The luminance of white light emitted by the combination of the prepared color conversion panel with the light-emitting panel including the organic light-emitting devices of Preparation Example 1, Preparation Example 2, Preparation Example 3, and Preparation Comparative Example 1 or Preparation Comparative Example 2 is measured and the results are summarized in Table 4.

Comparative Examples 1 to 5

A color conversion panel is manufactured in the same manner as in the Examples, except that the first semiconductor nanoparticles of Preparation Comparative Example 3-2 are used instead of the green light emitting first semiconductor nanoparticles of Preparation Example 4.

The luminance of white light emitted by the combination of the manufactured color conversion panel with the light-emitting panel including any one of the Hyper BOLED light emitting devices of Preparation Examples 1 to 3 and Preparation Comparative Examples 1 and 2 measured and is summarized in Table 4 below.

TABLE 4

| | Blue light emitting unit of the light emitting panel, BOLED | First semiconductor nanoparticle in the color conversion panel | Luminance, nit (full white) |
|---|---|---|---|
| Example 1 | Prep. Example 1 | Prep. Example 4 | 317 |
| Example 2 | Prep. Example 2 | Prep. Example 4 | 321 |
| Example 3 | Prep. Example 3 | Prep. Example 4 | 308 |
| Comp. Example 6 | Prep. Comparative Example 1 | Prep. Example 4 | 295 |
| Comp. Example 7 | Prep. Comparative Example 2 | Prep. Example 4 | 297 |
| Comp. Example 1 | Prep. Example 1 | Prep. Comparative Example 3-2 | 284 |
| Comp. Example 2 | Prep. Example 2 | Prep. Comparative Example 3-2 | 286 |
| Comp. Example 3 | Prep. Example 3 | Prep. Comparative Example 3-2 | 285 |
| Comp. Example 4 | Prep. Comparative Example 1 | Prep. Comparative Example 3-2 | 280 |
| Comp. Example 5 | Prep. Comparative Example 2 | Prep. Comparative Example 3-2 | 284 |

As can be seen from the results of Table 4, the display panels of Examples 1 to 3 exhibit significantly improved luminance compared to the display panels of the comparative examples. It was also confirmed that when the first semiconductor nanoparticle of Preparation Comparative Example 3-1 was used instead of Preparation Comparative Example 3-2, the resulting display panel exhibits significantly lower luminance than Comparative Example 2 or Comparative Example 3.

Experimental Example 2

The color conversion based on BT 2020 (CIE 1976) was measured for the display panels of Examples 1 to 3, Comparative Examples 6 and 7, and the results are summarized in Table 5.

TABLE 5

| | Color reproducibility |
|---|---|
| Example 1 | 88.3% |
| Example 2 | 88.5% |
| Example 3 | 84.8% |
| Comp. Example 6 | 78.2% |
| Comp. Example 7 | 77.9% |

From the results of the above table, it can be understood that the display panel of the Examples shows a relatively improved color reproduction compared to the display panel of the comparative examples.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display panel comprising a color conversion panel, and a light emitting panel with a surface opposite a surface of the color conversion panel, wherein the light emitting panel comprises a light emitting device and the light emitting device comprises a first electrode, a second electrode, and a blue light emitting unit disposed between the first electrode and the second electrode, and the blue light emitting unit is configured to emit blue light and includes an organic light emitting layer, wherein the organic light emitting layer comprises a host, a sensitizer, and an emitter that includes a condensed ring compound;

wherein the blue light has a peak emission wavelength of greater than or equal to about 450 nanometers and less than or equal to about 465 nanometers and a full width at quarter maximum (FWQM) of greater than or equal to about 20 nanometers and less than or equal to about 60 nanometers, wherein the color conversion panel comprises a color conversion layer comprising at least two color conversion regions, and a partition wall defining the at least two color conversion regions of the color conversion layer, wherein the color conversion region comprises a first region corresponding to a green pixel, and a second region corresponding to a red pixel, wherein the first region comprises a first composite including a matrix and a first semiconductor nanoparticle dispersed in the matrix, and optionally titanium oxide particles, wherein the first semiconductor nanoparticles comprises a Group I-III-VI compound comprising silver, indium, gallium, and sulfur, and is configured to emit green light, wherein the green light has a peak emission wavelength of greater than or equal to about 500 nanometers and less than or equal to about 550 nanometers, and a full width at half maximum (FWHM) of less than or equal to about 40 nanometers, and wherein the second region comprises a second composite including a matrix and a second semiconductor nanoparticle dispersed in the matrix, and optionally titanium oxide particles, wherein the second semiconductor nanoparticles comprise a Group III-V compound comprising indium and phosphorus, and is configured to emit red light, wherein the red light has a peak emission wavelength of greater than or equal to about 600 nanometers and less than or equal to about 650 nanometers.

2. The display panel of claim 1, wherein the host comprises an electron transport host, a hole transport host, or a combination thereof, and the sensitizer comprises an organic metal compound that comprises iridium (Ir), platinum (Pt), palladium (Pd), osmium (Os), titanium (Ti), gold (Au), silver (Ag), copper (Cu), ruthenium (Ru), rhenium (Re), rhodium (Rh), turbium (Tb), thallium (Tm), or any combination thereof.

3. The display panel of claim 1, wherein a decay time of the blue light emitting unit, as measured by time-resolved photoluminescence analysis, is from about 5 nanoseconds to about 10 microseconds.

4. The display panel of claim 1, wherein in a luminescent spectrum of the blue light, a ratio of an intensity at 500 nanometers to a maximum intensity is less than or equal to about 0.4:1.

5. The display panel of claim 1, wherein the light emitting panel further comprises a green light emitting unit, and the green light emitting unit is stacked with the blue light emitting unit.

6. The display panel of claim 1, wherein the first semiconductor nanoparticle exhibits a charge balance value defined by Equation 1 that is greater than or equal to about 0.9 and less than or equal to about 1.45:

charge balance value={[Ag]+3([In]+[Ga])}/2[S] Equation 1 in Equation 1, [Ag], [In], [Ga], and [S] are molar amounts of silver, indium, gallium, and sulfur, respectively, in the first semiconductor nanoparticle.

7. The display panel of claim 6, wherein the charge balance value is greater than or equal to about 0.97 and less than or equal to about 1.2.

8. The display panel of claim 1, wherein the first semiconductor nanoparticle have a quantum yield of greater than or equal to about 70% and less than or equal to about 100% or a full width at half maximum of greater than or equal to about 10 nanometers and less than or equal to about 35 nanometers.

9. The display panel of claim 1, wherein at least about 97% of emission from the first semiconductor nanoparticles is band-edge emission, or wherein in a photoluminescence spectrum of the first semiconductor nanoparticle, a relative band-edge emission intensity defined by Equation 2 is greater than about 20:

relative band-edge emission intensity=$A1/A2$ Equation 1 wherein

A1 is an intensity at a maximum emission wavelength, and

A2 is a maximum intensity in a tail wavelength range of the maximum emission wavelength+greater than or equal to about 80 nm.

10. The display panel of claim 1, wherein in the first semiconductor nanoparticle a mole ratio of sulfur to a sum of silver, indium, and gallium, [S:(Ag+In+Ga)], is greater than or equal to about 0.65:1 and less than or equal to about 1.35:1;

a mole ratio of a sum of indium and gallium to silver, [(In+Ga):Ag], is greater than or equal to about 1.8:1 and less than or equal to about 3.5:1; or a mole ratio of gallium to sulfur is greater than or equal to about 0.56:1 and less than or equal to about 1:1.

11. The display panel of claim 1, wherein the first semiconductor nanoparticle comprise a first semiconductor nanocrystal including silver, indium, gallium, and sulfur, and a semiconductor nanocrystal layer disposed on the first semiconductor nanocrystal, the semiconductor nanocrystal layer including zinc and sulfur.

12. The display panel of claim 1, wherein the second semiconductor nanoparticle has a size of greater than or equal to about 6 nanometers and less than or equal to about 8.5 nanometers.

13. The display panel of claim 1, wherein the second semiconductor nanoparticles comprise a semiconductor nanocrystal core comprising a Group III-V compound and a semiconductor nanocrystal shell comprising a zinc chalcogenide, wherein the Group III-V compound comprises indium and phosphorus, wherein the zinc chalcogenide comprises zinc, selenium, and sulfur, a mole ratio of sulfur to indium is greater than or equal to about 3:1 and less than or equal to about 6:1;

a mole ratio of sulfur to selenium is greater than or equal to about 0.69:1 and less than or equal to about 0.89:1; or a mole ratio of zinc to indium of greater than or equal to about 10:1 and less than or equal to about 12.4:1, and wherein the second semiconductor nanoparticle does not comprise cadmium.

14. The display panel of claim 1, wherein in the color conversion layer the first region includes the titanium oxide particles, and an amount ratio of silver (atomic %) to titanium (atomic %) is greater than or equal to about 0.1:1 and less than or equal to about 3:1; or an amount ratio of gallium (atomic %) to titanium (atomic %) is greater than or equal to about 0.1:1 and less than or equal to about 1.5:1.

15. The display panel of claim 1, wherein the blue light has a wavelength of greater than or equal to about 455 nanometers and less than or equal to about 460 nanometers, and the color conversion layer has a ratio of a blue light absorption of the first region to a blue light absorption of the second region that is in a range of from about 0.88:1 to about 1.2:1.

16. The display panel of claim 1, wherein the display panel has a luminance of white light that is greater than or equal to about 300 candela per square meter, and a color reproducibility that is greater than or equal to about 80% under the BT2020 standard.

17. The display panel of claim 1, wherein the blue light emitting unit is configured to exhibit a maximum external quantum efficiency of greater than or equal to about 15% and less than or equal to about 40%, or wherein the blue light has a full width at half maximum of greater than or equal to about 38 nanometers.

18. An electronic apparatus comprising the display panel of claim 1.

19. The electronic apparatus of claim 18, wherein the electronic apparatus comprises a hand-held terminal device, a monitor, a notebook computer, a television set, an electronic display board, a camera, or an electronic component for a vehicle.

20. A display panel comprising a color conversion panel, and a light emitting panel with a surface opposite a surface of the color conversion panel, wherein the light emitting panel comprises a light emitting device and the light emitting device comprises a first electrode, a second electrode, and a blue light emitting unit disposed between the first electrode and the second electrode, and the blue light emitting unit is configured to emit blue light and includes an organic light emitting layer, wherein the organic light emitting layer comprises a host, a sensitizer, and an emitter, emitter that includes a condensed ring compound;

wherein the blue light has a peak emission wavelength of greater than or equal to about 450 nanometers and less than or equal to about 465 nanometers and a full width at quarter maximum (FWQM) of greater than or equal to about 20 nanometers and less than or equal to about 60 nanometers, wherein the color conversion panel comprises a color conversion layer comprising at least two color conversion regions, and a partition wall defining the at least two color conversion regions of the color conversion layer, wherein the color conversion region comprises a first region corresponding to a green pixel, and a second region corresponding to a red pixel, wherein the first region comprises a first composite including a matrix and a first semiconductor nanoparticle dispersed in the matrix, and optionally titanium oxide particles, wherein the first semiconductor nanoparticles comprises a Group I-III-VI compound comprising silver, indium, gallium, and sulfur, and is configured to emit green light, wherein the first semiconductor nanoparticle exhibits a charge balance value defined by Equation 1 that is greater than or equal to about 0.97 and less than or equal to about 1.2:

$$\text{charge balance value}=\{[Ag]+3([In]+[Ga])\}/2[S] \qquad \text{Equation 1}$$

in Equation 1, [Ag], [In], [Ga], and [S] are molar amounts of silver, indium, gallium, and sulfur, respectively, in the first semiconductor nanoparticle, wherein the green light has a peak emission wavelength of greater than or equal to about 500 nanometers and less than or equal to about 550 nanometers, and a full width at half maximum (FWHM) of greater than or equal to about 10 nanometers and less than or equal to about 35 nanometers, and at least about 97% of emission from the first semiconductor nanoparticles is band-edge emission, or wherein in a photoluminescence spectrum of the first semiconductor nanoparticle, a relative band-edge emission intensity defined by Equation 2 is greater than about 20:

$$\text{relative band-edge emission intensity}=A1/A2 \qquad \text{Equation 2}$$

wherein

A1 is an intensity at a maximum emission wavelength, and

A2 is a maximum intensity in a tail wavelength range of the maximum emission wavelength+greater than or equal to about 80 nm, wherein the second region comprises a second composite including a matrix and a second semiconductor nanoparticle dispersed in the matrix, and optionally titanium oxide particles, wherein the second semiconductor nanoparticles comprise a Group III-V compound comprising indium and phosphorus, and is configured to emit red light, wherein the red light has a peak emission wavelength of greater than or equal to about 600 nanometers and less than or equal to about 650 nanometers.

* * * * *